United States Patent
Lukin et al.

(10) Patent No.: US 11,555,738 B2
(45) Date of Patent: Jan. 17, 2023

(54) SYSTEM AND METHOD OF GENERATING PHONONS

(71) Applicant: President and Fellows of Harvard College, Cambridge, MA (US)

(72) Inventors: Mikhail D. Lukin, Cambridge, MA (US); Trond Ikdahl Andersen, Boston, MA (US); Bo Loren Dwyer, Cambridge, MA (US); Javier Daniel Sanchez, Cambridge, MA (US); Kartiek Agarwal, Montreal (CA)

(73) Assignee: President and Fellows of Harvard College, Cambridge, MA (US)

( * ) Notice: Subject to any disclaimer, the term of this patent is extended or adjusted under 35 U.S.C. 154(b) by 457 days.

(21) Appl. No.: 16/835,953

(22) Filed: Mar. 31, 2020

(65) Prior Publication Data

US 2020/0309595 A1     Oct. 1, 2020

Related U.S. Application Data

(60) Provisional application No. 62/827,539, filed on Apr. 1, 2019.

(51) Int. Cl.
*G01J 1/44*     (2006.01)
*G10K 15/00*     (2006.01)
*H03F 3/00*     (2006.01)

(52) U.S. Cl.
CPC ............. *G01J 1/44* (2013.01); *G10K 15/00* (2013.01); *H03F 3/00* (2013.01)

(58) Field of Classification Search
CPC .................................... G10K 15/00; G01J 1/44
See application file for complete search history.

(56) References Cited

U.S. PATENT DOCUMENTS

| | | | | |
|---|---|---|---|---|
| 3,792,321 A | * | 2/1974 | Seifert | H01L 27/20 327/515 |
| 9,132,451 B1 | * | 9/2015 | Tankhilevich | G10K 15/04 |
| 9,418,648 B1 | * | 8/2016 | Tankhilevich | B06B 1/04 |
| 2002/0017827 A1 | * | 2/2002 | Zuppero | H01M 14/005 257/E29.166 |

(Continued)

OTHER PUBLICATIONS

Agarwal et al., "Magnetic noise spectroscopy as a probe of local electronic correlations in two-dimensional systems," Physical Review B, Apr. 5, 2017, vol. 95:155107. 25 pages.

(Continued)

*Primary Examiner* — Patricia T Nguyen
(74) *Attorney, Agent, or Firm* — Wilmer Cutler Pickering Hale and Dorr LLP

(57) ABSTRACT

Systems and methods are disclosed for controlling nonequilibrium electron transport process and generating phonons in low dimensional materials. The systems can include a conductive sheet sandwiched between a first insulation layer and a second insulation layer; a first electrode conductively coupled to a first end of the conductive sheet; a second electrode conductively coupled to a second end of the conductive sheet; and a current source conductively coupled to the first electrode and the second electrode and configured to pass a current from the first electrode through the conductive sheet to the second electrode such that current generates a drift velocity of electrons in the conductive sheet that is greater than the speed of sound to generate phonons.

26 Claims, 32 Drawing Sheets

(56) References Cited

U.S. PATENT DOCUMENTS

| | | | | |
|---|---|---|---|---|
| 2003/0000570 | A1* | 1/2003 | Zuppero | H01L 29/155 |
| | | | | 136/252 |
| 2004/0198463 | A1* | 10/2004 | Knoedgen | H04M 1/605 |
| | | | | 455/41.1 |
| 2006/0289117 | A1* | 12/2006 | Grassauer | F03H 1/0081 |
| | | | | 156/345.44 |

OTHER PUBLICATIONS

Aslam et al., "Photo-induced ionization dynamics of the nitrogen vacancy defect in diamond investigated by single-shot charge state detection," New Journal of Physics, Jan. 31, 2013, vol. 15:013064. 18 pages.

Awan et al., "Transport conductivity of graphene at RF and microwave frequencies," 2D Materials, Feb. 19, 2016, vol. 3:015010. 12 pages.

Balandin, "Low-frequency 1/f noise in graphene devices," Nature Nanotechnology, Aug. 2013, vol. 8, pp. 549-555.

Balandin, "Thermal properties of graphene and nanostructured carbon materials," Nature Materials, Aug. 2011, vol. 10, pp. 569-581.

Betz et al., "Hot electron cooling by acoustic phonons in graphene," Physical Review Letters, Aug. 3, 2012, vol. 109:056805. 5 pages.

Betz et al., "Supercollision cooling in undoped graphene," Nature Physics, Feb. 2013, vol. 9, pp. 109-112.

Casola et al., "Probing condensed matter physics with magnetometry based on nitrogen-vacancy centres in diamond," Nature Reviews Materials, published online Jan. 4, 2018, vol. 3:17088. 13 pages.

Crossno et al., "Observation of the Dirac fluid and the breakdown of the Wiedemann-Franz law in graphene," Science, Mar. 4, 2016, vol. 351, pp. 1058-1061.

Dean et al., "Boron nitride substrates for high-quality graphene electronics," Nature Nanotechnology, Oct. 2010, vol. 5, pp. 722-726.

Dyakonov et al., "Shallow water analogy for a ballistic field effect transistor: New mechanism of plasma wave generation by DC current," Physical Review Letters, Oct. 11, 1993, vol. 71, pp. 2465-2468, Fig. 1. 5 pages.

Eizenberg et al., "X-ray Brillouin scattering and electrical measurements of acoustoelectric gain and lattice attenuation in semidegenerate n-GaAs," Journal of Applied Physics, Oct. 1978, vol. 49, pp. 5260-5269.

Freitag et al., "Thermal infrared emission from biased graphene," Nature Nanotechnology, Jul. 2010, vol. 5, pp. 497-501.

Fu et al., "Observation of the dynamic Jahn-Teller effect in the excited states of nitrogen-vacancy centers in diamond," Physical Review Letters, Dec. 17, 2009, PRL 103:256404. 4 pages.

Grosse et al., "Nanoscale Joule heating, Peltier cooling and current crowding at graphene-metal contacts," Nature Nanotechnology, May 2011, vol. 6, pp. 287-290.

Harrison et al., "Measurement of the optically induced spin polarisation of N-V centres in diamond," Diamond and Related Materials, Apr. 2006, vol. 15, pp. 586-588.

Hartnagel et al., "Main Sources of Noise in Semiconductor Structures," Chapter 1.3: Introduction, Microwave Noise in Semiconductor Devices, Wiley & Sons, New York, NY, 1st edition, Jan. 2001, pp. 4-5.

Henkel et al., "Fundamental limits for coherent manipulation on atom chips," Applied Physics B, published online Feb. 26, 2003, vol. 76, pp. 173-182.

Horng et al., "Drude conductivity of Dirac fermions in graphene," Physical Review B, Apr. 15, 2011, vol. 83:165113. 5 pages.

Hutson et al., "Ultrasonic Amplification in CdS," Physical Review Letters, Sep. 15, 1961, vol. 7, pp. 237-239 and Fig. 4. 4 pages.

Hwang et al., "Acoustic phonon scattering limited carrier mobility in two-dimensional extrinsic graphene," Physical Review B, Mar. 27, 2008, vol. 77:115449. 6 pages.

Hwang et al., "Quasiparticle spectral function in doped graphene: Electron-electron interaction effects in ARPES," Physical Review B, Feb. 29, 2008, vol. 77:081412. 4 pages.

Kaasbjerg et al., "Unraveling the acoustic electron-phonon interaction in graphene," Physical Review B, Apr. 23, 2012, vol. 85:165440. 8 pages.

Kim et al., "Stretchable, transparent graphene interconnects for arrays of microscale inorganic light emitting diodes on rubber substrates," Nano Letters, Jul. 26, 2011, vol. 11, pp. 3881-3886.

Kim et al., "Ultrafast graphene light emitters," Nano Letters, Jan. 16, 2018, vol. 18, pp. 934-940.

Klemens et al., "Thermal conductivity of graphite in the basal plane," Carbon (1994), vol. 32, pp. 735-741.

Kolkowitz et al., "Probing Johnson noise and ballistic transport in normal metals with a single-spin qubit," Science, Mar. 6, 2015, vol. 347(6226), pp. 1129-1132.

Komirenko et al., "Generation and amplification of sub-THz coherent acoustic phonons under the drift of two-dimensional electrons," Physical Review B, Sep. 15, 2000, vol. 62, pp. 7459-7469.

Kumar et al., "Superballistic flow of viscous electron fluid through graphene constrictions," Nature Physics, Dec. 2017, vol. 13, pp. 1182-1185 and Methods. 5 pages.

Lin et al., "100-GHz transistors from wafer-scale epitaxial graphene," Science, Feb. 5, 2010, vol. 327, p. 662.

Mariani et al., "Temperature-dependent resistivity of suspended graphene," Physical Review B, Nov. 2, 2010, vol. 82:195403. 11 pages.

Maze et al., "Nanoscale magnetic sensing with an individual electronicspin in diamond," Nature, Oct. 2, 2008, vol. 455, pp. 644-647 and Methods. 5 pages.

Mendoza et al. "Preturbulent regimes in graphene flow," Physical Review letters, Apr. 15, 2011, PRL 106:156601. 4 pages.

Nika et al., "Phonon thermal conduction in graphene: Role of Umklapp and edge roughness scattering," Physical Review B, Apr. 7, 2009, vol. 79:155413. 12 pages.

Norambuena et al., "Spin-lattice relaxation of individual solid-state spins," Physical Review B, Mar. 20, 2018, vol. 97:094304. 13 pages.

Novoselov et al., "2D materials and van der Waals heterostructures," Science, Jul. 29, 2016, vol. 353, pp. 461 and aac9439. 13 pages.

Pippard, "Acoustic amplification in semiconductors and metals," Philosophical Magazine (1963), vol. 8, pp. 161-165.

Pomerantz, "Amplification of microwave phonons in germanium," Physical Review Letters, Aug. 31, 1964, vol. 13, pp. 308-310, Fig. 1. 4 pages.

Purdie et al., "Cleaning interfaces in layered materials heterostructures," Nature Communications (2018), vol. 9:5387. arXiv preprint: 1803.00912v1, Mar. 2, 2018. 14 pages.

Saito et al., "Ballistic and diffusive thermal conductivity of graphene," Physical Review Applied, Feb. 20, 2018, vol. 9:024017. 12 pages.

Sangtawesin et al., "Origins of diamond surface noise probed by correlating single-spin measurements with surface spectroscopy," Physical Review X, Sep. 26, 2019, vol. 9:031052. 17 pages.

Shields et al., "Efficient readout of a single spin state in diamond via spin-to-charge conversion," Physical Review Letters, Apr. 3, 2015, PRL 114:136402. 5 pages.

Shinokita et al., "Strong amplification of coherent acoustic phonons by intraminiband currents in a semiconductor superlattice," Physical Review Letters, Feb. 19, 2016, vol. 116:075504. 5 pages.

Song et al., "Disorder-assisted electron-phonon scattering and cooling pathways in graphene," Physical Review Letters, Sep. 7, 2012, PRL 109:106602. 5 pages.

Spector, "Amplification of acoustic waves through interaction with conduction electrons," Physical Review, Aug. 15, 1962, vol. 127, pp. 1084-1090.

Stauber et al., "Electronic transport in graphene: A semiclassical approach including midgap states," Physical Review B, Nov. 20, 2007, vol. 76:205423. 10 pages.

Tetienne et al., "Quantum imaging of current flow in graphene," Science Advances, Apr. 26, 2017, vol. 3, e1602429. 6 pages.

Tomadin et al., "Theory of the plasma-wave photoresponse of a gated graphene sheet," Physical Review B, Nov. 27, 2013, vol. 88:205426. 10 pages.

(56) References Cited

OTHER PUBLICATIONS

Wang et al., "One-dimensional electrical contact to a two-dimensional material," Science, Nov. 1, 2013, vol. 342, pp. 614-617.
Yang et al., "A graphene Zener-Klein transistor cooled by a hyperbolic substrate," Nature Nanotechnology, Jan. 2018, vol. 13, pp. 47-52 and Methods. 7 pages.
Zhao et al., "Cerenkov emission of terahertz acoustic-phonons from graphene," Applied Physics Letters, published online Jun. 3, 2013, vol. 102:222101. 5 pages.

\* cited by examiner

SYSTEM AND METHOD OF GENERATING PHONONS

CROSS-REFERENCE TO RELATED APPLICATIONS

This application claims the benefit of priority to U.S. Provisional Application No. 62/827,539, entitled "Electron-Phonon Cerenkov Instability in Graphene," filed on Apr. 1, 2019, the disclosure of which is hereby incorporated by reference in its entirety.

STATEMENT OF GOVERNMENTAL INTEREST

This invention was made with government support under Grant Nos. 1541959, 1125846, 1734011, and 1506284 awarded by the National Science Foundation and Grant Nos. N00014-15-1-2846, N00014-16-1-2825, and N00014-18-1-2877 awarded by the Department of Defense/Office of Naval Research. The government has certain rights in the invention.

TECHNICAL FIELD

The invention relates to high-frequency phonons generation, and more particularly to generating high frequency phonons with low dimensional materials.

COPYRIGHT NOTICE

This disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

BACKGROUND

Phonons in solids can be exploited for applications such as modulation of light, generation of electrical signals, coupling of quantum mechanical systems, manipulation of electron transport in quantum devices, storage of quantum information etc. Phonons can be excited electrically using piezoelectric materials. Delay lines, in which an electrical signal is transduced into an acoustic wave and back again, have been used in modern electronics. Phonons at higher frequencies, especially in the terahertz frequency range, promise technological advancements especially for non-invasive imaging techniques. High frequency phonons can be produced optically with ultrafast laser pulses, which produce phonons through stimulated Raman scattering, displacive excitation of coherent phonons, etc. These optical methods require bulky, expensive equipment and significant complexity.

SUMMARY

Systems and methods are disclosed for controlling nonequilibrium electron transport process and generating phonons in low dimensional materials. By electrically driving ultraclean graphene devices out of equilibrium, an instability that is manifested as dramatically enhanced current fluctuations and suppressed conductivity at microwave frequencies can be observed. Spatial mapping of the nonequilibrium current fluctuations using nanoscale magnetic field sensors can reveal that the fluctuations grow exponentially along the direction of carrier flow. These are due to generation of high-frequency phonons.

In some embodiments, the systems can include a conductive sheet sandwiched between a first insulation layer and a second insulation layer; a first electrode conductively coupled to a first end of the conductive sheet; a second electrode conductively coupled to a second end of the conductive sheet; and a current source conductively coupled to the first electrode and the second electrode and configured to pass a current from the first electrode through the conductive sheet to the second electrode such that current generates a drift velocity of electrons in the conductive sheet that is greater than the speed of sound to generate phonons.

In some embodiments, the conductive sheet includes graphene.

In some embodiments, the conductive sheet includes a transition metal dichalcogenide.

In some embodiments, the generated phonons have a frequency with an order of magnitude between 1 to 10 terahertz.

In some embodiments, one or more of the first insulation layer or the second insulation layer include hexagonal boron nitride (hBN).

In some embodiments, the mobility of the electrons in the graphene sheet is not less than 5 $m^2$/Vs.

In some embodiments, the systems include a conductive top gate disposed on the second insulation layer opposite the graphene sheet, wherein a charge on the conductive top gate adjusts the frequency of the generated phonons.

In some embodiments, the distance between the first electrode and the second electrode is not less than 1.5 microns.

In some embodiments, the drift velocity of electrons in the graphene sheet is at least twice the speed of sound.

In some embodiments, the current amplifies the generated phonons.

In another aspect, the present disclosure describes methods for controlling nonequilibrium electron transport process and generating phonons in low dimensional materials. The methods can include: disposing a conductive sheet between a first insulation layer and a second insulation layer; connecting a first electrode to a first end of the conductive sheet; connecting a second electrode to a second end of the conductive sheet; connecting the first and second electrodes to a current source; and applying, with the current source, a current from the first electrode through the conductive sheet to the second electrode such that the current generates a drift velocity of electrons in the conductive sheet that is greater than the speed of sound to generate phonons.

In some embodiments, the conductive sheet includes graphene.

In some embodiments, the conductive sheet includes a transition metal dichalcogenide.

In some embodiments, the generated phonons have a frequency having an order of magnitude between 1 to 10 terahertz.

In some embodiments, one or more of the first insulation layer or the second insulation layer comprises hexagonal boron nitride (hBN).

In some embodiments, the mobility of the electrons in the conductive sheet is not less than 5 $m^2$/Vs.

In some embodiments, the method further includes forming a conductive top gate disposed on the second insulation layer opposite the conductive sheet; and adjusting a frequency of the generated phonons by altering a charge on the conductive top gate.

In some embodiments, the distance between the first electrode and the second electrode is not less than 1.5 microns.

In some embodiments, the drift velocity of electrons in the conductive sheet is at least twice the speed of sound.

In some embodiments, the current amplifies the generated phonons.

In another aspect, the present disclosure describes systems for controlling nonequilibrium electron transport process and generating phonons in low dimensional materials. The systems can include: a conductive sheet; a first electrode conductively coupled to a first end of the conductive sheet; a second electrode conductively coupled to a second end of the conductive sheet; and a current source conductively coupled to the first electrode and the second electrode and configured to pass a current from the first electrode through the conductive sheet to the second electrode such that current generates a drift velocity of electrons in the conductive sheet that is greater than the speed of sound to generate phonons.

In some embodiments, the conductive sheet is suspended above a substrate.

In some embodiments, the systems include an insulator disposed on at least a portion of the conductive sheet.

In some embodiments, the insulation layer includes hexagonal boron nitride (hBN).

In some embodiments, the conductive sheet includes graphene.

In some embodiments, the conductive sheet includes a transition metal dichalcogenide.

These and other capabilities of the disclosed subject matter will be more fully understood after a review of the following figures, detailed description, and claims. It is to be understood that the phraseology and terminology employed herein are for the purpose of description and should not be regarded as limiting.

BRIEF DESCRIPTION OF THE FIGURES

For a more complete understanding of various embodiments of the disclosed subject matter, reference is now made to the following descriptions taken in connection with the accompanying drawings, in which.

DESCRIPTION

Figure 1:
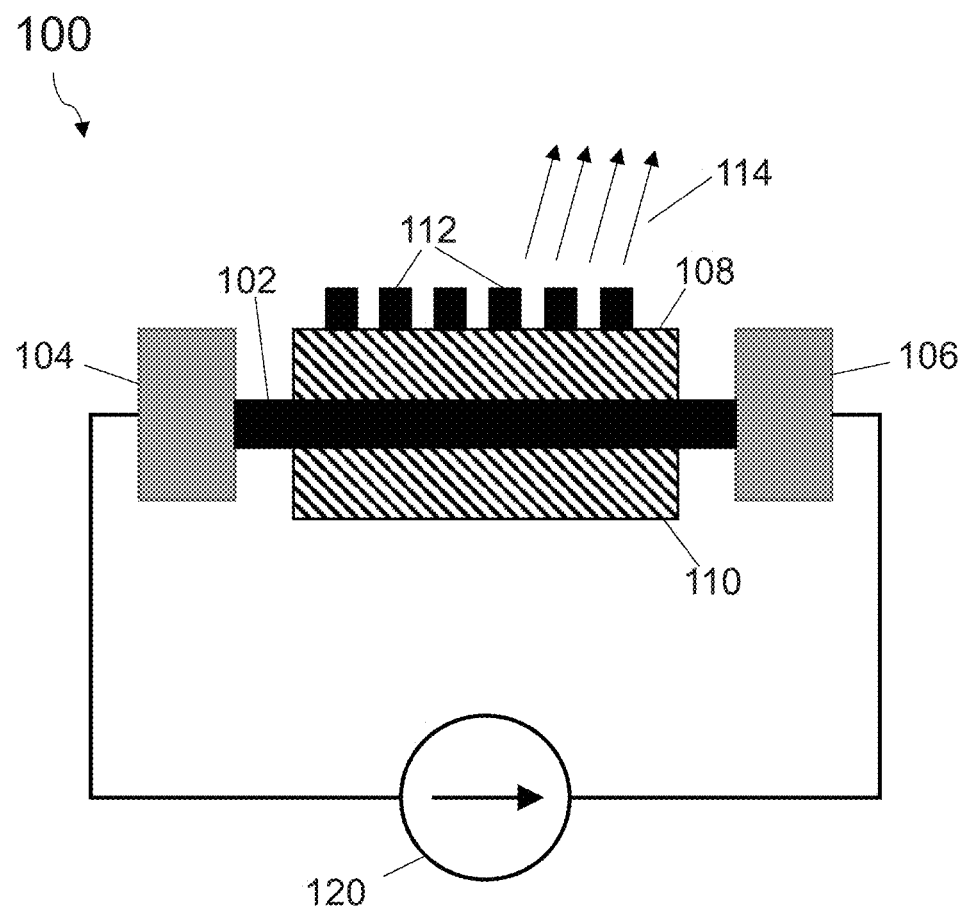
FIG. 1 is an illustrating of a system to harness electron-phonon instability to generate electromagnetic radiation, according to some embodiments of the present disclosure.

In certain materials, electronic state wavefunction can be confined at least in one of three dimensions. These materials can be referred to as low dimensional materials. Nonequilibrium electronic phenomena in low dimensional materials (e.g., graphene, transition metal dichalcogenide monolayers, etc.) can be used for high-frequency signal generation and applications (e.g., Gunn diodes and lasers). Additionally, controlling nonequilibrium dynamics is useful for many technological applications of low dimensional materials, including high-frequency transistors, ultra-fast incandescent light sources, and flexible transparent interconnects. In some embodiments, nonequilibrium dynamics can be controlled by tuning an electric field or a magnetic field. In some embodiments, optical means (e.g., a laser) can be used.

Two-dimensional (2d) materials constitute a new platform for exploring nonequilibrium electronic, phononic, and optical phenomena. For example, ultraclean graphene devices exhibit high mobilities and can therefore be driven to high electronic drift velocities where instabilities have been predicted to occur. Examples include hydrodynamic instabilities in electronic fluids, as well as Dyakonov-Shur instabilities, where plasmons are amplified by driven electrons. In practice, such electronic instabilities can be difficult to realize owing to increased phonon scattering at high drift velocities.

Long-lived phonons can act as a source of instabilities. For example, when the electronic drift velocity ($v_D$) of electrons in a medium exceeds the sound velocity ($v_s$) in that medium, phonon emission caused by movement of the drifting electrons can occur at a higher rate than absorption of such phonons, resulting in exponential growth of the phonon population, which can be referred to as phonon Cerenkov amplification. Systems and methods for controlling and manipulating nonequilibrium electronic processes that exploit phonon Cerenkov amplification are disclosed in low dimensional materials.

In some embodiments, the present disclosure describes systems and methods to control nonequilibrium electron transport process and generate phonons in low dimensional materials. In some embodiments, the systems include a low dimensional material sheet electrically coupled with two electrodes (e.g., directly or indirectly connected with the electrodes) which pass an electrical current through the low dimensional material sheet. In some embodiments, the low dimensional material sheet is sandwiched between two insulation layers. In some embodiments, the systems include a gate electrode which can exert an external electric field on the low dimensional material sheet.

In some embodiments, the present disclosure describes systems and methods to harness electron-phonon Cerenkov instability to generate radiation. In some embodiments, the systems include a low dimensional material sheet electrically coupled with two electrodes (e.g., directly or indirectly connected with the electrodes) which pass an electrical current through the low dimensional material sheet to produce phonons. In some embodiments, the low dimensional material has a mobility that permits the drift velocity of electrons to exceed the speed of sound, which results in phonon emission. The phonons can oscillate, for example, at a frequency between 0.1 to 100 terahertz (THz). In some embodiments, the systems further include a radiation conversion device (e.g., an antenna) coupled to the low dimensional material sheet that converts phonon energy into radiation. In some embodiments, the frequency of the radiation is in the range of 0.1 to 100 THz. In some embodiments, the frequency of the radiation is in the range of 1 to 100 THz. In some embodiments, the frequency of the radiation is in the range of 10 to 100 THz. In some embodiments, the frequency of the radiation is in the range of 0.1 to 10 THz. In some embodiments, the frequency of the radiation is in the range of 1 to 10 THz. In some embodiments, the frequency of the radiation is in the range of 0.01 to 1 THz.

FIG. 1 shows an illustrative view of a system 100 to harness electron-phonon instability to generate radiation, according to some embodiments of the present disclosure. The system 100 can include a sheet 102 (e.g., a low dimensional material sheet) which is electrically coupled to two electrodes 104 and 106. An external power source 120 can inject electric current through electrodes 104 and 106 into the sheet 102. As described in more detail throughout the present disclosure, in some embodiments, injecting an electric current through electrodes 104 and 106 can cause nonequilibrium electronic phenomena (e.g., electron-phonon Cerenkov instability) in the sheet 102. The energy associated with the nonequilibrium electron-phonon phenomena can be converted and outputted in another form (e.g., electromagnetic radiation).

In some embodiments, the sheet includes a single layer (e.g., one monolayer) of a low dimensional material. In some embodiments, the sheet includes a plurality of layers (e.g., two or more monolayers) of a low dimensional material.

In some embodiments, the low dimensional material includes a two-dimensional (2d) material. While embodiments of the present disclosure discuss example implementations in which the low dimensional material includes graphene, other low dimensional materials can be used, such as transition metal dichalcogenide (TMD) monolayers such as $MoS_2$, $WS_2$, $MoSe_2$, $MoTe_2$, and others.

In some embodiments, the purity of the low dimensional material can play a role in phonon generation. Impurities in the material can cause decrease of carrier mobility which can impact carrier drift velocity. The carrier drift velocity can be proportional to the carrier mobility. In some embodiments, when the carrier velocity exceeds the velocity of sound, phonon emission can take place. Therefore, clean low dimensional material can facilitate the phonon generation process. In some embodiments, the cleanliness of the material can be shown by the mobility of the carrier. In some embodiments, the mobility of the carrier (e.g., electron or hole) is at least 5 $m^2$/Vs. In some embodiments, the mobility of the carrier (e.g., electron or hole) is less than 100 $m^2$/Vs. Although embodiments of the present disclosure discuss encapsulation with a material including hBN, a person of skill in the art would understand from the present disclosure that other materials or techniques could be used to provide for high mobility.

In some embodiments, the system 100 includes one or more insulation layers. For example, as shown in FIG. 1, the sheet 102 can be sandwiched between insulation layers 108 and 110. In some embodiments, the insulation layer provides mechanical support to the sheet (e.g., a low dimensional material layer can be disposed on the insulation layer). In some embodiments, the insulation layer insulates the sheet from another conductive material (e.g., a conductive gate electrode). In some embodiments, the insulation layers protect the sheet from other contaminants and therefore ensure the cleanliness of the material.

In some embodiments, the material of one or more of insulation layers 108 and 110 can include a TMD.

In some embodiments, the system 100 does not include an encapsulation (e.g., the insulation layers 108 and 110) for the sheet 102. For example, the sheet 102 can be suspended above a substrate. In some embodiments, the system 100 includes only one insulation layer (e.g., 108 or 110) contacting the sheet 102. As long as the carrier mobility in the sheet 102 is sufficiently high (e.g., greater than the speed of sound), the phonon generation can take place.

In some embodiments, the system 100 includes a radiation conversion device 112 which can be coupled to the sheet 102. The radiation conversion device 112 can receive phonon energy from the sheet 102 through coupling and convert it into radiation 114. In some embodiments, the radiation conversion device 112 includes an antenna (e.g., metal strip grating). In some embodiments, the radiation conversion device 112 include an optical resonator. In some embodiments, the frequency of the radiation 114 is between 0.1 and 100 terahertz THz.

In some embodiments, electrically driving a low dimensional material out of equilibrium can cause nonequilibrium dynamics such as an instability that is manifested as dramatically enhanced current fluctuations and suppressed conductivity at microwave frequencies.

In some embodiments, nonequilibrium dynamics can be monitored and characterized by measuring the microwave signals generated by a DC current drive. At high drift velocities, there can be an extreme increase in current noise at low (GHz) frequencies, accompanied by a strong reduction in AC differential conductivity at the same frequencies. In addition, nonequilibrium dynamics can be monitored and characterized by spatially resolved noise measurements using diamond nitrogen-vacancy (NV) nano-magnetometry, which can reveal an exponential growth of the noise in the direction of charge-carrier flow.

The present disclosure shows that the increase in current noise at low frequencies and AC differential conductivity reduction originate from cascading amplification of acoustic phonons interacting with the electronic system. While phonon scattering is considered in some applications to be an irreversible loss channel that inhibits electronic instabilities, the long-lived phonons here can act as a source of nonlinear feedback. For example, when the electronic drift velocity ($v_D$) exceeds the sound velocity ($v_s$), the rate of phonon emission can overcome the rate of absorption, resulting in exponential growth that can be referred to as phonon Cerenkov amplification. Embodiments of the present disclosure show that Cerenkov amplification can produce a controllable electron-phonon instability in electrically driven graphene, resulting in dramatic modification of both the spatial and spectral properties of the electronic response. For example, the controllable electron-phonon instability can generate high-frequency phonons. In some embodiments, the frequency of the phonon is in the range of 0.1 to 100 THz.

Figure 2:
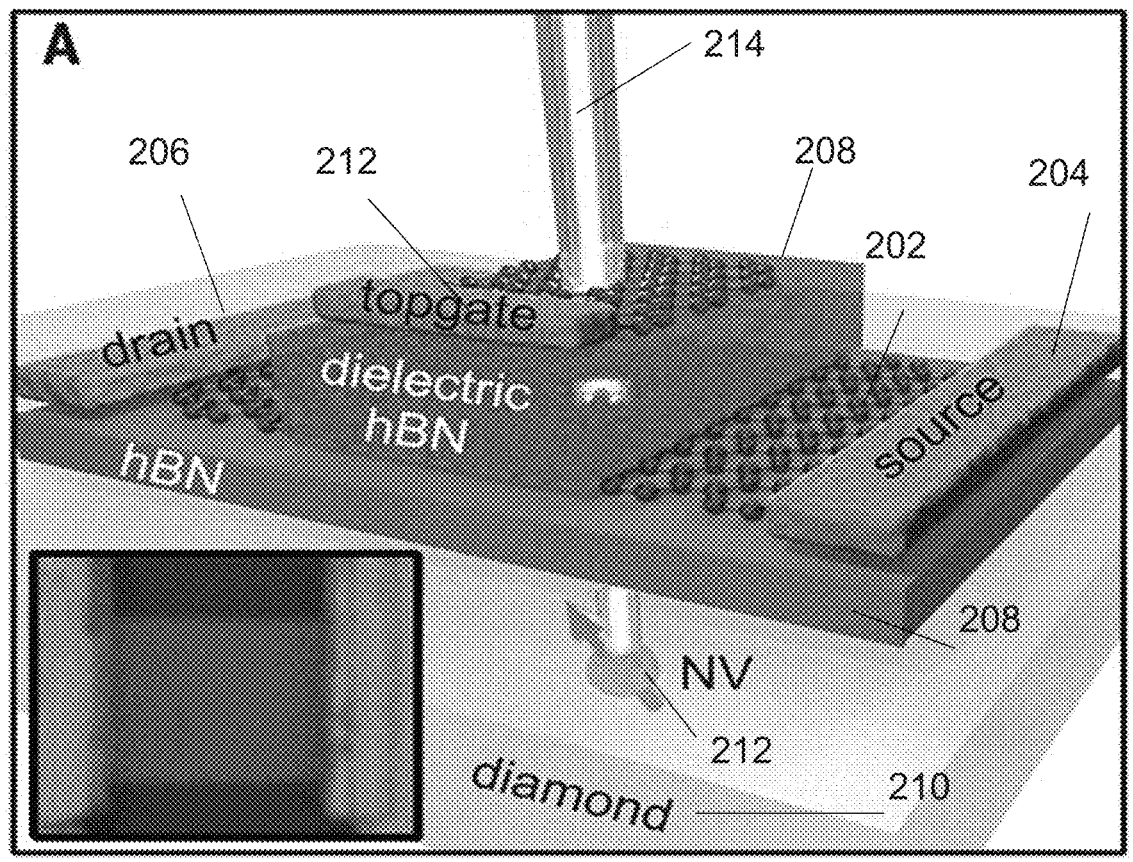
FIG. 2 illustrates example aspects of electrically gated graphene devices encapsulated in hexagonal boron nitride (hBN) and measurements conducted at cryogenic temperatures, according to some embodiments of the present disclosure.
Figure 2:
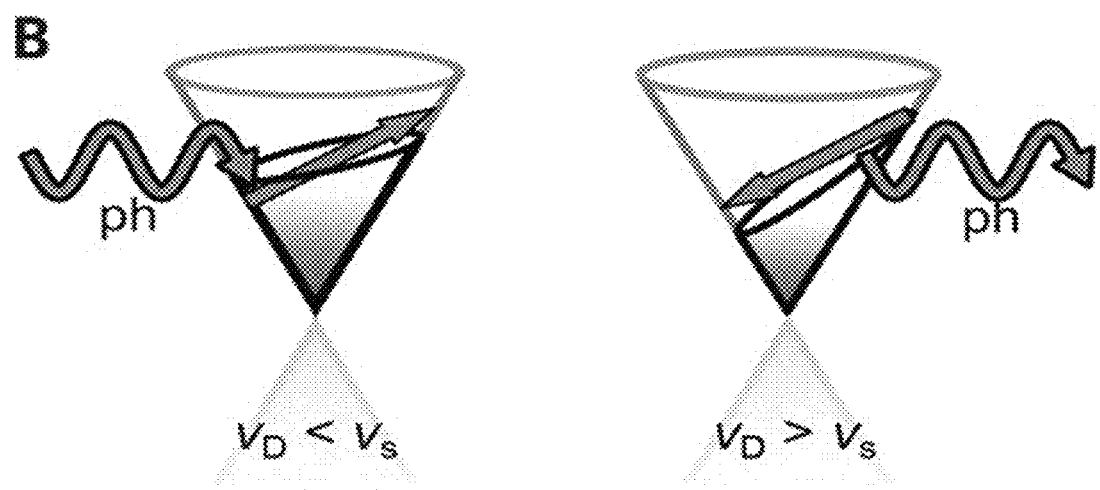
Figure 2:
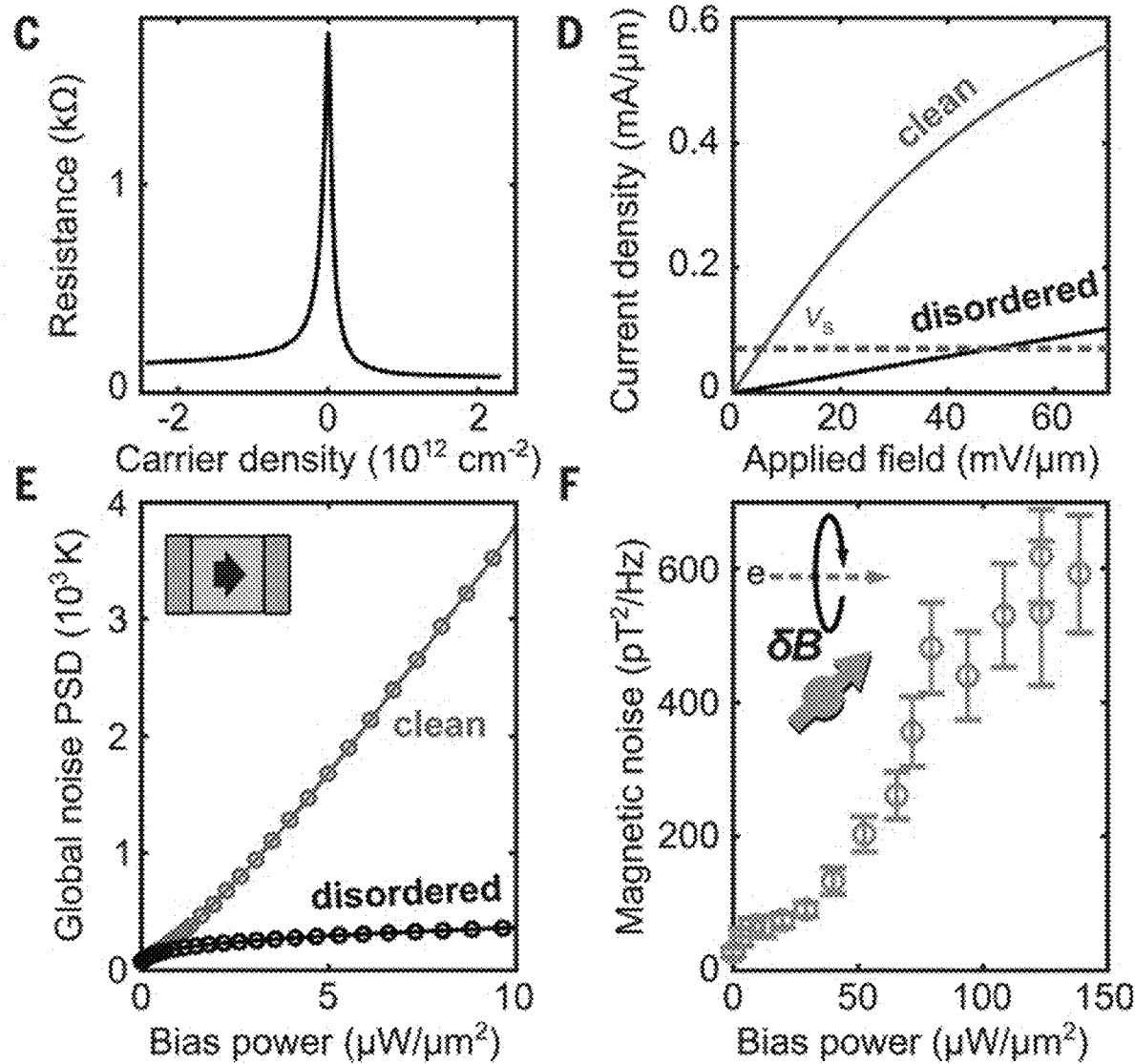

FIG. 2 illustrates example of electrically gated graphene devices encapsulated in hexagonal boron nitride (hBN) and measurements conducted at cryogenic temperatures (T=10-80 K), according to some embodiments of the present disclosure. Panel A of FIG. 2 illustrates an exemplary device configuration in which a hBN-encapsulated graphene device is disposed on a diamond substrate containing NV centers for nano-magnetometry, according to some embodiments. On top of a substrate 210, a graphene sheet 202 can be sandwiched between two hBN layers 208. In some embodiments, the substrate 210 can be diamond, which can include one or more nitrogen-vacancy (NV) centers which can be used to probe a local magnetic field with a laser 214. In some embodiments, the substrate 210 can be another material. The graphene sheet 202 can be electrically coupled to a source electrode 204 and a drain electrode 206 to apply current to the graphene sheet 202. In some embodiments, a top gate 212 can be used to exert an external electric field to the graphene sheet 202. The inset of Panel A shows an optical image of an example clean hBN-encapsulated device.

Panel B of FIG. 2 is an illustrative schematic of the band structure of graphene as represented by the Dirac cones, according to some embodiments. It shows that when the electronic drift velocity is less than the sound velocity ($v_D < v_s$), phonon absorption dominates, according to some embodiments. If the electronic drift velocity ($v_D$) exceeds the sound velocity ($v_s$), stimulated phonon emission dominates over absorption. Therefore, in order to generate phonons, one can drive a low dimensional material so that the electronic drift velocity is greater than the velocity of sound.

Figure 8:
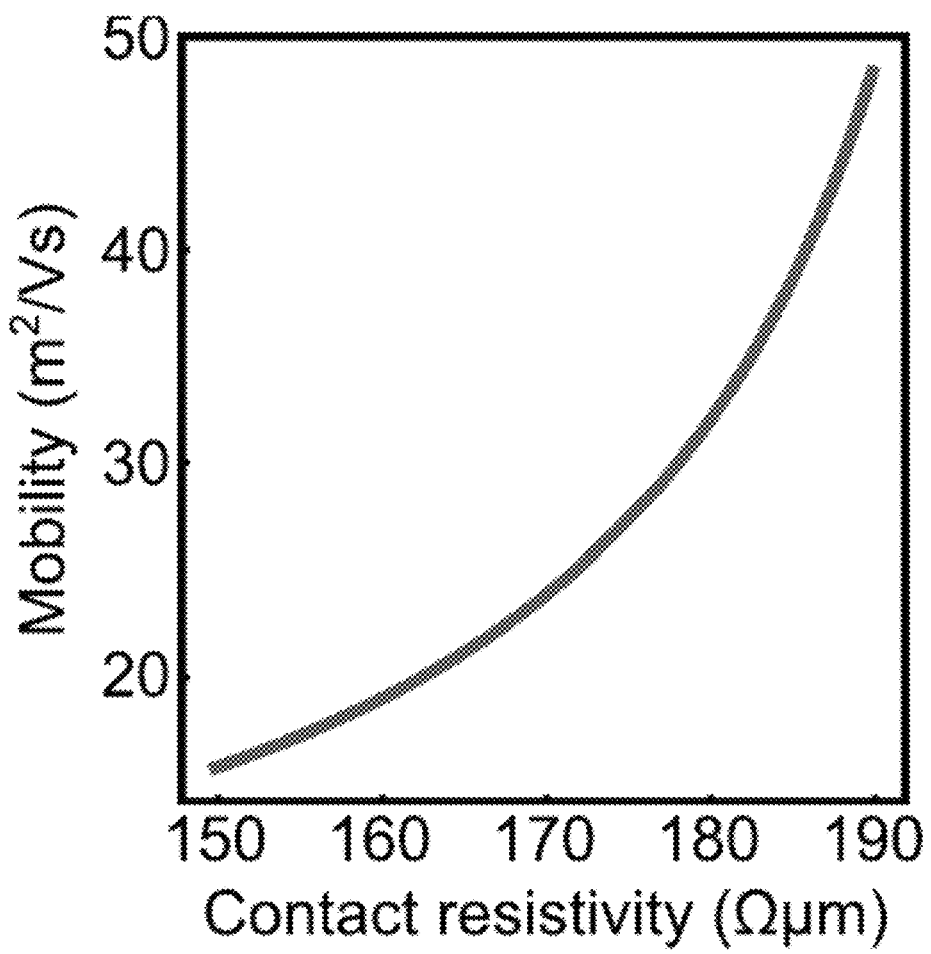
FIG. 8 presents calculated mobility of a clean device, according to some embodiments of the present disclosure.

Panel C of FIG. 2 presents the low-bias transport properties of a non-limiting example ultraclean graphene system with a mobility of 20-40 m$^2$/Vs (shown in FIG. 8) at a carrier density of $2 \times 10^{12}$ cm$^{-2}$, corresponding to nearly ballistic transport, according to some embodiments. Accordingly, clean low dimension material with few impurities can greatly facilitate the phonon generation process by facilitating lower resistance at higher carrier densities.

Panel D of FIG. 2 shows a schematic of a comparison of current densities between a clean device and a disordered device, according to some embodiments. Due to the high mobility in example clean devices, carriers can be accelerated by an electric field to high drift velocities (e.g., $v_D \gg v_s = 21$ km/s in graphene, which are permitted by the high current densities shown in FIG. 2. Panel D, which is proportional to drift velocity), where a non-linear current response is observed which may manifest nonequilibrium dynamic. By contrast, an example disordered device shows linear Ohmic behavior with low noise, indicating the absence of the electron-phonon instability.

In some embodiments, the nonequilibrium behavior can be monitored and characterized by measuring the global noise in the source-drain current with a spectrum analyzer (noise power spectral density, PSD, averaged over 0.1-0.3 GHz), while varying the applied bias power, P. Without being bound by theory, the noise observed in disordered devices (Panel E of FIG. 2) can be in good agreement with increased thermal noise due to Joule heating and shows a characteristic $P^{1/3}$-dependence (in Internal System of Units, or SI). Different behavior can be observed in example clean (hBN-encapsulated) devices, where the noise can grow super-linearly with drive power and reach values that are inconsistent with (i.e., much greater than) thermal noise. For example, at higher biases the noise can increase to values equivalent to the thermal noise expected for a sample at 10,000 K. This behavior, observed consistently in 12 example devices, stands in stark contrast to that of more disordered (not hBN-encapsulated) devices studied here and elsewhere, indicating a different noise source in driven graphene devices with low disorder.

Without being bound by theory, to gain insights into the origin of this noise, spatially resolved noise measurements can be performed by fabricating graphene devices on diamond substrates that contain a plurality of spatially distributed shallow NV color-center impurities (40-60 nm depth). These atom-like spin qubits can be individually measured using confocal microscopy and can probe nanoscale current noise by measuring (i.e., responding to) local magnetic fields. Panel F of FIG. 2 shows the locally probed noise under a driven clean graphene device, exhibiting similar super-linear behavior as global measurements, according to some embodiments. A spatially resolved picture of the current noise can be assembled by observing the response of the plurality of spatially distributed NV color centers. The super-linear behavior in magnetic noise may indicate a different noise source in driven graphene devices with low disorder. The inset of Panel F is an illustrative schematic showing that a local magnetic field (δB, looping around the path of carrier e) generated by carrier transport in the graphene sheet can impact a spin state of the NV color-center in the diamond.

In some embodiments, the spatial dependence of the noise is probed by optically addressing single NV centers along the device and measuring their spin relaxation rate via resulting fluorescence. In some embodiments, the spin relaxation rate is determined by the local noise at 2.87 GHz. As described in more detail with reference to FIGS. 3 and 4, the noise present in example sample devices can be traced to phononic sources. Without being bound by theory, when phonon generation outpaces phonon absorption, large electronic noise can be observed because of stochastic electronic scattering with the growing phonon population.

Figure 3:
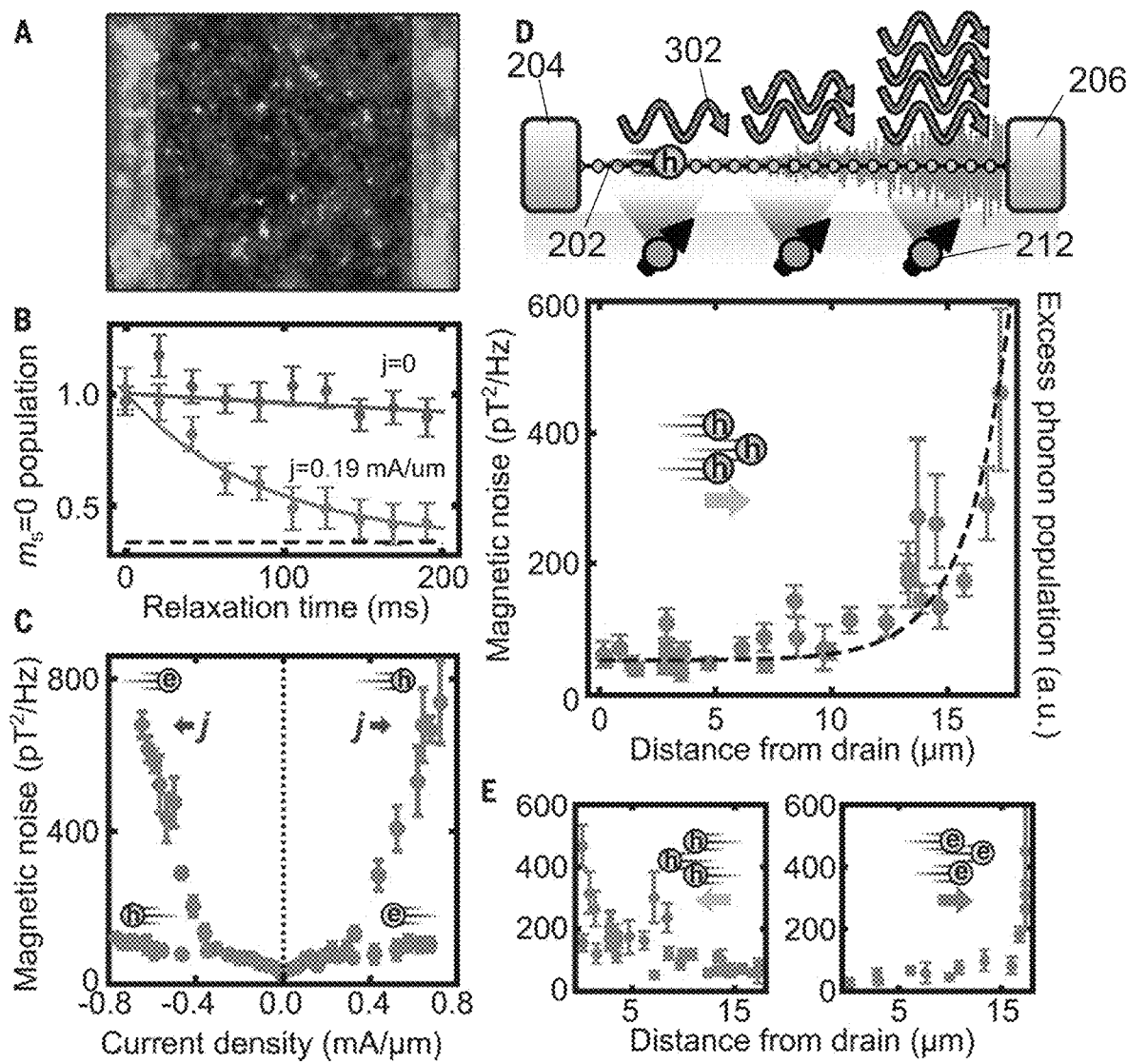
FIG. 3 illustrates example aspects of spatially resolved local noise measurements with NV magnetometry, according to some embodiments of the present disclosure.

FIG. 3 illustrates example aspects of spatially resolved local noise measurements with NV magnetometry, according to some embodiments of the present disclosure. Panel A of FIG. 3 shows a fluorescence image of NV centers underneath a device, according to some embodiments. Panel B presents NV spin relaxation (i.e., the Population of spins in state $m_s$=0 as a function of time, which relaxes) from polarized to thermal state (dashed lines), when DC currents j=0 (upper) and j=0.19 mA/μm lower) are passed through the device, according to some embodiments. Solid lines are fits. Panel C shows local magnetic noise near drain contact as a function of graphene current density, in electron- and hole-doped regime, as measured by NV centers, according to some embodiments. Far from the midpoint of the device, the noise exhibits an asymmetry with current direction (Panel C), with nearly an order of magnitude difference when the current is reversed. This is a unique property given that the global noise and transport properties are independent of current direction.

In some embodiments, the sign of the charge carriers is inverted using the device gate. It has been observed that when the sign of the charge carriers is inverted, the asymmetric pattern also inverts, indicating that the local noise signal depends on the flow direction of momentum, not charge. The top of Panel D is an illustrative schematic showing that exponential growth of phonons 302 due to Cerenkov amplification, according to some embodiments. Without being bound by theory, when Cerenkov amplification takes place, electrons can increasingly scatter with the growing phonon population, leading to increased noises. The bottom of Panel D of FIG. 3 shows the local noise profile along the source-drain direction, according to some embodiments. It is shown that the noise can be small at the carrier entry point (e.g., to the left of panel D of FIG. 3 near source 204 for electron holes), but then can grow exponentially as the carriers flow downstream (for example, in a L=17 μm long device). This behavior is consistent with the global measurements, where the anomalous noise increases with device length. The noise profile can invert when the current direction is reversed, and flip back when the carrier sign is also switched (see Panel E of FIG. 3, showing the magnetic noise as a function of distance from the drain for oppositely charged electron holes (left) and electrons (right)).

Figure 4:
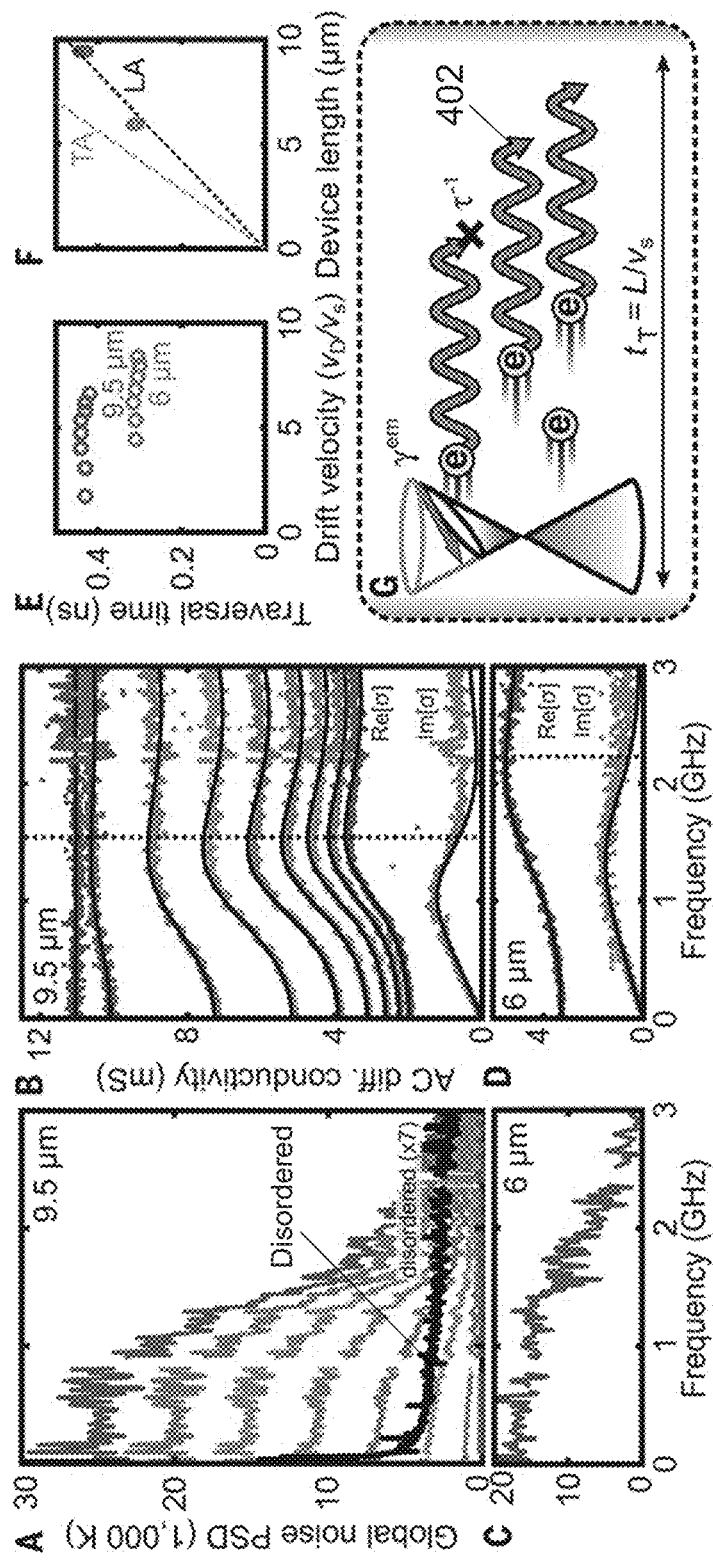
FIG. 4 illustrates example aspects of slow dynamics in global electronic measurements, according to some embodiments of the present disclosure.

In some embodiments, the underlying nonequilibrium dynamics can be monitored and characterized by measuring the spectrum of the global current noise. FIG. 4 illustrates example aspects of slow dynamics in global electronic measurements, according to some embodiments of the present disclosure. Panel A of FIG. 4 shows global noise spectra at n=2×10$^{12}$ cm$^{-2}$, according to some embodiments. When driven, the disordered graphene samples (corresponding to the curve labeled in Panel A) can show $1/f$ and white thermal noise. Clean devices (corresponding to curves not labeled in Panel A), on the other hand, can exhibit a peaked spectrum with a roll-off at ~1.5 GHz when driven at bias ranging from 0 to 0.8 V (bottom to top). Panel B of FIG. 4 shows AC differential conductivity spectra (excitation−20 dBm) with biases 0 to 0.8 V (top to bottom), according to some embodiments. The AC differential conductivity can be suppressed by the increased electron-phonon scattering at similar frequencies. These GHz features are in stark contrast to the equilibrium graphene Drude spectrum, which is featureless up to the THz range, thus indicating that timescales of the underlying nonequilibrium dynamics can be much longer than the typical electronic lifetime. It can be found that the frequencies of these nonequilibrium features are independent of drive voltage, doping, and temperature (SI), and are upshifted in shorter devices. Panels C and D of FIG. 4 show that features in noise and conductivity spectra can shift to higher frequencies in a shorter (6 um) device, under similar electric field as maximum in Panels A and B, according to some embodiments. Panels E and F of FIG. 4 show extracted traversal time from Panel Band Panel D as a function of drift velocity and device length, according to some embodiments. Dashed curves correspond to speed of sound in graphene with LA representing the longitudinal acoustic phonons and TA representing the transverse acoustic phonons.

The observed spectrum, spatial dependence, and scale of the noise are inconsistent with conventional noise sources (such as $1/f$ or white thermal/shot noise). The slow timescales, combined with their independence of electronic parameters (e.g., applied bias), suggesting a phononic origin to the noise.

Without being bound by theory, the observations can be due to the Cerenkov amplification of long-lived acoustic phonons interacting with the electronic system. When the electronic drift velocity exceeds the speed of sound, a cone of forward-moving acoustic phonon modes can experience a faster rate of stimulated phonon emission ($\gamma_q^{em}$) than absorption ($\gamma_q^{abs}$), providing a buildup of phonons.

Without being bound by theory, this effect can be due to electronic population inversion (Panel B of FIG. 2), similar to what causes stimulated emission of photons in the optical domain. For the emitted phonons to amplify, $\gamma_q^{em}$ can exceed the loss rate ($\gamma_q^{abs}$) due to absorption and other decay sources. Panel G of FIG. 4 is an illustrative schematic showing the exponential growth of phonons 402 during the Cerenkov amplification, according to some embodiments. Pristine graphene can exhibit long acoustic phonon lifetimes ($\tau_q$), thus an emitted phonon can stimulate the emission of more phonons, leading to exponential growth of phonons. Stochastic electronic scattering with the growing phonon population can reduce the conductivity and increase noise.

As discussed below, example models show that embodiments of the dynamics described throughout the present disclosure can be explained by the influence of phonons produced by drift electrons. For example, without being bound by theory, in some embodiments, the coupled electron-phonon dynamics can be modeled by including the influence of the phonons on the electronic scattering rate, $\Gamma_e$:

$$\partial_t j(r, t) = DE(r, t) - \Gamma_e(\{n_q\}) \cdot j(r, t) \quad (1)$$

$$\partial_t n_q = -\frac{(n_q - n_{q,0})}{\tau_q} + \gamma_q^{em}(j)(n_q + 1) - \gamma_q^{abs}(j) \cdot nq - v_s \hat{q} \cdot \nabla_{nq} \quad (2)$$

Here, $D=2e^2 v_F k_F/h$ is the Drude weight of graphene, $n_q$ is the phonon occupation at wavevector q, $n_q,0$ is the equilibrium phonon occupation when j=0, and $\tau_q^{-1}$ is assumed to be dominated by anharmonic interactions. Using known constants for the electron-phonon coupling and anharmonic decay, it can be found that phonon amplification ($\Gamma_q^{amp}=\gamma_q^{em}-\gamma_q^{abs}-\tau_q^{-1}>0$) can be achieved for a wide range of parameters. For instance, the parameters used in FIG. 3 Panel D ($v_D\sim6v_s$) give a maximum $\gamma_q^{em}-\gamma_q^{abs}=11$ GHz at $q\sim2\pi/(25\text{ nm})$, where $\tau_q^{-1}=0.02$ GHz. The amplification of stochastically emitted phonons can cause large fluctuations in the local electronic scattering rate, thus generating current noise. Due to the Poissonian nature of phonon emission, the fluctuations can scale with the mean emission rate, which is proportional to $n_q$. The spatial profile of the excess phonon population ($\sim e^{\Gamma_q^{amp}x/v_s}-1$) associated with $\Gamma^{amp}=11$ GHz (dashed black curve in panel D of FIG. 3) can be plotted along with the noise profile (circles with error bars) in FIG. 3 Panel), and a good agreement can be found. Integrating over more modes gives a similar profile, indicating the dominance of the most amplified modes.

Without being bound by theory, the model also predicts that the electrically coupled Cerenkov amplification gives rise to a conductivity spectrum of the form (SI):

$$\sigma(\omega) = \frac{\sigma^{Drude}(0)}{1 - \frac{iK}{\omega T}(1 - e^{-i\omega T})} \quad (3)$$

where $\sigma^{Drude}(0)=D/\Gamma_e$ is the usual DC Drude conductivity and K is an increasing function of $\Gamma_q^{amp}$. In some embodiments, $\sigma(\omega)$ depends on the sample traversal time for phonons, $T=L/v_s$. When Cerenkov amplification occurs, the correlation time probed in conductivity measurements may not be limited by the individual electron and phonon lifetimes but by the traversal time, because the memory of an emission event is amplified until the phonons reach the edge (reflected, backwards-moving modes are no longer amplified). To account for the variation in T with phonon emission angle, one can sum over a cone in phonon phase space in example fits in FIG. 4 Panel B. Examples of the model can give excellent agreement with the observed conductivity spectra (FIG. 4 Panels B and D) and predict the oscillatory behavior due to the sharp transit time cut-off. The extracted traversal time is independent of drift velocity (FIG. 4 Panel E), and the corresponding speed matches that of the longitudinal acoustic mode in graphene (FIG. 4 Panel F).

In some embodiments, the extension of the correlation time can also cause noise in the same low-frequency range, consistent with the observations (Panels A and C of FIG. 4). While the stochastic emission of a phonon can cause a small drop in current that only lasts for $1/\Gamma_e\sim$ps, Cerenkov amplification can both prolong and magnify the effect. Without being bound by theory, the emitted phonon can stimulate cascading emission of subsequent phonons, causing the current to continue decreasing until the phonon packet reaches the device edge. This can give strong current correlations for $\langle\delta j(t)\delta j(t+\tau)\rangle$ long T (up to T$\sim$100 ps) and thus noise at low frequencies $\lesssim 1/T$.

Figure 5:
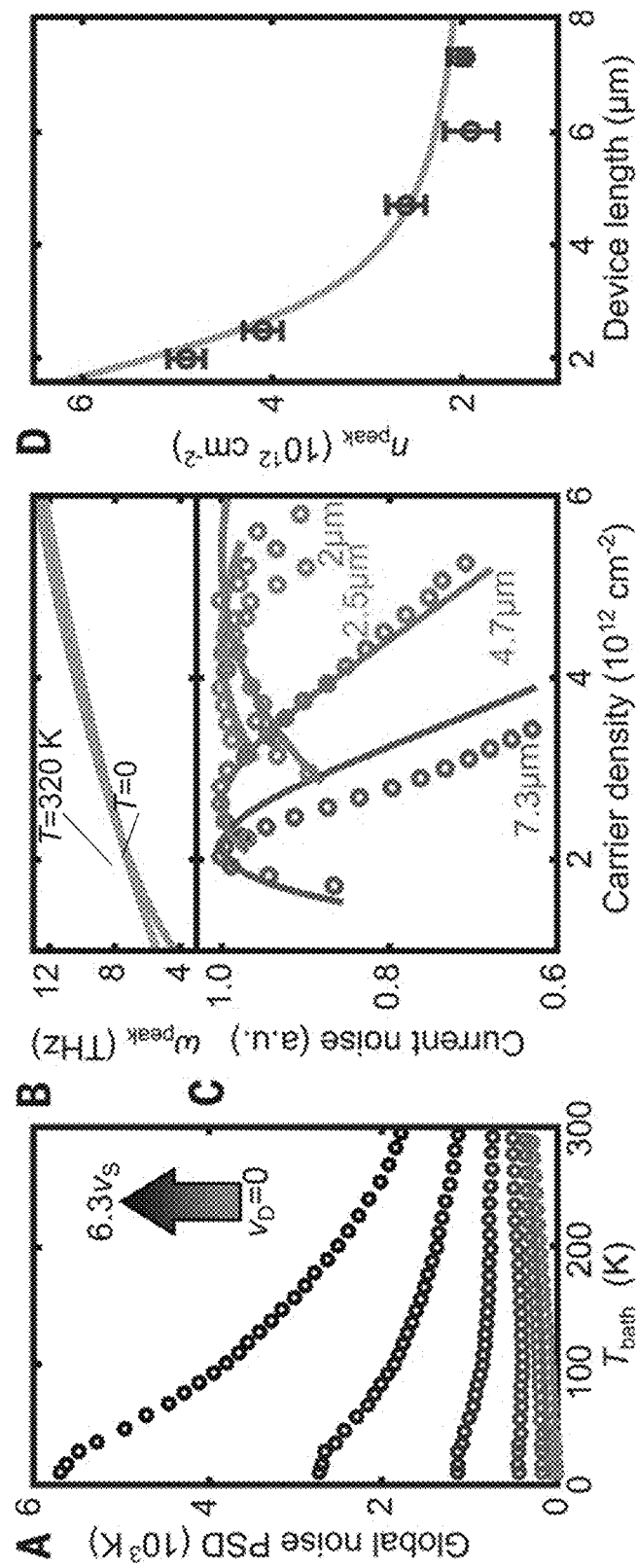
FIG. 5 presents dependences of global noise PSD, calculated peak phonon emission frequency, current noise, on bath temperature and charge density, according to some embodiments of the present disclosure.

In some embodiments, Cerenkov amplification is sensitive to the phonon lifetime, and so the effect can intensify at lower temperatures due to slower anharmonic decay. FIG. 5 presents dependences of global noise PSD, calculated peak phonon emission frequency, current noise, on bath temperature and charge density, according to some embodiments of the present disclosure. Panel A shows global noise PSD as a function of bath temperature at constant drift velocities and carrier density $n=2\times10^{12}$ cm$^{-2}$, according to some embodiments. In some embodiments, it is observed that there is a strong increase in noise as the temperature is reduced from 300 to 10 K, in clear contrast to the decreasing thermal noise observed at low drives $v_D \lesssim v_s$. Without being bound by theory, this can suggest that the amplification process can be limited by scattering with thermally occupied modes at similar energies as the amplified mode (l$\sim$7 THz$\sim$50 K at $n=2\times10^{12}$ cm$^{-2}$).

One aspect of realizing Cerenkov amplification in graphene is that the peak emission frequency can be tuned via the carrier density, n. Panel B shows calculated peak phonon emission frequency, which can be tuned via the graphene carrier density, according to some embodiments. Without being bound by theory, this peak can occur just below the upper limit $\omega\sim 2v_sk_F$, corresponding to transitions across the entire Fermi surface. The frequency tunability can manifest as a non-monotonic dependence of the global current noise on n. Panel C shows normalized global current noise as a function of carrier density for different device lengths j=0.6 mA/μm), according to some embodiments. Solid curves show predicted total phonon emission. Without being bout by theory, initially, the noise can increase with n, because the larger Fermi surface permits emission of more (and higher energy) modes. In other words, increasing n broadens $\Gamma_q^{amp}$. However, in some embodiments, its maximum value decreases at constant current since $v_D=j/(ne)$, eventually causing a downturn in noise.

Without being bound by theory, the cross-over density, $n_{peak}$, can be determined by the width and maximum of $\Gamma_q^{amp}$, which can depend on the device length. Similar to an active filter, the amplification process can narrow the excess phonon distribution $n_q(x)\sim e_q^{\Gamma^{amp}x/v_s}$ as it traverses the device. Panel D shows the charge density at which the noise peaks ($n_{peak}$) for a wider variety of samples than in Panel C, with fit in solid line, according to some embodiments. Error bars represent sampling spacing of carrier densities. In longer devices, the noise therefore can depend more on the maximum of $\Gamma_q^{amp}$ than its width, causing a smaller $n_{peak}$. Such a length dependence can be observed, as shown in Panels C and D of FIG. 5, in terms of current noise, to facilitate comparison with the model. Plotting the predicted total phonon emission along with the data, it can be found that the model reproduces both the peak shift and narrowing well.

These considerations indicate that the observations from example implementations can result from the manifestation of phonon Cerenkov amplification in a 2d material. In particular, they show that graphene can host amplification of acoustic phonons with frequencies as high as 10 THz or 100 THz, significantly higher than that observed in other materials. Embodiments of the disclosed system can therefore offer purely electrical generation and amplification of phonons in a single μm-scale device, with wide frequency tunability.

In some embodiments, the systems are used for active phononic devices and on-chip THz generation. In some embodiments, the systems include phonon coupling to a mechanical cavity to generate a phononic laser, as well as out-coupling of the amplified sound waves to far-field radiation.

Device Fabrication

The device can be fabricated over an insulating or semi-conducting substrate. In some embodiments, devices can be fabricated on diamond substrates. Fabrication of devices on diamond can allow for observation of local noise properties of the devices using color vacancy centers, such as NV centers in diamond. In some embodiments, devices can be fabricated on Si substrates which have native or thermally grown $SiO_2$ layers on top ($Si/SiO_2$ substrates). In some embodiments, devices can be fabricated on other substrates such as alumina, SiC, etc.

Over the substrate, a first insulating layer 110 can be formed. In some embodiments, the first insulating layer 110 is disposed. Over the first insulating layer 110, a sheet 102 (e.g., a monolayer low dimensional material such as graphene) can be formed. The ends of the sheet 102 can be electrically coupled to contacts 104 and 106 that can be connected to an external power source 120. A second insulating layer 108 can be formed over the sheet 102 such that the sheet 102 is sandwiched between the first and second insulating layers 110 and 108. In some embodiments, a radiation conversion device 112 (e.g., an antenna made of metal strip grating) can be formed.

Device on Diamond Substrate

Figure 6:
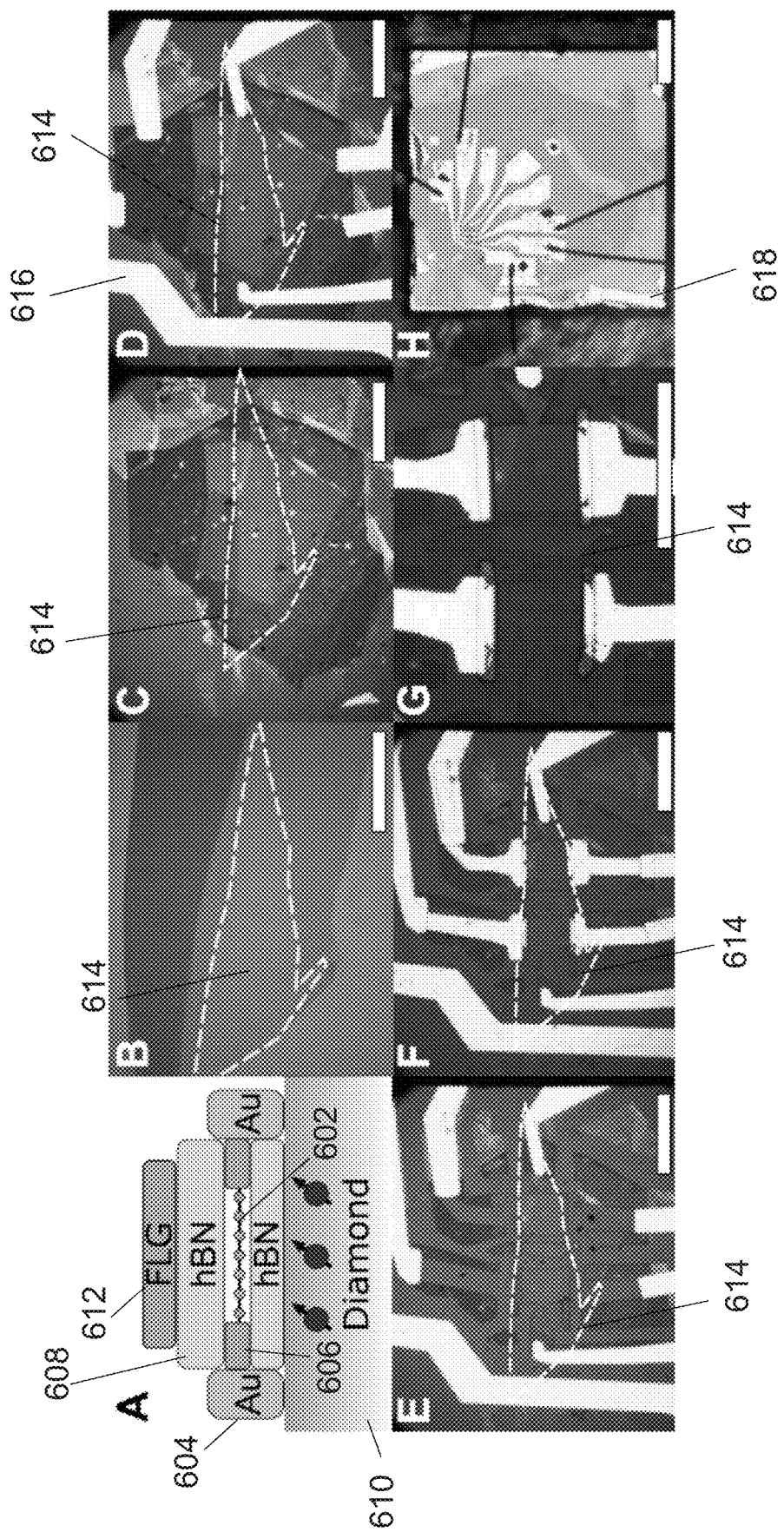
FIG. 6 illustrates example aspects of device fabrication on diamond substrate, according to some embodiments of the present disclosure.

FIG. 6 illustrates example aspects of device fabrication on diamond substrate, according to some embodiments of the present disclosure. Panel A shows an example device schematic from a side view, according to some embodiments. As shown in Panel A, a monolayer graphene sheet 602 can be electrically coupled to contacts 604 (e.g., gold) and encapsulated with two insulating layers 608 (e.g., hBN) and disposed on top of a diamond substrate 610. A top-gate 612 (e.g., multi-layer graphene or few-layer graphene (FLG)) can be formed.

Panels B-H show micrographs of device fabrication, with 40 µm scalebar in (B)-(G) and 500 µm in (H), according to some embodiments. As shown in Panel B, sheets of hexagonal boron nitride (hBN) and graphene 614 can be exfoliated onto a $Si/SiO_2$ substrate, and optical microscopy as well as atomic force microscopy (AFM) are used to pick clean flakes of the desired thicknesses. In some embodiments, the hot polycarbonate (PC) assembly technique ($T_{engage}$~100° C.) are used to assemble the flakes into stacks. In some embodiments, these stacks consist of fully hBN-encapsulated single layer graphene flakes, with two graphite contacts, and a few-layer graphene top-gate (as shown in Panel C). In some embodiments, the top graphene is 3-5 layers thick to ensure uniform doping while still allowing one to optically address the NV centers through the stack. In some embodiments, the top hBN flake is relatively thick (~90 nm) to minimize the doping effect of the source-drain voltage, while the bottom layer is thinner (<20 nm) to minimize the graphene-NV distance. The graphite contacts can be used to ensure that the contact interface is under the top-gate electrode. In some embodiments, upon being assembled, the stack is transferred it onto a $Si/SiO_2$ substrate ($T_{transfer}$~180° C.) and vacuum annealed at 350° C. for 2 minutes. Next, the stack can be picked up again and transferred onto the diamond substrate. The vacuum annealing is not done on the diamond substrate, since it is consistently observed that this can cause a strong background fluorescence signal.

In some embodiments, e-beam lithography (e.g., using the commercially available JEOL JSM-7000F scanning electron microscope) and thermal evaporation (e.g., 10 nm Cr+100 nm Au) are used to construct bonding pads and contacts. During lithography steps, an antistatic agent aquaSAVE™ can be disposed on top of the polymethyl methacrylate (PMMA) layer to prevent charging effects. As shown in Panel D, a thick wire (left-most electrode 616) can be fabricated surrounding the stack for delivering reference microwave noise to the NV centers. Next, the geometry of the device can be defined using a reactive ion etch (e.g., $CHF_3$; Ar, $O_2$), carefully choosing the cleanest region of the stack based on AFM images, as shown in Panel E. Using a new PMMA etch mask, the two edges of the device that were to be contacted are $O_2$-etched, in order to make sure the graphite contacts were well exposed. As shown in Panel F, 2 nm Cr and 120 nm Au are evaporated to create edge contacts. As shown in Panel G, another gentle $O_2$ etch can be used to create two ~200 nm cuts in the top-gate graphene in order to disconnect it from the source-drain contacts. The left device is the source of data for FIG. 3 Panels D-E. Note that ripples visible in the image are entirely contained in the top gate graphene and should not affect the transport properties of the channel graphene, due to the thick (~90 nm) hBN dielectric. The complete, wire bonded device on diamond 618 is shown in Panel H.

Devices on Si/SiO2 Substrate

Figure 7:
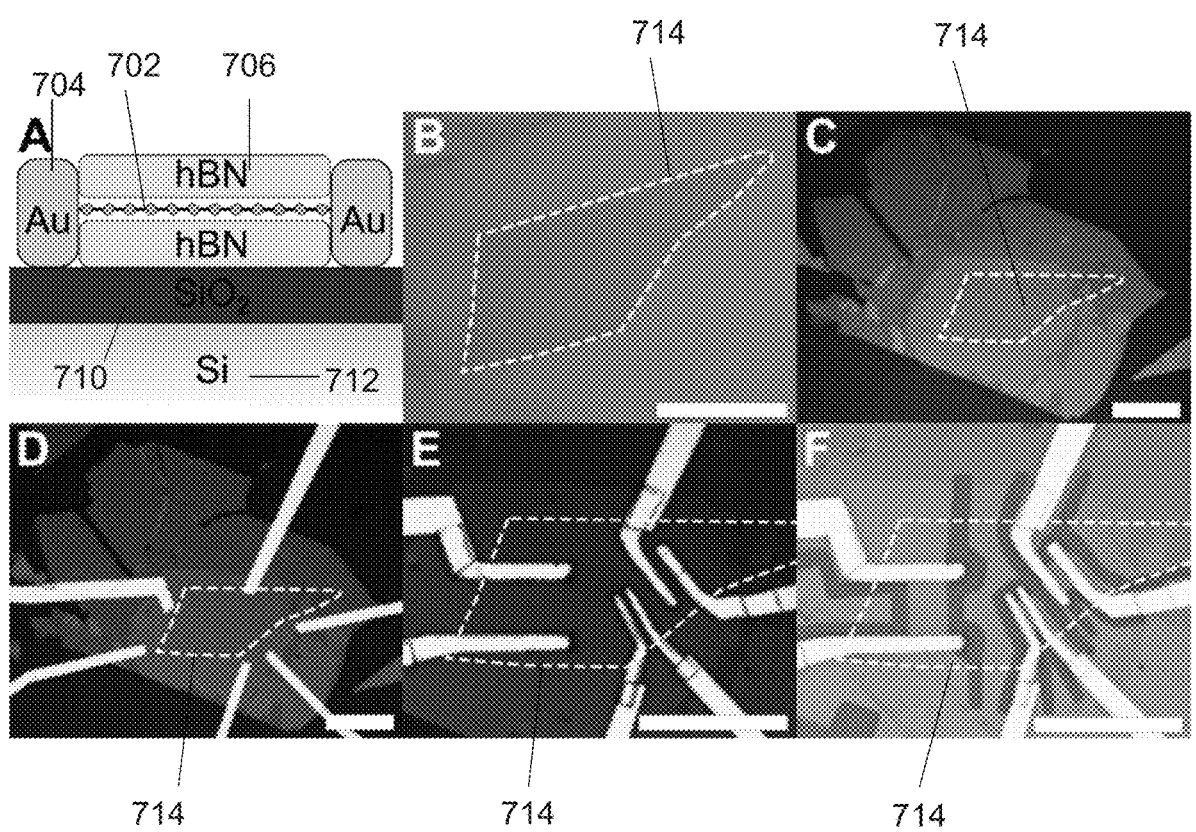
FIG. 7 illustrates example aspects of device fabrication on Si/SiO$_2$ substrate, according to some embodiments of the present disclosure.

FIG. 7 illustrates example aspects of device fabrication on $Si/SiO_2$ substrate, according to some embodiments of the present disclosure. Panel A shows an example device schematic, according to some embodiments. Monolayer graphene (grey chain) 702 can be electrically coupled to gold electrodes 704 and encapsulated with hexagonal boron nitride (hBN) 706. Silicon substrate 712 can be used as a global back-gate.

Panels B-F show micrographs of device fabrication with a 20 µm scalebar, according to some embodiments. Panel B shows exfoliated graphene 714. In some embodiments, the same exfoliation and stacking technique as outlined in the previous section is used in fabricating devices on $Si/SiO_2$-substrates. However, the example samples depicted in FIG. 7 are gated using a global back-gate through the 1 µm thick $SiO_2$ 710 (FIG. 5 Panel A), and therefore do not need a top-gate and graphite contacts. Thus, the stacks can simply consist of an hBN-encapsulated graphene channel, as shown in Panel C. In some embodiments, the remaining fabrication process (FIG. 7 Panels B-F) is identical to the procedure on diamond substrate, except without the reference noise wire and the final top-gate etch step. In other example embodiments where a conductive substrate is used, the conductive substrate can be used as a gate like that shown in FIG. 7 Panel A. The left-most device in Panel F is the source of example data presented in FIG. 2 Panels C-E, FIG. 4 Panels C-D and FIG. 5 Panel A.

Example Sample Device

Below is a brief overview of the non-limiting examples of measured graphene devices in accordance with certain embodiments. The anomalous noise signal discussed throughout the present disclosure can be observed in all the 12 clean (fully encapsulated) devices with lengths≥1.5 µm (e.g., Devices A1-A8 and C1-C4). The disordered (partially or not encapsulated) devices, on the other hand, do not exhibit the desired anomalous noise signal.

| Device name | hBN-encapsulation | Substrate | L × W (µm²) | Abnormal noise |
|---|---|---|---|---|
| A1 | Fully | $SiO_2$ | 6 × 5.4 | Yes |
| A2 | Fully | $SiO_2$ | 9.5 × 11 | Yes |
| A3 | Fully | $SiO_2$ | 2.5 × 11 | Yes |
| A4 | Fully | $SiO_2$ | 2.0 × 3.3 | Yes |
| A5 | Fully | $SiO_2$ | 4.7 × 2.3 | Yes |
| A6 | Fully | $SiO_2$ | 7.3 × 5.3 | Yes |
| A7 | Fully | $SiO_2$ | 7.3 × 5.3 | Yes |
| A8 | Fully | $SiO_2$ | 45 × 15 | Yes |
| A9 | Fully | $SiO_2$ | 1.3 × 5.0 | Unclear |
| A10 | Fully | $SiO_2$ | 1.0 × 5.0 | Unclear |
| B1 | Bottom Only | $SiO_2$ | 7 × 18 | No |
| B2 | None | $SiO_2$ | 10 × 15 | No |

| Device name | hBN-encapsulation | Substrate | L × W (µm²) | Abnormal noise |
|---|---|---|---|---|
| B3 | None | SiO₂ | 12 × 19 | No |
| B4 | Top Only | SiO₂ | 10 × 15 | No |
| B5 | Top Only | SiO₂ | 12 × 19 | No |
| C1 | Fully | Diamond | 6 × 22 | Yes |
| C2 | Fully | Diamond | 17 × 20 | Yes |
| C3 | Fully | Diamond | 20 × 23 | Yes |
| C4 | Fully | Diamond | 6 × 8.4 | Yes |

For Devices A9 and A10, the noise temperatures are higher than expected from thermal model, but the other signatures are missing (e.g., the spectrum is white, and the noise depends sub-linearly on power). Without being bound by theory, it is proposed that this is due to electronic shot noise (e.g., random fluctuations of the electric current), commonly observed in short devices.

For Devices B1-B5 which have partial or no hBN encapsulation, the abnormal noise is missing. It can also be found that the electron mobilities in Devices B1-B5 are lower than other devices in which the abnormal noise can be observed. Without being bound by theory, the reasons for the absence of the noise signature can be low electron mobility resulted from impurities.

Device Transport Properties

As stated above, a mobility of 20-40 m²/Vs for example Device A1 is observed. This device measures L×W=6×5.4 µm² and the mobility can be calculated at n=2×10¹² cm⁻² as $$\mu = \frac{L}{Wne}\frac{1}{R-Rc},$$

where R is the 2-probe device resistance, and $R_c$ is the contact resistance. The mobility can be plotted as a function of the contact resistivity (FIG. 8) over a range of typical values for Cr+Au edge contacts.

Figure 9:
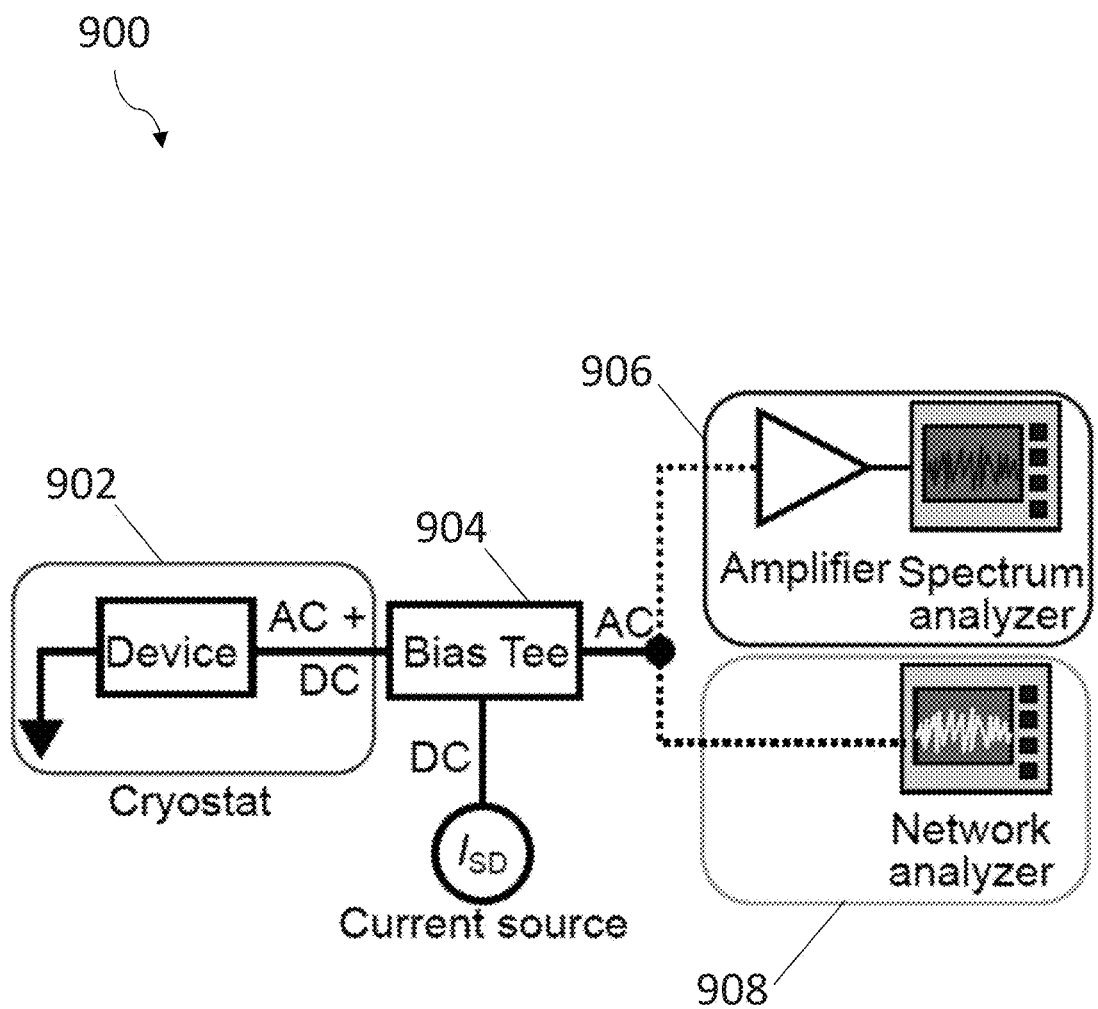
FIG. 9 is an illustration of a measurement circuit, according to some embodiments of the present disclosure.

Example AC Conductivity and Noise Measurements
Electronic High Frequency Measurement Setup In some embodiments, nonequilibrium electronic behavior can manifest itself though abnormal noise and conductivity. FIG. 9 shows a schematic of an exemplary measurement system 900 for measuring noise and AC differential conductivity, according to some embodiments of the present disclosure. In some embodiments, high-frequency noise and conductivity measurements are performed in a cryostat 904 (e.g., Janis ST-400 cryostat) equipped with coax lines. In some embodiments, to improve high-frequency signal transmission, a PCB with co-planar waveguides is used which can be connected to the device with short wire bonds. The DC bias is applied through an external bias tee 904 (e.g., commercially available Mini-Circuits® ZBT-4R2GW+) that directed AC signals to either an amplifier 906 (e.g., commercially available Fairview Microwave™ SLNA-030-34-14-SMA) and spectrum analyzer (e.g., commercially available Keysight™ N9322C) for noise measurements, or to a network analyzer 908 (e.g., commercially available Keysight™ N5222A) for AC conductivity measurements.

AC Conductivity Calibration

In some embodiments, the (intensive) conductivity spectrum $\sigma(\omega)=L/W \cdot G'(\omega)$ is found by first determining the (extensive) differential conductance $G'(\omega)$ and then multiplying by the aspect ratio L/W. Moreover, it is noted that the differential conductance $G'(\omega)=dI(\omega)/dV(\omega)$, not the chord conductance G=I/V.

In some embodiments, in order to determine the AC conductance spectrum, a bias tee is used to measure the reflection coefficient $r=|r|e^{i\phi}$ with a network analyzer, while simultaneously DC-biasing the sample. Without being bound by theory, the reflection coefficient depends on not only the impedance matching to the sample, but also the external cabling leading up to it:

$$|r|e^{i\phi} = r_{ext}(\omega) + t_{ext}^2(\omega) \cdot \frac{50\Omega - Z(\omega, G')}{50\Omega + Z(\omega, G')} \quad (4)$$

where $r_{ext}(\omega)$ is the reflection from external components between the network analyzer and the sample (e.g. connectors, cables), and $t_{ext}(\omega)$ is the transmission through these. It is noted that $r_{ext}$ and $t_{ext}$ are completely independent of the sample conductance, and one would observe $r=r_{ext}-t_{ext}^2$ if the cable is open instead of connected to the sample. $Z(\omega, G')$ is the complex impedance of the sample, which depends on its differential conductance, but also on parasitic reactance. The latter comes predominantly from two sources:

1) Capacitance from the ~75×75 µm² source bonding pad on 1 µm SiO₂ dielectric (C~0.2 pF)
2) Inductance from ~10 mm wire bond (L~10 nH)

Figure 10:
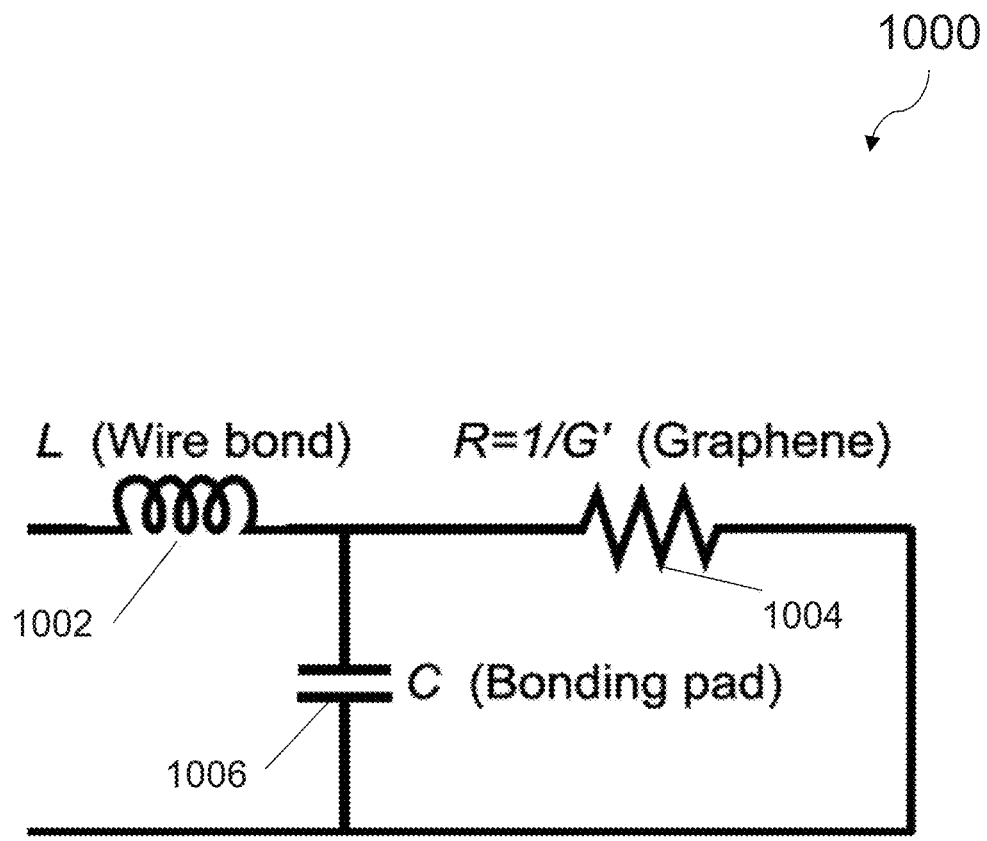
FIG. 10 presents a circuit diagram of a wire bonded device, according to some embodiments of the present disclosure.

Without being bound by theory, FIG. 10 shows an exemplary circuit diagram of wire bonded device 1000, showing main sources of parasitic reactance, according to some embodiments of the present disclosure. In some embodiments, the circuit 1000 includes a wire bond 1002, a bonding pad 1006 and a graphene sheet 1004. In some embodiments, the circuit model shown in FIG. 10 gives the impedance:

$$Z(\omega, G') = i\omega L + \frac{1}{G'(\omega) + i\omega C} \quad (5)$$

Without being bound by theory, in some embodiments, it can be assumed that the parasitic L and C do not change with the graphene doping or the current flowing through the sample. The reflection coefficient r(ω, G') depends on only one graphene property, namely the differential conductance G'(ω). The latter depends on both the graphene current density (j) and doping (n), but if two pairs of parameters ($j_A$, $n_A$) and ($j_B$, $n_B$) give the same $G_A'(\omega)=G'(\omega)$, at a given ω, then their reflection coefficients can also be the same at that ω.

Figure 11:
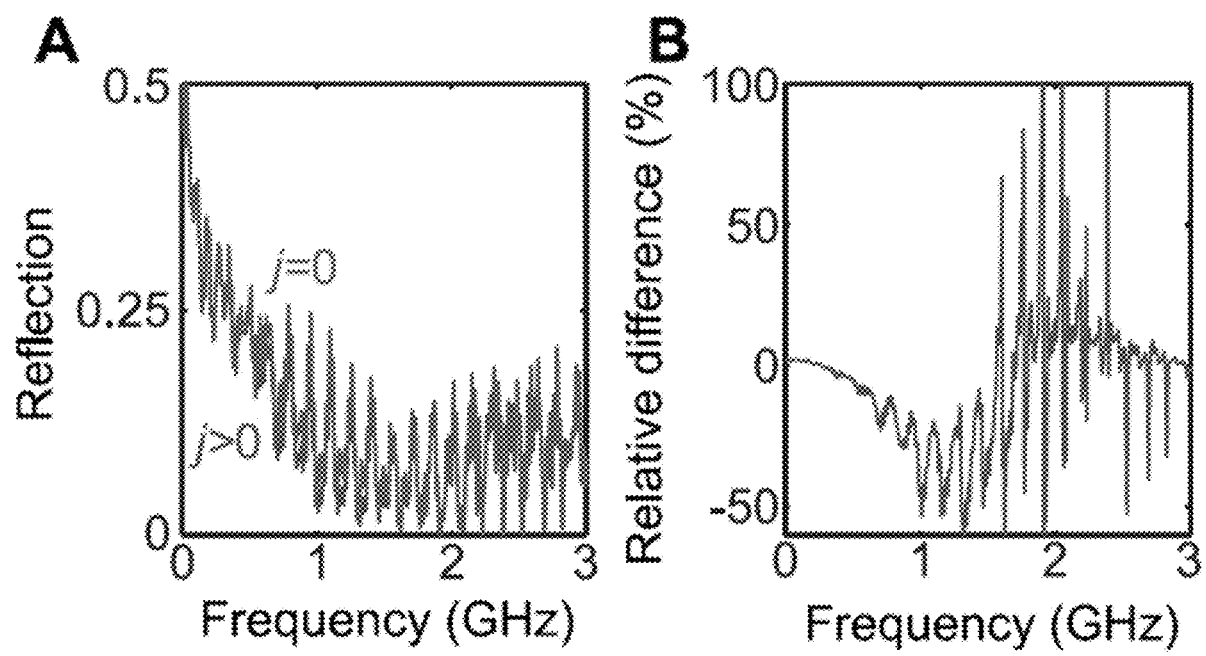
FIG. 11 presents reflection spectrum and relative difference in reflection, according to some embodiments of the present disclosure.

In some embodiments, a reflection spectrum can be used to monitor AC conductivity which can indicate the presence of the electron-phonon instability. FIG. 11 shows an exemplary reflection spectrum in the biased and unbiased case and relative difference in reflection, according to some embodiments of the present disclosure. The gate can be used to keep the DC conductance equal (3.1 mS) in the two cases, and as expected, the DC reflection is approximately equal. At higher frequencies, however, the reflection coefficients differ significantly, indicating that the conductance varies with frequency.

A result as shown above is that the AC differential conductivity of clean graphene devices can become frequency-dependent in the G-z-range when a strong DC bias is applied. This can be seen in example raw reflection measurements shown in FIG. 11, which shows comparison between a biased measurement ($j_A$=0.56 mA/µm $n_A$=2×10¹² cm⁻²), to an unbiased one ($j_B$=0.0 mA/µm $n_B$=0.24×10¹² cm⁻²), that have the same DC conductance $G_A'(0)=G_B'(0)$= 3.1 mS. Without being bound by theory, it can be found that these two pairs have the same DC reflection $r_A(0)^A = r_B(0)^B$. However, at higher frequencies, one can find $r_A(\omega>0) \neq r_B(\omega>0)$, which can indicate that $G_A'(\omega>0) \neq G_B'(\omega>0)$. Since the unbiased $G_B'(\omega)$ can be frequency-independent at the low frequencies considered here, it can be concluded that the biased $G_A'(\omega)$ develops a frequency dependence.

Without being bound by theory, in order to determine $G'(\omega)$ at non-zero bias, one can determine C, L, $r_{ext}(\omega)$ and $t_{ext}(\omega)$. This is done by measuring $|r|e^{i\varnothing}$ at zero bias, while sweeping G' using the electrostatic gate. It is noted that since no DC bias is applied during this calibration step, it can be assumed that the graphene conductance G' is frequency-independent through the entire frequency range used here (<3 GHz). In other words, one could simply measure the DC conductance G'(0), and use $G'(\omega) = G'(0)$. In some embodiments, this only applies to the conductance of the graphene itself, not the total impedance, which also contains the frequency-dependent reactance due to parasitic capacitance and inductance.

Figure 12:
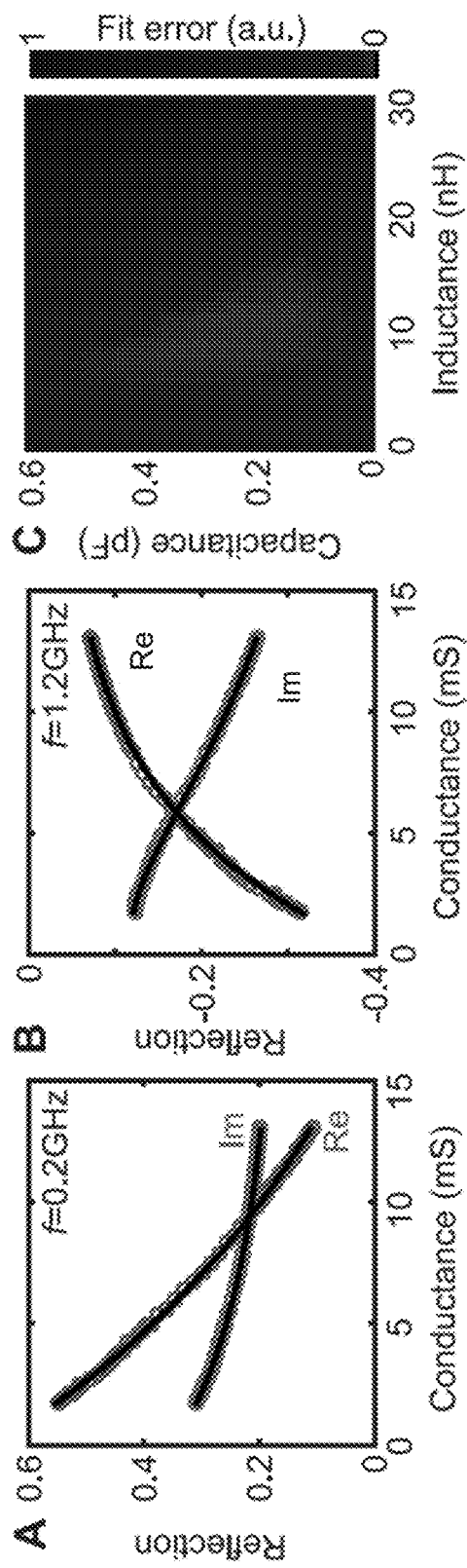
FIG. 12 presents real and imaginary parts of the reflection coefficient and total fit error, according to some embodiments of the present disclosure.

To translate reflection spectra into AC conductivities, FIG. 12 Panels A and B show real and imaginary parts of the reflection coefficient at $\omega = 2\pi \cdot 0.2$ GHz (A) and $2\pi \cdot 1.2$ GHz (B), as a function of the conductance (swept through electrostatic gating at zero bias), according to some embodiments of the present disclosure. Using L=11 nH and C=0.24 pF, one can extract $r_{ext}$ (0.2 GHz)=−0.011+0.085i, $t_{ext}^2$ (0.2 GHz)=0.66+0.29i, $r_{ext}$ (1.2 GHz)=0.041−0.048i, and $t_{ext}^2$ (1.2 GHz)=−0.43−0.17i. Panel C shows a total fit error (summed over all $\omega$) as a function of parasitic capacitance and inductance, according to some embodiments of the present disclosure. The error is minimized at L~11 nH and C~0.24 pF.

Using eqn. 4, both the real and imaginary parts of r ($\omega$, G') (examples in FIG. 12 Panels A-B) can be fitted, and it can be found C=0.24 (0.22) pF and L=11 (16) nH for device A2 (A1) (FIG. 12 Panel C), in excellent agreement with the expected parasitic reactance components.

In some embodiments, without being bound by theory, the extracted parameters are used to determine the frequency-dependent conductance G'($\omega$; j, n) in the biased case, using the measured r($\omega$; j, n). In some embodiments, one can filter out a small spurious periodic signal whose period was found to vary with cable length l according to l/c. The resulting spectra are plotted in FIG. 4 Panels B and D.

Noise Measurement and Calibration

Without being bound by theory, global noise can be shown in terms of noise power spectral density in units of Kelvin. This quantifies the noise power dissipated in the device per unit bandwidth and corresponds to the equivalent electron temperature that could be used to generate the same noise signal from thermal (Johnson-Nyquist) noise alone. For example, 300K corresponds to −174 dBm/Hz of noise power per unit bandwidth. The anomalous noise signal measured in clean devices is not due to Johnson-Nyquist noise.

In some embodiments, to measure the noise from graphene sample, the current fluctuations are amplified with two low-noise 34 dB amplifiers in series (e.g., commercially available Fairview Microwave™ SLNA-030-34-14-SMA) and recorded the spectrum with a spectrum analyzer. The recorded noise $S_{rec}(\omega)$ can be a transformed version of the actual noise $S_{act}(\omega)$, due to both background noise $S_0(\omega, G')$ and the gain function A($\omega$, G') of the total setup:

$$S_{rec}(\omega;j,n) = S_0(\omega, G'(\omega;j;n)) + A(\omega, G'(w;j,n)) \cdot S_{act}(\omega;j;n) \quad (6)$$

Both $S_0$ and A can depend on the sample conductance spectrum G'($\omega$; j; n), which can depend on the current and charge densities, j and n. The background $S_0$ can have a weak G'-dependence because part of the external background noise can be reflected off the sample before reaching the spectrum analyzer. Indeed, a higher background signal can be observed when the conductance G' is further away from the impedance-matched value. The gain A' can depend on G more strongly, because the impedance matching determines the transmission of the signal from the sample to the 50Ω cable. In addition, A can also depend on external factors, such as amplifier gain and cable attenuation (represented by $A_{ext}(\omega)$ below):

$$A(\omega, G') = A_{ext}(\omega) \cdot \left(1 - \left|\frac{50\Omega - Z(\omega, G')}{50\Omega + Z(\omega, G')}\right|^2\right) \quad (7)$$

Here, Z is the (complex) impedance of the sample, which depends on the differential conductance G' of the sample, as well as parasitic reactive components.

Figure 13:
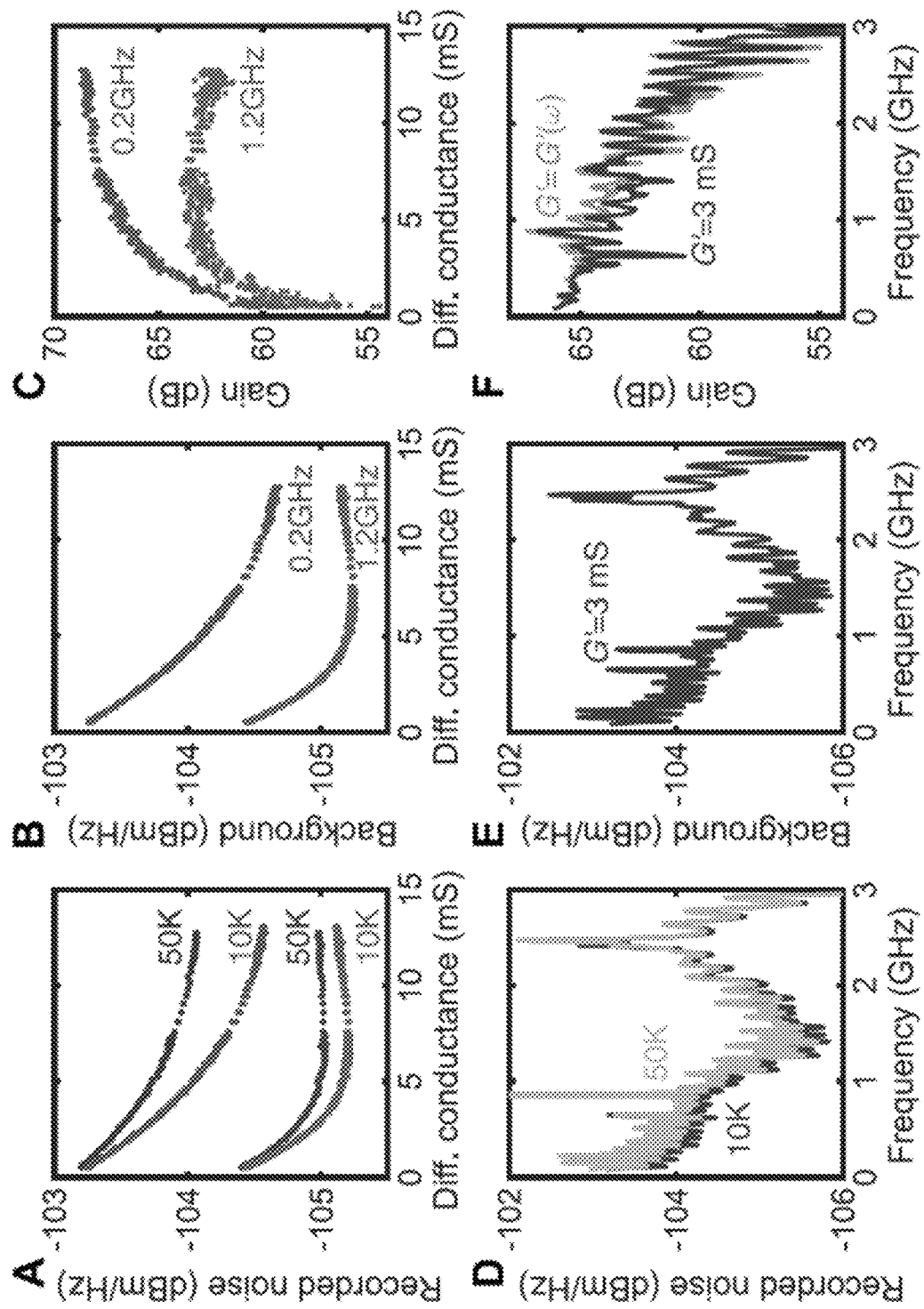
FIG. 13 illustrates example aspects of noise calibration, according to some embodiments of the present disclosure.

In order to accurately measure noises resulted from non-equilibrium processes in the graphene device, the system and measurement noises can first be calibrated. FIG. 13 shows example aspects of noise calibration, according to some embodiments of the present disclosure. Panels A-C present data at $f=0.2$ GHz and $f=1.2$ GHz, according to some embodiments. Panel A shows recorded noise $S_{rec}$ vs. differential conductance G' at base temperature $T_C=10$ K and an elevated temperature $T_H=50$ K. The noise is minimized when Z(G') is closest to matching 50Ω, because at such low temperatures, the noise is dominated by background noise reflected off the sample. As expected, the matching value of G' is above 12 mS (below 80Ω) at low frequencies but shifts to ~6 mS (~150Ω) at $f=1.2$ GHz, due to the emerging parasitic reactance. Panel B shows background noise $S_0$ calculated according to eqn. 9. Panel C shows total gain A calculated according to eqn. 8. Sub-unity transmission and losses in the cables bring A below the 68 dB amplifier gain. Panels D-F shows recorded noise, background noise and total gain as a function of frequency, $f=\omega/2\pi$, according to some embodiments. Curves in Panels D and E show measurements at fixed G'=3 mS. The upper curve in Panel F accounts for the frequency-dependence of G'($\omega$; j, n) for the particular driven case, j=0.56 mA/μm, n=2×10$^{12}$ cm$^{-2}$.

In some embodiments, in order to characterize $S_0(\omega, G')$ and A(a), G'), it is useful to calibrate noise measurements using two known (preferably white) noise signals from the sample. In some embodiments, a heating stage is used to record the Johnson noise $k_BT$ from the graphene at an elevated temperature $T_H$ and at the base temperature $T_C$, while sweeping the gate through a wide range of G' (FIG. 13 Panels A and D). To minimize heating effects on $S_0(\omega)$ (by heating up other noisy components), or on A($\omega$, G') (through temperature-induced changes in parasitic reactive components), a local heater that only heats the silicon substrate supporting the graphene device can be used, keeping the rest of the cryostat cold. Without being bound by theory, $S_0(\omega, G')$ can be found from:

$$A(\omega, G') = \frac{S_{rec}^H(\omega, G') - S_{rec}^C(\omega, G')}{k_B(T_H - T_C)} \quad (8)$$

$$S_0(\omega, G') = \frac{S_{rec}^C(\omega, G')T_H - S_{rec}^H(\omega, G')T_C}{T_H - T_C} \quad (9)$$

where $S_{rec}^{H(C)}(\omega, G')$ is the noise recorded at $T_{H(C)}$. In some embodiments, no bias is applied during these calibration measurements, so the conductance spectrum is flat and could be determined from DC measurements. The procedure to find $S_0(\omega, G')$ and $A(\omega, G')$ is shown as a function of $G'$ in FIG. 13 Panels B-C, and as a function of to in FIG. 13 Panels E-F.

Figure 14:
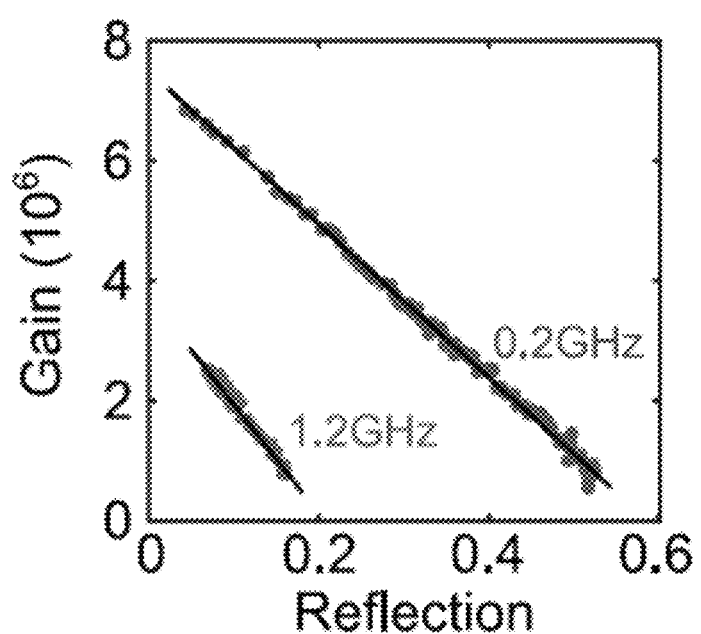
FIG. 14 presents linear relationship between gain and reflection, according to some embodiments of the present disclosure.

FIG. 14 shows linear relationship between gain and reflection, as observed in some example sample devices corresponding to some embodiments of the present disclosure. Gain $A(\omega, G')$ is plotted against the reflection, $|r(\omega, G')|^2$ at $\omega=2\pi\cdot 0.2$ GHz (blue) and $2\omega=2\pi\cdot 1.2$ GHz (orange). The different points can be obtained by sweeping the charge density n (and thus also $G'$) at zero bias. As expected, the two quantities are linearly related. The gain in the biased case $A(\omega, G'(\omega; j, n))$ can now be found by measuring the reflection $|r(\omega, G'(\omega; j, n))|^2$ while applying current, and inserting it into the fit.

As shown in FIG. 13 Panel F, the effect of the frequency-dependent $G'$ on the gain (the effect on $S_0$ is much smaller ~0.1%) can be corrected. In some embodiments, this is done by also measuring the reflection coefficient (plotted against initial gain calibration in FIG. 14), and utilizing the near-linear relationship between reflection and transmission:

$$A(\omega, G') \sim A_{ext}\left(1 - \frac{|r(\omega, G')|^2}{|t_{ext(\omega)}|^4}\right) \quad (10)$$

where r is the measured reflection coefficient with the network analyzer, and $t_{ext}$ is the transmission through external cabling. Reflections from external components can be ignored, since reflections predominantly come from the sample. While the gain $A(\omega, G')$ can be measured at j=0, the reflection $|r(\omega, G')|^2$ can be measured while applying a non-zero current. Thus, one can measure $|r(\omega, G'(\omega; j, n))|^2$ and translate it to $A(\omega, G'(\omega; j, n))$, using the fits of $A(\omega, G')$ vs. $|r(\omega, G')|^2$ at each $\omega$ (FIG. 14). The corrected gain profile $A(\omega, G'(w; j, n))$ at a particular (non-zero) current density j=0.56 mA/µm and n=2×10$^{12}$ cm$^{-2}$ is shown in FIG. 13 Panel F.

After these calibration steps, a current j can be applied through the device and measured the noise $s_{rec}(\omega; j, n)$. One could then use the determined $S_0(\omega, G')$ and $A(\omega, G'(\omega; j, n))$ to determine the actual noise, $S_{act}(\omega; j, n)$ from eqn. 6. Telecom signals at f=800 MHz are removed, as well as regions where the linear relationship in eqn. 10 broke down due to strong external reflections.

Additional Noise and Conductivity Measurements
Noise Power Vs. Drift Velocity

Figure 15:
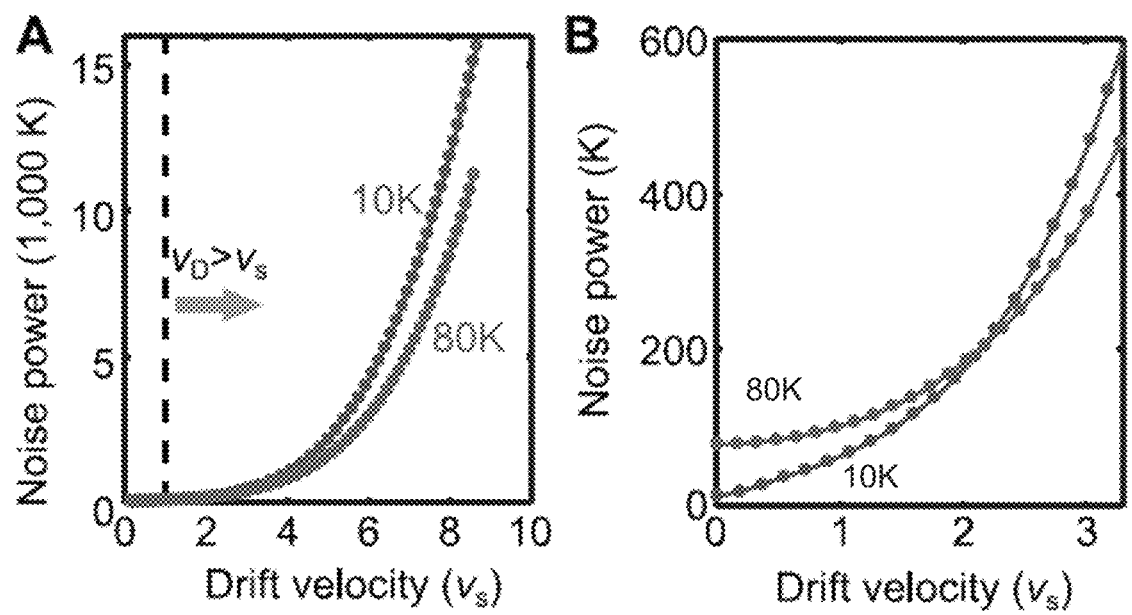
FIG. 15 presents noise versus drift velocity, according to some embodiments of the present disclosure.

As discussed above, phonons generation resulted from Cerenkov amplification can take place when the carrier drift velocity exceeds the velocity of sound. With increasing drift velocity, both the phonon amplification rate and the number of amplified phonon modes can increase. Therefore, the associated noise can grow as the carrier drift velocity increases. FIG. 15 shows noise versus drift velocity, according to some embodiments of the present disclosure. Panel A shows measured noise power spectral density (averaged over 0.1-0.3 GHz) as a function of electronic drift velocity in clean device A1, at bath temperatures 10 K and 80 K (blue and red, respectively), according to some embodiments. Equivalent noise temperatures are observed in excess of 15,000 K. Panel B shows zoomed-in version of Panel A to highlight smooth transition into the excess noise regime, according to some embodiments. Lines are guides to the eye.

As shown in FIG. 2 Panel E, the noise power is presented as a function of bias power P for a limited range of P, to facilitate comparison between clean and disordered devices and highlight their contrasting behavior. Here in FIG. 15, the dependence of global noise on electronic drift velocity is shown for the full range of bias drives. As expected, no anomalous noise is observed below $v_D=v_s$. It can be noted that no sharp transition is expected at $v_D=v_s$, since at this point, only one phonon mode satisfies the Cerenkov criterion, and with a negligible amplification rate. Thus, a smooth transition into the excess noise regime can be observed as the number of amplified modes and the amplification rate increase.

Disordered Device Noise

In some embodiments, to model the thermal noise observed in a disordered device, one can consider the balance between Joule heating P and phonon cooling. Without being bound by theory, the rate of the latter is can be given by $\Sigma(T_e^\delta - T_{ph}^\delta)$, where $\Sigma$ is a cooling constant and $T_e$ and $T_{ph}$ are the electron and phonon temperatures, respectively. Solving for the electronic temperature, one can find:

$$T_e = (T_{bath}^\delta = P/\Sigma)^{1/\delta} \quad (11)$$

where it is assumed that the phonon temperature remains close to the base temperature $T_{bath}$, as normally observed.

Figure 16:
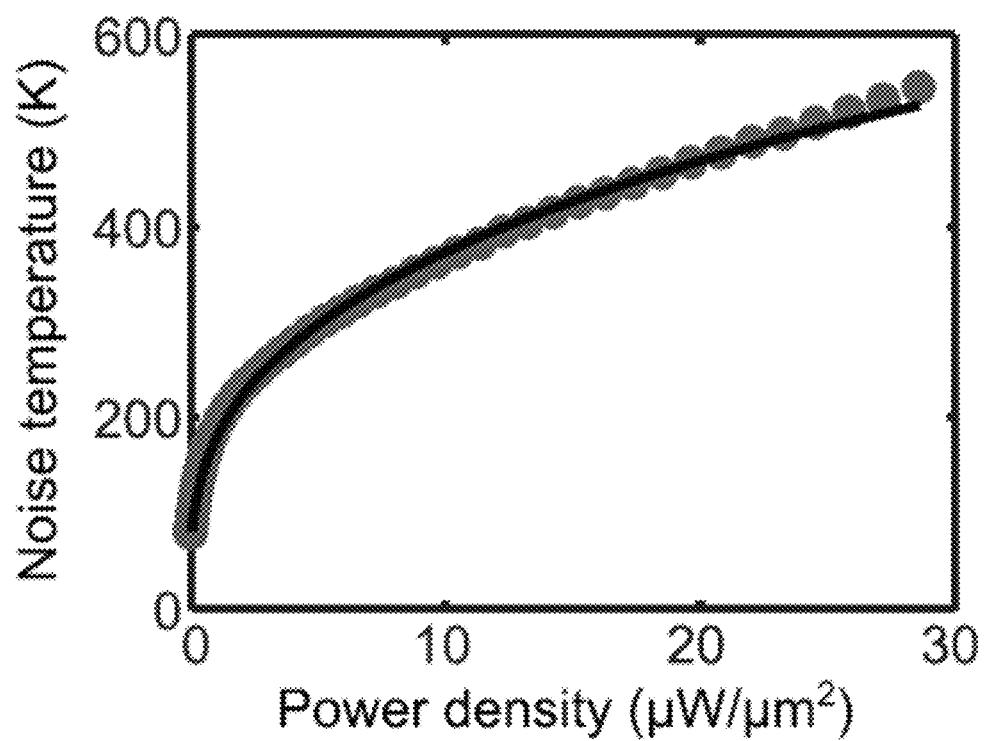
FIG. 16 presents Johnson noise in a disordered device, according to some embodiments of the present disclosure.

Without being bound by theory, to demonstrate that the noise observed in the clean graphene device has contributions from sources other than the thermal noise while the noise in a disordered device is dominated by thermal noise, FIG. 16 shows Johnson noise in a disordered device, according to some embodiments of the present disclosure. Measured noise temperature is shown as a function of input power for disordered device B1. Unlike in the plots shown in FIG. 15, which increase exponentially, the noise power in FIG. 16 has a decreased rate of growth as a function of power density (roughly proportional to drift velocity), showing that the clean devices have additional noise contributions. The data agrees well with a fit based on disorder-assisted phonon cooling and confirms that the dominant noise source is thermal Johnson-Nyquist noise.

In samples with high impurity density, phonon cooling is usually dominated by "supercollision" scattering, in which electrons can scatter with phonons with the assistance of defects. In that case, without being bound by theory, one can find $$\delta = 3 \text{ and } \Sigma = 9.62 \frac{g^2 DoS^2(E_F) k_B^3}{\hbar k_F \ell},$$

where g is the electron-phonon coupling and l is the mean-free path. Fitting the data with expression 11, good agreement can be reached (FIG. 16) and $\delta=3.04$ can be obtained. In some embodiments, one can also extract the deformation potential from the fitted value of $\Sigma$, and find D=39 eV. This is consistent disorder-assisted cooling in graphene (D=70 eV) which has a range of ~10-30 eV. (It is noted that the more accepted value of D=20 eV is used for all other fits pertaining to Cerenkov emission in clean devices.) This can confirm that the dominant noise in the example driven disordered devices is thermal Johnson-Nyquist noise.

Length Dependence in Global Noise Measurements

Figure 17:
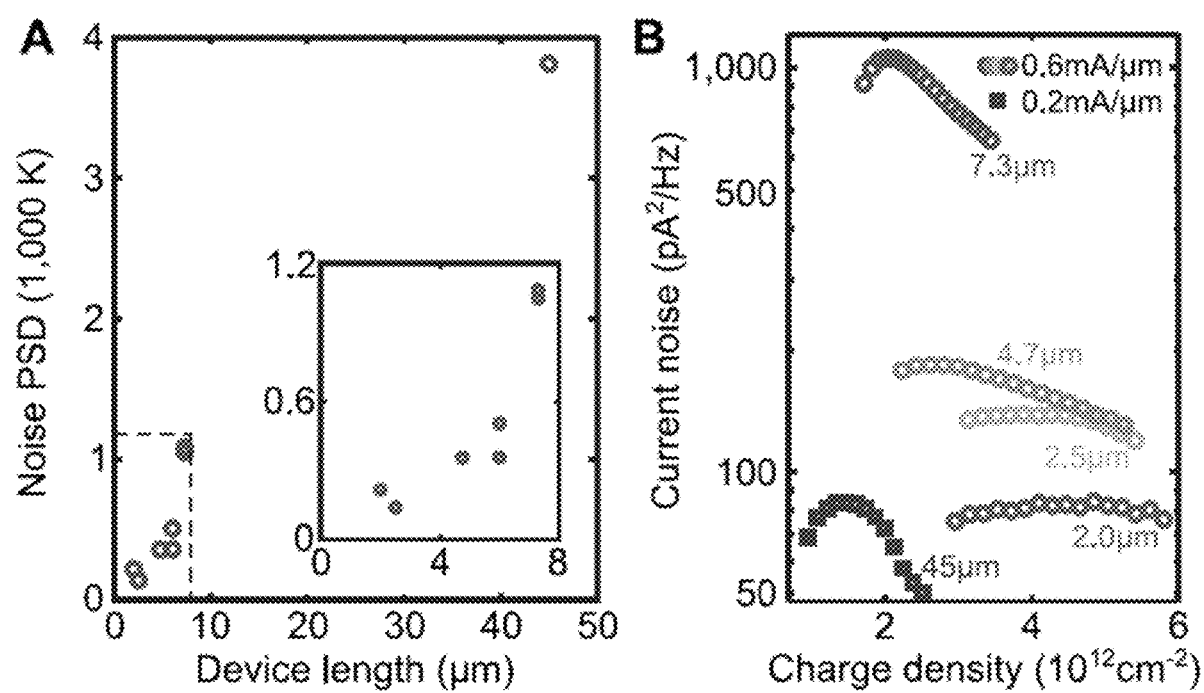
FIG. 17 presents dependence of noise on device length, according to some embodiments of the present disclosure.

In some example implementations, local (NV-based) noise measurements indicates that the noise grows across the device in the direction of carrier flow. By measuring devices of different lengths, one can find a similar trend in the global noise. At a constant electronic drift velocity ($v_D=3.3v_s$) and charge density (n=2×10$^{12}$ cm$^{-2}$), the noise can initially grow super-linearly with device length (FIG. 17 Panel A, inset). In some embodiments, the longest device does not appear to follow the initial length dependence, hinting at the role of saturation effects that prevent unbounded exponential growth of the phonon population (FIG. 17 Panel A).

As the device length increases, it can be expected that more phonons can be generated and amplified, and therefore, the noise can increase as well. FIG. 17 shows dependence of noise on device length, according to some embodiments of the present disclosure. Panel A shows measured noise power spectral density from devices of different lengths, at $v_D=3.3v_s$ and $n=2\times10^{12}$ cm$^{-2}$, according to some embodiments. The noise power can initially increase superlinearly with device length (inset) but appear to saturate in longer devices. Panel B shows current noise versus carrier density at constant current density $j=0.6$ mA/μm (circles) and $j=0.2$ mA/μm (squares), according to some embodiments. As shown in the main text, the cross-over density can decrease with device length.

The charge density dependence before normalization is shown in FIG. 17 Panel B. Measurements of the longest (L=45 μm) device are included, which broke down before one could reach the current density used above. This longer device shows a cross-over at an even lower charge density than the other devices. The density dependence in terms of current noise $\delta^2 I$ is shown, which is similar to noise power, but divided by the differential resistance. This is done to allow for comparison with the model, but the non-monotonic dependence is also observed when plotted in terms of noise power.

Global Noise Independent of Carrier Flow Direction

Figure 18:
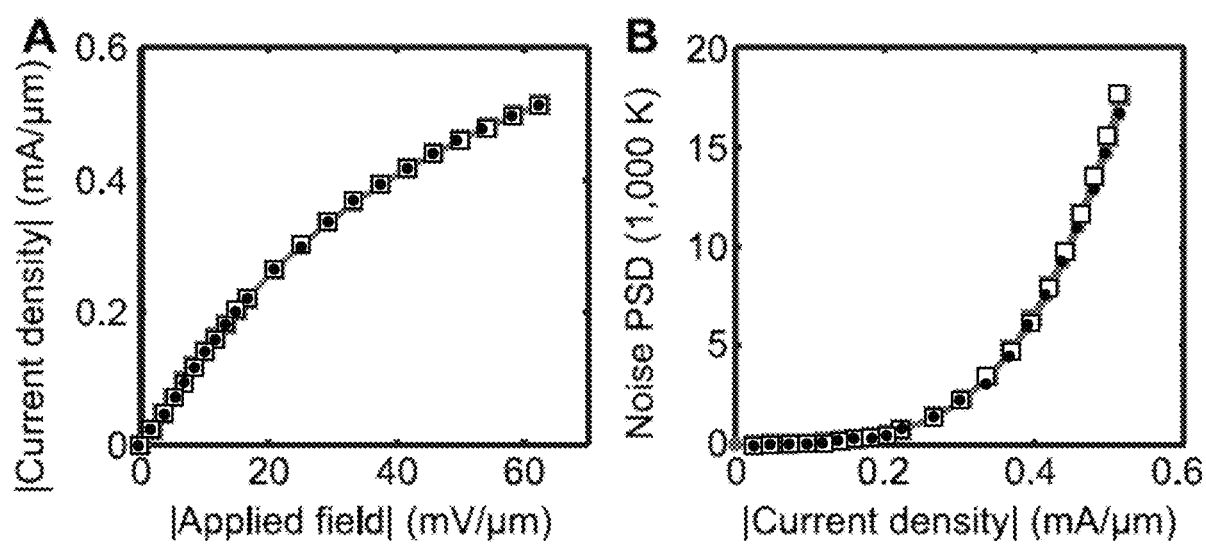
FIG. 18 presents global electronic transport and noise under current inversion, according to some embodiments of the present disclosure.

As discussed above, in some embodiments, the local noise measured far from the middle of the device can exhibit strong asymmetry with respect to carrier flow direction (FIG. 3 Panel C). In some embodiments, no such asymmetry is observed in I-V transport or global noise measurements, which indicates the absence of any asymmetry in the clean graphene devices. FIG. 18 shows global electronic transport and noise under current inversion, according to some embodiments of the present disclosure. Panel A shows absolute value of current density versus absolute applied field at $n=2\times10^{12}$ cm$^{-2}$ and T=10 K, for positive (solid circles) and negative (open squares) fields, according to some embodiments. The I-V curve is observed to be highly symmetric. Panel B shows global noise power spectral density as a function of (absolute) current density, according to some embodiments. Changing the sign of the current has almost no effect on the measured noise power. Lines are guides to the eye.

Independence of Conductivity Time Scales on Charge Density and Temperature

Figure 19:
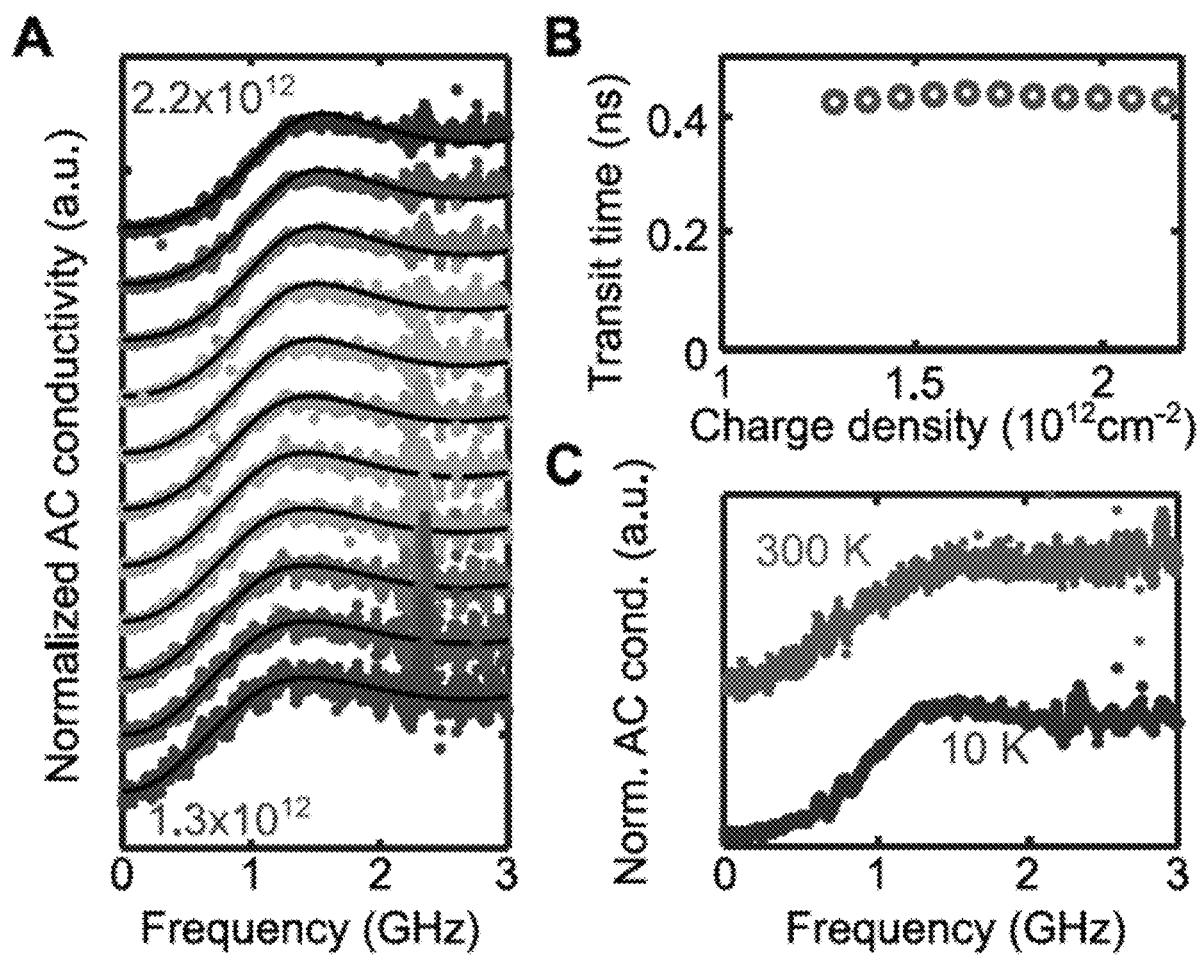
FIG. 19 presents global conductivity for different charge densities and temperatures, according to some embodiments of the present disclosure.

In some embodiments, the frequency at which the AC conductivity changes due to the electron-phonon instability is independent of temperature and charge density. FIG. 19 shows global conductivity for different charge densities and temperatures, measured according to some nonlimiting implementations of embodiments of the present disclosure. Panel A shows the normalized real part of the conductivity spectrum for $v_D=0.125v_F$ at different doping levels, according to some embodiments. The curves are normalized to have the same vertical spread and are offset to avoid overlap. The general shape of the conductivity spectrum, as well as the extracted time scales shown in Panel B are unchanged by varying the charge density, according to some embodiments. Panel C shows the normalized real part of the conductivity spectrum measured at bath temperatures of 300 K and 10 K, at $v_D=0.125v_F$ and $n=2.2\times10^{12}$ cm$^{-2}$, according to some embodiments. No clear frequency shifts can be observed, but the effect can be much (~4 times) weaker at room temperature than at 10 K.

As shown above, the time scale extracted from conductivity measurements can be independent of drift velocity. It can be shown that the time scale does not depend on charge density and sample temperature either. FIG. 19 Panel A shows normalized AC conductivity spectra measured at charge densities ranging from in 1.3 to $2.2\times10^{12}$ cm$^{-2}$, with the extracted time scales displayed in FIG. 19 Panel B. Evidently, no dependence on charge density can be observed. One can compare the conductivity spectra obtained at 10 K and room temperature, and again observe no clear change in the time scale. The independence on these parameters can be consistent with the model, since the time scale can be determined by the phonon traversal time $T=L/v_s$. It can be emphasized that this is only the case for the time scale; the magnitude of both the conductivity and noise features can depend strongly on drift velocity, charge density and bath temperature.

Local Noise Measurements with Diamond NV Magnetometry

NV Measurement Setup

In some embodiments, for local noise measurements, the graphene devices are fabricated on single crystal E-grade diamonds with a (100) major face (Element Six). Prior to device fabrication, the substrates can be plasma etched, implanted, and annealed, but without the oxygen annealing step. This process can result in a very smooth surface (<200 pm RMS roughness). $^{15}$N ions can be implanted at 20 keV, which corresponds to an approximate depth of 40-60 nm (calculated by Stopping and Range of Ions in Matter simulation).

Figure 20:
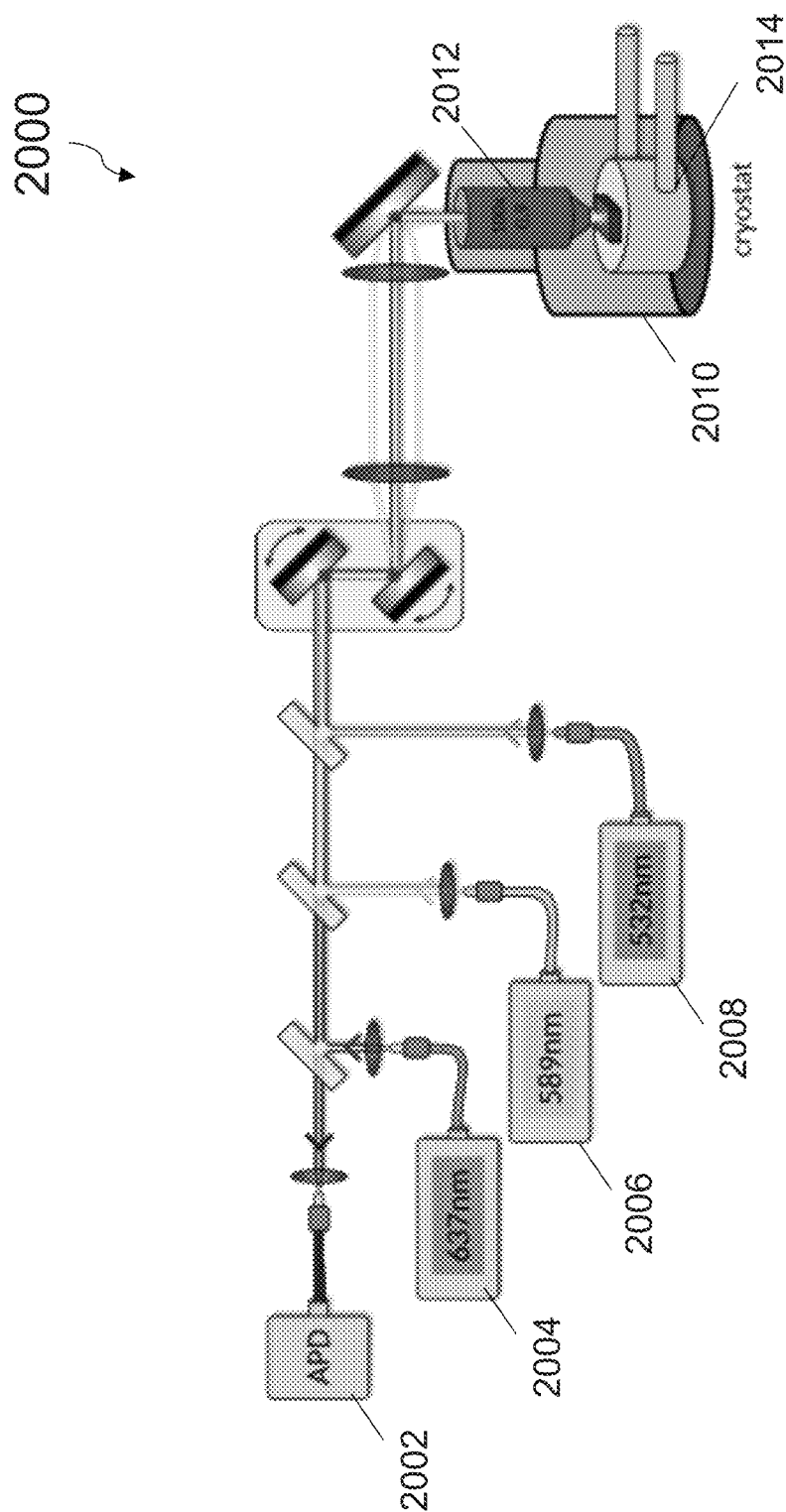
FIG. 20 is an illustration of NV measurement setup, according to some embodiments of the present disclosure.

As discussed above, optical signals from N center can be very sensitive to perturbations from a local magnetic field associated with the phonon generation process. FIG. 20 shows an illustrative view of the NV measurement setup 2000, according to some embodiments of the present disclosure. The three laser beams 2004, 2006 and 2008 can be used for spin-to-charge readout and combined before the galvanometric mirrors located at one focal point of a 4f system. A photo detector 2002 (e.g., an avalanche photodiode or APD) can be used to detect the optical signal. Lasers can be switched by acousto-optic modulators, except for the 637 nm high-powered ionization laser, which can be a directly driven diode laser. The objective and sample can be located inside a cryostat 2010 (e.g., Janis ST-500 cryostat), which can be used to keep the sample at ~70K by a combination of flowing liquid helium and a resistive heater in a PID loop.

Cryogenic temperatures can allow for resonant excitation of the NV center at low powers to reduce background. A scanning mirror-based confocal microscope 2012 can be used to address, track and read out the NV centers during measurements. In some embodiments, the full initialization and readout sequence can be implemented with lasers of wavelengths 532 nm, 594 nm, and 637 nm that are separately switched with acousto-optic modulators. In some embodiments, one of the 637 nm lasers (e.g., commercially available NewFocus Velocity™ TLB6704) is an external cavity diode laser that is tuned to each NV zero phonon line. The other red laser can be a high-powered diode laser that is used to apply short>70 mW pulses to ionize NV centers. Photons emitted in the phonon side-band can be collected with a fiber-coupled SPCM (e.g., commercially available from Excelitas Technologies™). Timings can be orchestrated by a pulse generator (e.g., commercially available SpinCore PulseBlaster™ ESRPro) with 2.5 ns timing resolution. The cryostat can be equipped with coax lines, both for driving microwave pulses to manipulate the NV center, and to perform high-frequency measurements of the graphene device as described in the previous sections. Microwave signals for NV center manipulations can be generated on a signal generator (e.g., commercially available SRS SG384 signal generator) and amplified with an amplifier (e.g., commercially available Mini-Circuits® ZHL-16 W-43+ amplifier). For microwave noise references, phase noise can be introduced by applying 200 MHz bandwidth white noise to the IQ modulation input on the SRS. In some embodiments, non-zero magnetic field measurements are achieved by positioning large rare earth magnets 2014 outside the cryostat, approximately aligned with one of the NV axes.

Spin-to-Charge Readout

Figure 21:
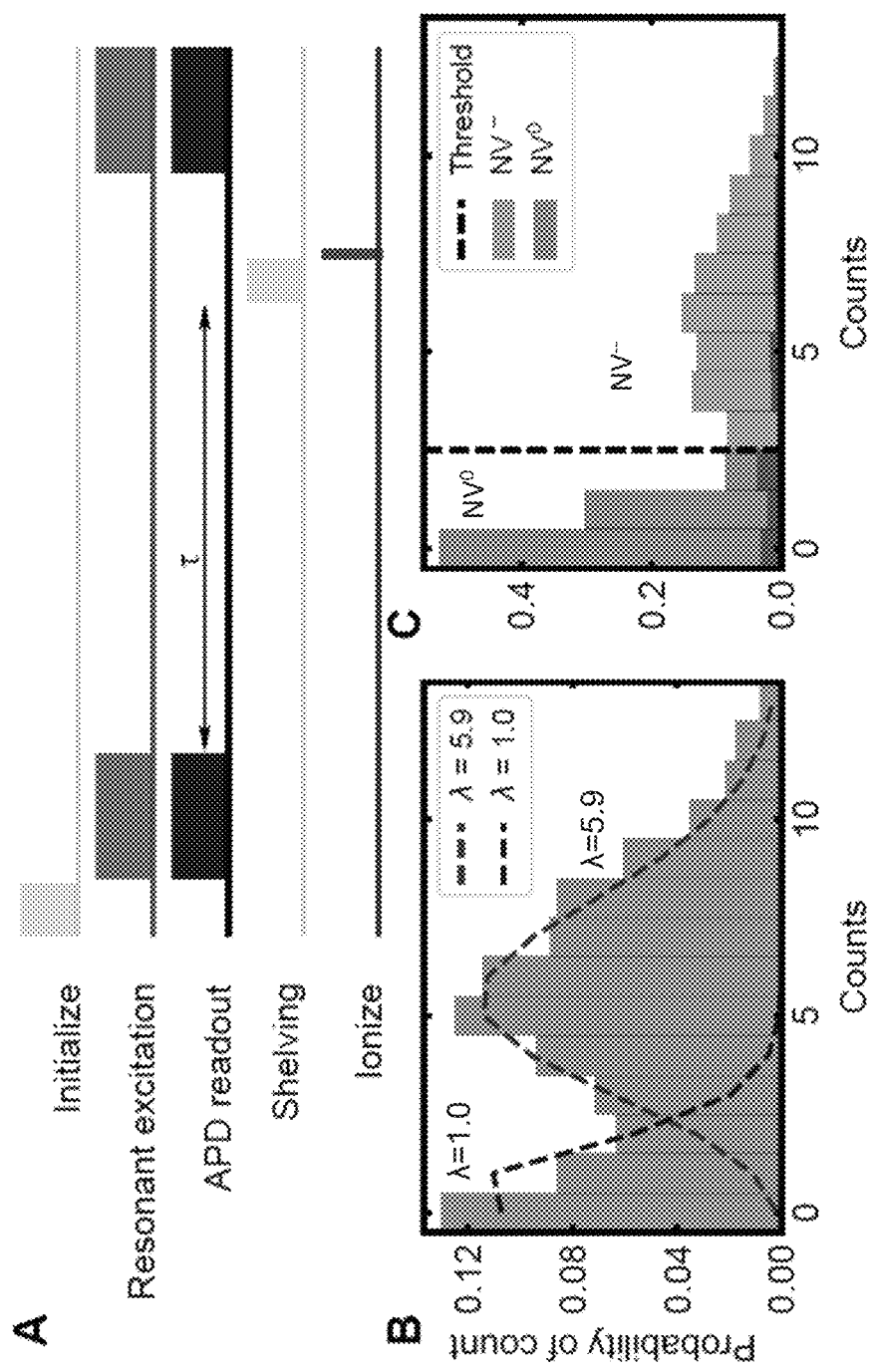
FIG. 21 illustrates example aspects of spin-to-charge readout, according to some embodiments of the present disclosure.

Ensembles of NV center spins in the diamond can be read with optical means via spin-to-charge conversion, according to some embodiments. FIG. 21 shows an illustrative view of spin-to-charge readout, according to some embodiments of the present disclosure. Panel A shows pulse sequence for measuring relaxation rate of N centers, according to some embodiments. A 532 nm pulse can preferentially prepare the NV center in the NV charge state and $m_s=0$ spin state. The NV center spin can be allowed to relax for a timer before a strong yellow pulse shelves the $m_s=\pm 1$ population in the singlet state. An intense pulse of 637 nm light can ionize any population in the triplet state, while the singlet is protected. The resulting charge state can be read out by resonant excitation of the NV⁻ zero phonon line, and from this, the spin state before the yellow pulse can be inferred. Panel B shows that photon distribution from NV can be fit as a 70%-30% mix of two Poisson distributions with different parameters, $\lambda$, corresponding to counts from NV⁻ and NV⁰, according to some embodiments. Panel C shows post-selected photon distributions, according to some embodiments. The photon distributions for the two charge states can be distinguishable, permitting single-shot charge state readout.

In some embodiments, due to the often slow NV decay rates, NV center spins are read out using a modified spin-to-charge mapping to reduce the readout noise to 6.3 times the projection noise limit. The NV centers can be first initialized into the $m_s=0$ spin state by shining a 1 mW pulse of 532 nm light for 25 μs. This can also preferentially prepare the NV center in the NV⁻ charge state with ~70% fidelity, as shown in FIG. 21 Panel B. In some embodiments, in order to improve this further, post-selection is performed based on an initial charge state readout, using a low-power pulse from an external cavity diode laser tuned to the NV zero phonon line near 637 nm. Extremely low power (~nW) can be used to avoid ionizing the NV center while determining its initial charge state. The NV can then be allowed to relax for a variable amount of time (τ) in the dark, before the spin state is mapped onto a charge state. Spin-to-charge conversion can be achieved by applying a strong (5 mW) pulse of 589 nm light for 40 ns to preferentially shelve any $m_s=\pm 1$ population in the metastable singlet state, and then using a 20 ns pulse of ~70 mW 637 nm light to efficiently ionize any population in the triplet state. The protected population in the singlet then can relax back to the triplet manifold by an intersystem crossing so that only the $m_s=\pm 1$ population remained in the NV⁻ charge state. The final charge state can then be read out using the resonant laser, and the number of collected photons can be used to assign a charge state. With an optimal threshold for photon counts, the single-shot charge state readout fidelity from some example implementations has been observed to be 80%-99% depending on the NV center, and the technique can be limited by spin-to-charge mapping efficiency.

NV Relaxation Rate Near a Conductor

Without being bound by theory, in some embodiments, near a conductor, the spin relaxation rate of the NV center is enhanced due to magnetic field fluctuations resonant with the $m_s=0$ to $m_s=\pm 1$ transitions (2.87 GHz), caused by current fluctuations in the conductor. More formally, in the presence of a 2d conductor in the xy-plane and an NV center located at $-d_{NV}\hat{z}$, Fermi's Golden Rule can be used to calculate the decay rate:

$$\Gamma_{0\to 1}^0 = \frac{1}{\hbar^2}\sum_{a,b}\langle 0|\mu_a|1\rangle\langle 1|\mu_b|0\rangle S_B^{a,b}(\omega, -d_{NV}\hat{z}), \qquad (12)$$

where $\mu_{a,b}$ are the magnetic dipole transition elements and $S_B^{a,b}(\omega, r) = \int_{-\infty}^{\infty} dt e^{-i\omega t}\langle B_a(r, t)B_b(r, 0)\rangle$ is the magnetic noise spectrum tensor, which scales with the current fluctuations due to the Biot-Savart Law.

Local Noise Spectroscopy

Figure 22:
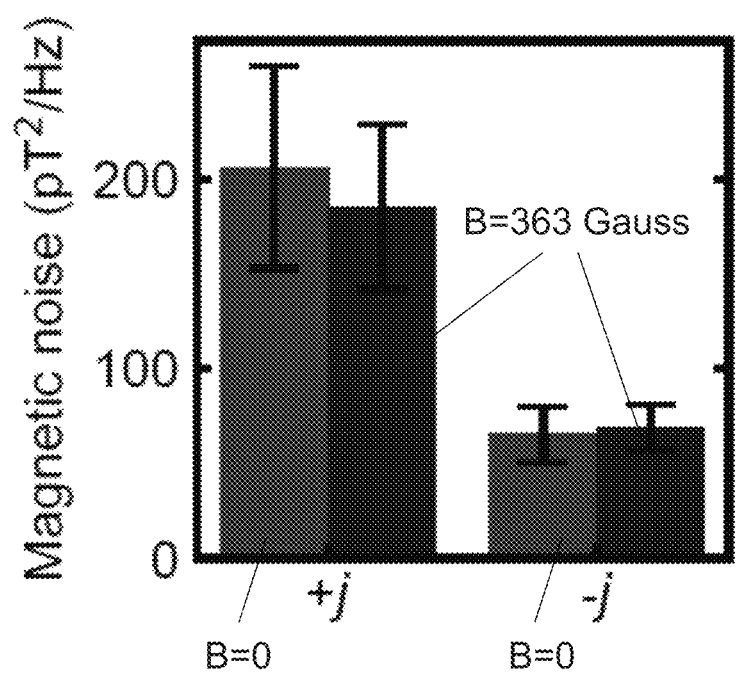
FIG. 22 presents noise measured at different applied magnetic fields, according to some embodiments of the present disclosure.

FIG. 22 shows noise measured at different applied magnetic fields, according to some embodiments of the present disclosure. Relaxation rates of an NV center are presented at B=0 and B=363 Gauss, for positive and negative bias, with $|j|=0.2$ mA/μm at $n=0.92\times 10^{12}$ cm⁻².

In some embodiments, spectroscopy of the local noise can be performed by varying the spin flip transition frequency of the NV center. The level-splitting of the two transitions to $\omega^{>}=2.87\pm 1.01$ GHz can be tuned by applying an external magnetic field of 363 Gauss, and it can be found that no significant change in the relaxation rate of NV centers. In some embodiments, when measuring the decay into both the $m_s=+1$ and $m_s=-1$ states, cancellation effects can occur since the two transition frequencies are changed by equal and opposite amounts. In the worst case, $\Gamma(\omega)$ can decrease linearly, and the relaxation rates of the two transitions can change from $\Gamma_0$ to $\Gamma_0\pm\delta\Gamma$. It can then be shown that the measured relaxation rate $\Gamma_{meas}$ out of the initial $m_s=0$ state can increase, with a relative change given by $\delta\Gamma_{meas}/\Gamma_{meas}=\delta\Gamma^2/(\delta\Gamma_0^2)$. Considering the <10% change observed here, it can be concluded that the local noise varies by < $\sqrt{6\cdot 10}$%~80% over 1 GHz. The difference from the much sharper frequency dependence observed in globally measured spectra can be expected: the global measurements can be sensitive to phonon-mediated electronic correlations across the entire device, and can thus show a roll-off corresponding to the (inverse) sample traversal time ($v_s/L$~GHz). The NV, on the other hand, can be configured to be sensitive to correlations that occur within its ~50×50 nm² sampling area. Thus, the NV centers can be observed with a significantly higher frequency cut-off ($v_s/d_{NV}$>100 GHz) and very weak spectral dependence around 2.87 GHz.

Lattice Temperature

Figure 23:
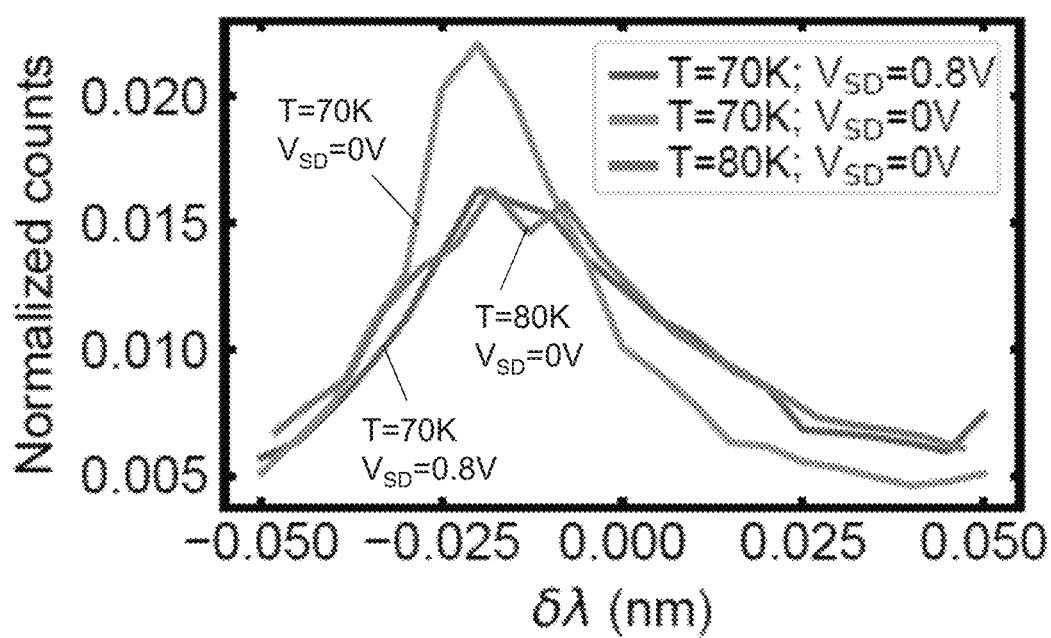
FIG. 23 presents lattice heating during NV measurements, according to some embodiments of the present disclosure.

In some embodiments, the observed local noise is dominated by magnetic noise, rather than noise coming from the diamond lattice. FIG. 23 show lattice heating during NV measurements with scans of the optical line of an NV center located below device C2, according to some embodiments of the present disclosure. The NV center zero phonon line can be broadened by approximately the same amount when a high bias is applied as when the bath temperature is increased by 10 K at zero bias, suggesting that the increase in temperature near the NV during device operation is approximately 10 K. δλ is approximate and is inferred from cavity piezo voltage and laser manufacturer's specifications (e.g., New Focus Velocity 6300). Center wavelength corresponds to ~637.4 nm.

In some embodiments, when large source-drain voltages are applied to the device, a significant amount of power is dissipated (e.g., ~5 mW for some example applications). Since the relaxation rate of an NV center is temperature-dependent, it is relevant to consider the temperature change of the diamond lattice from this power dissipation. This can be done by measuring the linewidth of the NV zero-phonon line, which is very sensitive to temperature and scales with $T^5$. The fluorescence of an NV center can be measured as a function of excitation wavelength and find a slight change in linewidth for the highest applied biases (FIG. 23). By heating the cryostat from 70 to 80 K, a similar level of broadening can be achieved at zero bias. This shows that the bias-induced increase in the diamond temperature near the NV can be very small (~10 K), consistent with the high thermal conductivity of diamond. Since the spin relaxation rate is proportional to T in the regime considered here, and the intrinsic spin relaxation rate is measured to be very low (<0.2 Hz), this slight temperature increase can have a negligible effect compared to the high levels of noise from the graphene. Moreover, the clear gate dependence observed at constant power further shows that the increased spin relaxation rate can be due to noise from the graphene. Nevertheless, to keep the diamond temperature as constant as possible, the cryostat base temperature can be lowered by 10 K while measuring at the highest biases.

Local Doping Dependence

Figure 24:
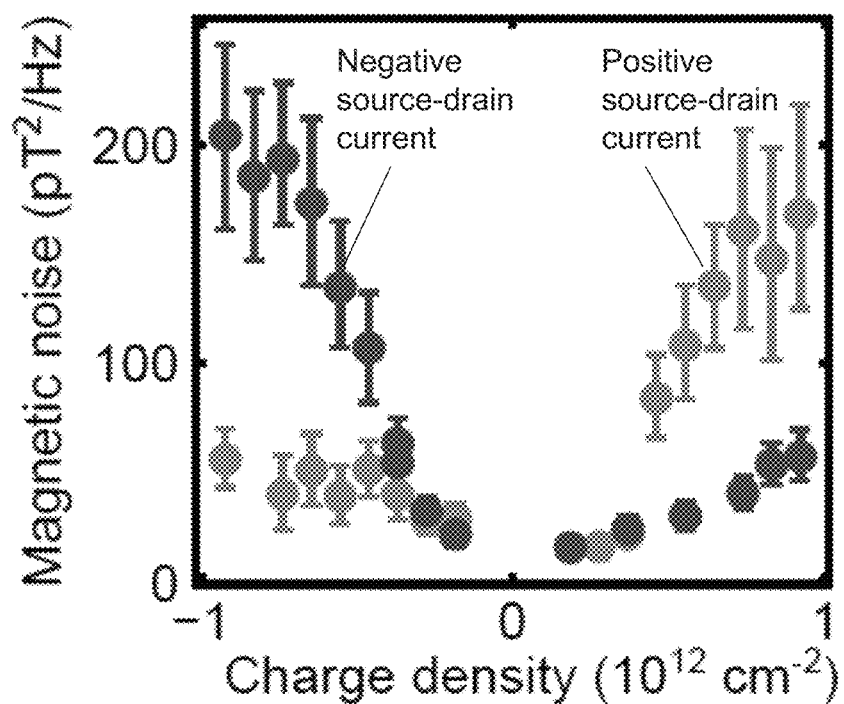
FIG. 24 presents doping dependence of local magnetic noise, according to some embodiments of the present disclosure.

In some embodiments, to ensure the cleanness of the graphene device, electrostatic doping can be used to tune the charge density. FIG. 24 shows doping dependence of local magnetic noise with locally probed magnetic noise as a function of graphene charge density, according to some embodiments of the present disclosure. Both positive and negative source-drain currents are shown. The bias power is kept constant at 1.4±0.1 mW.

By focusing on a single NV center and measuring its relaxation rate while sweeping the top-gate voltage, the charge density dependence of the Cerenkov noise can be mapped out on the nanoscale. As with the current dependence, the anomalous noise can only be observed when the charge carrier sign is such that the NV center is downstream with respect to the carrier flow. These measurements can be done at constant power, so the drift velocity can increase with doping level, leading to an abrupt increase in noise once the Cerenkov condition is satisfied.

NV Center Orientation

Figure 25:
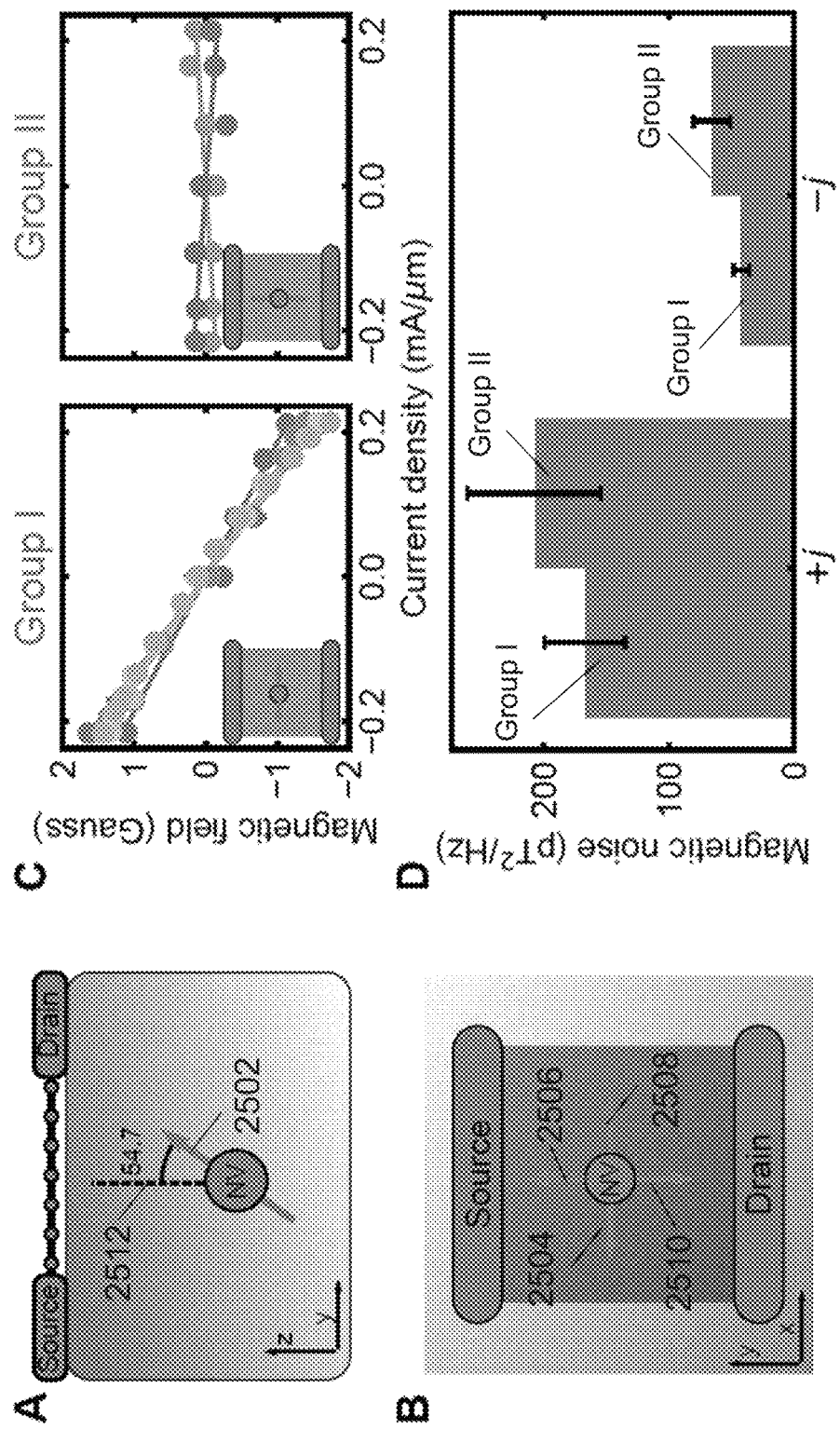
FIG. 25 illustrates NV center orientation, according to some embodiments of the present disclosure.

In some embodiments, the sensitivity of a NV center to a magnetic field depends on its orientation relative to the magnetic field. FIG. 25 shows schematic views of NV center orientation, according to some embodiments of the present disclosure. Panel A shows NV center orientation with respect to diamond surface, according to some embodiments. Panel B shows projection of the four possible NV axes onto the device plane, according to some embodiments. In some embodiments, the device is closely aligned along two of the projections, giving rise to two distinctive groupings of NV centers: those with xy-projections that are perpendicular to current flow (group I) and those with xy-projections parallel to current flow (group II). Panel C shows DC field measurement results, according to some embodiments. Group I NVs measure a significant current-induced magnetic field, while group II NVs do not. Panel D shows relaxation rates of NVs in group I and II, according to some embodiments. The noise sensed by nearby NVs from different orientation groups can be similar, despite measuring very different DC magnetic fields with |j|=0.2 mA/μm and n=0.92×10$^{12}$ cm$^{-2}$.

In some embodiments, diamond samples are all cut such that the devices are fabricated on the (100) surface. The diamond crystal structure entails that each NV axis 2502 (the vector connecting nitrogen and vacancy sites) points in one out of four directions. The four possible NV axes 2504, 2506, 2508 and 2510 all make the same angle~54.7° with the surface normal vector 2512, but have four different projections onto the xy-plane. The devices can be aligned to be parallel with the xy-projection of two axes (2506 and 2510, group II), and perpendicular to the other two (2504 and 2508, group I). The NV centers can be used to sense DC currents by measuring the Zeeman splitting of the $m_s=\pm 1$ states, $2\gamma_e B_\parallel (I)$, where $B_\parallel$ is the projected field onto the NV-axis. Thus, aligning devices in this way can enable one to determine the NV groupings by measuring the DC current response. When flowing a source-drain current through the device, the magnetic field projection onto group I is large, but nearly zero for group II, as shown in FIG. 25 Panel C. The consistency of the field measured by group I NVs can suggest that the current is very uniform.

Spin relaxation, on the other hand, can be determined by the perpendicular component of the noise on the NV axis, which, without being bound by theory, can in principle allow for observing effects of anisotropic noise. However, in some embodiments, a significant difference in relaxation rates is not observed under driven graphene for nearby NVs in different orientation groups (FIG. 25 Panel D), suggesting that the induced noise is relatively isotropic.

DC Measurements of Local Current Distribution

Figure 26:
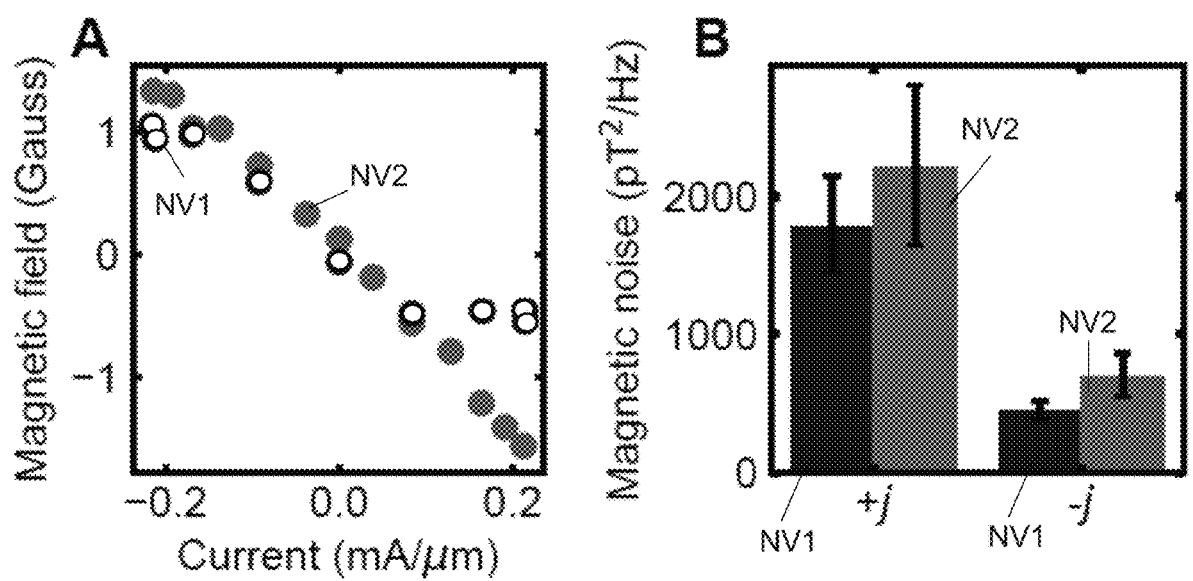
FIG. 26 presents DC and AC current measurements, according to some embodiments of the present disclosure.

In some embodiments, a plurality of NV centers can be used to probe local noise. FIG. 26 shows DC and AC current measurements, according to some embodiments of the present disclosure. Panel A shows DC current response of two NVs located a similar distance from the source electrode, according to some embodiments. While one of the NVs shows the expected linear local field dependence on global current, the other shows non-linear behavior at high drives. Panel B shows local noise measurements for same NVs as in Panel A according to some embodiments. Noise measurements are taken at |j|=0.2 mA/μm, n=0.92×10$^{12}$ cm$^{-2}$.

In some embodiments, the devices are not implanted at a high density, which precludes vector reconstruction of the DC current distribution at all points, but the NV density is high enough to measure general trends. Overall, it can be observed that the DC magnetic field shift of the NV centers is uniform and consistent with the applied global current density (FIG. 25 Panel C). However, in some embodiments, some small departures at discrete locations that are likely due to local disorder. Current imaging in graphene samples has shown that edges, folds, and defects can cause the current density to vary across the sample. At these locations in the samples, the field sensed by the NV can be not linear in the applied current: at some threshold current density, the slope of the current-field curve can change (FIG. 26 Panel A). This non-linear behavior can be not expected to be related to the anomalous noise effects, since it is only observed in a few discrete locations. This is further supported in FIG. 26 Panel B, where it is shown that two NVs at similar distances from the source electrode both show the asymmetric noise behavior, despite their different DC current profiles. As expected, the outlier NV that measures a lower local current than the global average also measures slightly less noise. Along with variations in NV depth, such discrete discrepancies in local current may have caused some of the departures from the overall trends observed in FIG. 3 Panels D-E.

Theory

Without being bound by theory, the present application describes a theoretical framework used to describe the electron-phonon dynamics observed in the experiment. In some embodiments, a modified Drude model that evolves the coupled electronic current and phonon population in both space and time can be introduced. Two components of this model are the rates of (net) phonon emission and decay. In some embodiments, the model can be used to demonstrate the effect of the phonon traversal time can have on electronic response, and derive a new expression for the AC conductivity spectrum during Cerenkov amplification. In some embodiments, the connection between global noise and phonon fluctuations can be explained, and one can predict the dependence of global noise on charge density. In some embodiments, the local current fluctuations depend predominantly on the local phonon population.

Coupled Electron-Phonon Dynamics

Without being bound by theory, the dynamics of the system could in principle be modeled by a complete Boltzmann treatment of both electronic and phononic degrees of freedom. However, at the high electronic temperatures reached in the example experiments, rapid e-e collisions ensure that the electronic system reaches local equilibrium at much shorter timescales (<1 ps) than those probed here. Therefore, a full Boltzmann framework is not necessary, and one can instead represent the electronic system by the three variables governing its equilibrium distribution. These include the electronic temperature $T_e$, charge density n, and drift velocity $v_D$. The electrostatic gate keeps the charge density spatially uniform, and one can assume that the effects of variations in electronic temperature are negligible as well. Indeed, the temperature profile has been found to be relatively uniform in the high-bias regime, and temperature-induced changes in chemical potential are suppressed in the degenerate regime ($\mu \gg k_B T_e$). Moreover, the net phonon emission rate can be only weakly dependent on electronic temperature. In order to connect the theory to measured quantities, one can refer to the current density $j=nev_D$ instead of the drift velocity. In some embodiments, the same equilibrium assumption about the phononic system is not made, and each phonon mode is treated separately.

Figure 27:
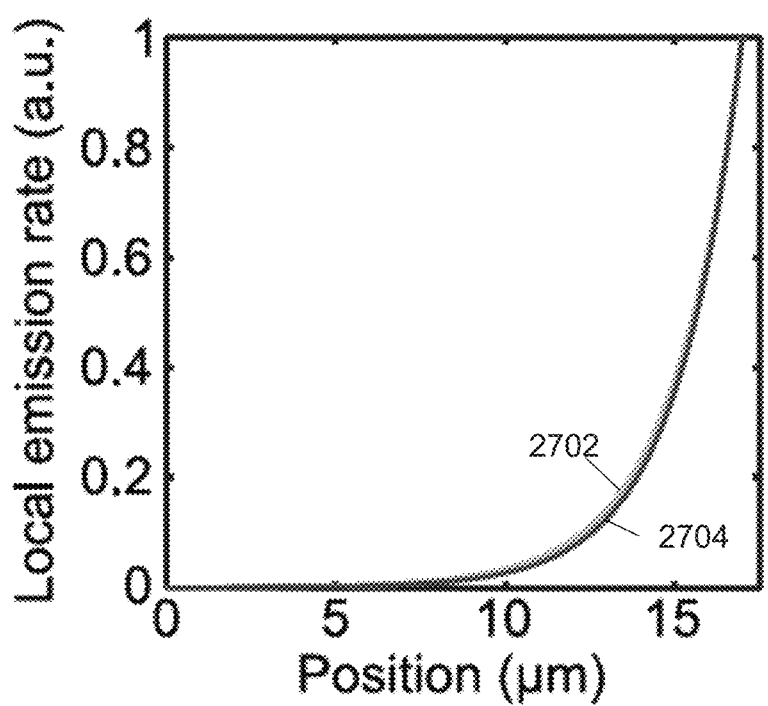
FIG. 27 present spatial dependence, according to some embodiments of the present disclosure.

In some embodiments, an integral of local emission rate over the most amplified phonon modes can lead to a substantially similar result as an integral over all phonon modes. FIG. 27 shows spatial dependence of the local emission rate, according to some embodiments of the present disclosure. FIG. 27 shows normalized local emission rate of most amplified mode ($\Delta\gamma_q n_q(x) \propto n_q(x)$) (2704), and integrated over all phonon modes (2702), for the parameters used in FIG. 2D in the main $t_{ext}$ (j=0.18 mA/μm, n=0.92×10$^{12}$ cm$^{-2}$, $\Gamma_{max}^{amp}$=10.9 GHz). Without being bound by theory, due to the dominance of the most amplified modes, the two curves 2702 and 2704 are very similar. The purple curve has a slightly sharper upturn due to the higher amplification rate.

Without being bound by theory, the model can take the form of a modified Drude formula, which explicitly accounts for the dependence of the electronic scattering rate $\Gamma_e$ on the phonon population $\{n_q\}$:

$$\partial_t j(r,t) = DE(r,t) - \Gamma_e(\{n_q\}) \cdot j(r,t) \quad (13)$$

$$\partial_t n_q = \frac{(n_q - n_{q,0})}{\tau_q} + \gamma_q^{em}(j)(n_q+1) - \gamma_q^{abs}(j) \cdot n_q - v_s\hat{q}\cdot\nabla n_q \quad (14)$$

$$= \overline{(\gamma_q^{em}(j) - \gamma_q^{abs}(j) - \tau_q^{-1})} \cdot n_q + n_{q,0}\tau_q^{-1} + \gamma_q^{em}(j) - v_s\hat{q}\cdot\nabla n_q \quad (15)$$

where $D=2e^2 v_F k_F/h$ is the Drude weight of graphene, E(r, t) is the electric field, $\tau_q^{-1}$ is the (q-dependent) phonon decay rate, $v_s$ is the speed of sound, and $n_{q,0}$ is the phonon population at j=0. $\gamma_q^{em}$ and $\gamma_q^{abs}$ are the stimulated emission and absorption rates per phonon. In the derivations shown here, the only assumptions made about the electronic scattering rate $\Gamma_e$ are 1) that it depends on the phonon population $n_q$, and 2) that one can use an average electronic lifetime to write equations for the current. Both of these assumptions can simply be thought of as a phonon-dependent resistance.

In some embodiments, a DC voltage is applied across the device (in addition to a weak AC excitation in conductivity measurements), and $\hat{x}$ is defined to point along the applied field. Since the electric field is uniform in the transverse ($\hat{y}$) direction, the steady state current $\langle j \rangle = \langle j \rangle \hat{x}$ and phonon occupation $\langle n_q \rangle$ are too. (Here, and in what follows, $\langle \ \rangle$ is used to refer to temporal averages). Moreover, the high energy cost of local charge buildup entails that $\langle j \rangle$ is divergence-free and thus independent of x as well. In some embodiments, $\langle j \rangle$ is a global property of the sample.

The phonon occupation, on the other hand, can change along the sample due to the convective term in eqn. 14. Without being bound by theory, the steady state spatial profile $\langle n_q(x) \rangle$ can be found as:

$$\langle n_q(x)\rangle = n_{q,0}e^{(\Gamma_q^{amp})x/v_q} + \frac{1}{\langle\Gamma_q^{amp}\rangle\tau_q}\left(n_{q,0} + \tau_q\langle\gamma_q^{amp}\rangle\right)\left(e^{(\Gamma_q^{amp})x/v_q} - 1\right) \quad (16)$$

where $v_q = v_s\hat{q}\cdot\hat{x}$. The phonon population can increase exponentially through the sample for wavevectors q that have $\Gamma_q^{amp}>0$. This is the expression plotted in FIG. 3 Panel D. Since the measured local current noise can be due to local fluctuations in phonon emission, which is a Poissonian process, it can scale with the (local) mean emission rate. The latter is proportional to $n_q$, so the current noise profile can be representative of the spatial distribution of phonons. Since the most amplified modes can dominate in long samples like the one shown in FIG. 3 Panel D (L 17 μm), $n_q(x)$ is plotted for the most amplified mode. Without being bound by theory, including background effects (thermal noise and intrinsic NV decay), it is found that the current noise can be of the form $\langle \delta I^2 \rangle (x) = A + Be\Gamma_{max}^{amp}x/v_s$. In FIG. 27, it is shown that integrating over all modes gives a similar result, due to the dominance of the most amplified modes.

In some embodiments, eqn. 16 breaks down for $\hat{q}$ with large transverse components, due to the finite width of the example samples.

Phonon Emission Rate

Without being bound by theory, in some embodiments, in order to determine the net emission rate $\Delta\gamma_q = \gamma_q^{em} - \gamma_q^{abs}$ of a phonon mode with wavevector q, one can sum over all electronic transitions accompanying the emission/absorption event:

$$\Delta\gamma_q = \gamma_q^{em} - \gamma_q^{abs} = \quad (17)$$

$$\frac{2\pi N}{\hbar}\sum_{k,k'}|C_{k,k',q}|^2(f_k(1-f_{k'}) - f_{k'}(1-f_k))\cdot\delta_{k-k',q}\cdot\delta(E_k - E_{k'} - \hbar v_s|q|) \quad (18)$$

where the first term represents an electron moving from k to k' while emitting a phonon, and the second represents an electron moving from k' to k while absorbing a phonon. Here, $v_s$ is the speed of sound, N=4 is the number of valley/spin flavors, $E_k = \hbar v_F |k|$ is the electron energy, $f_k = (e^{\beta(\hbar(v_F|k|-k\cdot v_D)-\mu)}+1)^{-1}$ is the drifting Fermi-Dirac distribution with drift velocity $v_D$, and $|C_{k,k',q}|^2$ is the deformation potential coupling matrix element (30, 47, 48):

$$|C_{k,k',q}|^2 = \frac{D^2 \hbar q}{2\rho A v_s} \cos^2(\theta_{k,k'}/2) \tag{19}$$

Here, D is the deformation potential, $\rho$ is the (2D) mass density, A is the sample area, and $\theta_{k,k'}$ is the angle between k and k'.

Figure 28:
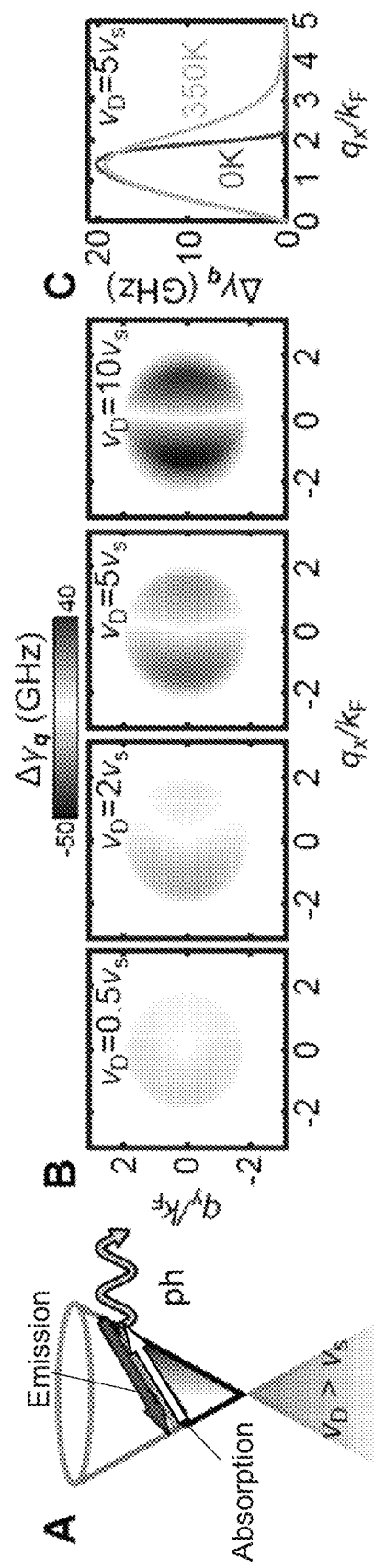
FIG. 28 illustrates onset of Cerenkov emission, according to some embodiments of the present disclosure.

FIG. 28 shows onset of Cerenkov emission, according to some embodiments of the present disclosure. Panel A shows Cerenkov criterion for graphene, according to some embodiments. When $v_D > v_s$, the electronic population becomes inverted with respect to phonon-induced transitions. As a result, the phonon emission rate becomes greater than the absorption rate. Panel 1 shows net emission rate $\Delta\gamma_q$ vs. phonon wavevector q at various electronic drift velocities $v_D = v_D\hat{x}$, $n=2\times10^{12}$ cm$^{-2}$ and zero electronic temperature, according to some embodiments. Once the drift velocity exceeds the speed of sound ($v_s=21$ km/s $0.021v_F$), regions of phononic phase space where $\Delta\gamma_q > 0$ (red) can be found, indicating that stimulated emission dominates over absorption. This effect can be strongest for the phonon modes moving along the current ($q\|\hat{x}$). The circle sector in which the amplification criterion is satisfied becomes wider as the drift velocity increases, and eventually saturates as a semicircle. Panel C shows line cut along $q_y=0$ for electronic temperatures $T_e=0$ K and 350 K at $v_D=5v_s\hat{x}$.

Without being bound by theory, at zero drift velocity, $f_k$ is simply a (decreasing) function of $E_k$, and one therefore finds that every term in eqn. 18 is negative. At higher $v_D$, however, the Fermi surface becomes tilted, causing higher-energy states on one side of the Dirac cone to have higher occupation than lower-energy states on the other side. Without being bound by theory, to achieve positive terms in eqn. 18, the Fermi surface can be made to be steeper than the phonon-assisted transitions (red arrow), which gives the Cerenkov criterion, $v_D > v_s$. It is noted that this phenomenon can be very different from the effects of high electronic temperatures. While the latter allows for the probabilistic occupation of higher-energy states, the mean occupation is still a decreasing function of energy, causing $\Delta\gamma$ to remain negative.

FIG. 28 Panel B shows the numerically calculated net emission rate at various electronic drift velocities, using deformation potential D=20 eV, according to some embodiments. When the drift velocity exceeds the speed of sound, stimulated emission dominates over absorption ($\Delta\gamma>0$) for a cone in phonon phase space moving along with the carrier flow. It is found that the highest net emission rate exceeds 5 GHz already at $v_D=2v_s$, and increases all the way up to 40 GHz at $v_D=10v_s$. The net emission rates greatly exceed the rate of phonon decay, as such $\Gamma_q^{amp}>0$ and phonon Cerenkov amplification is predicted to occur.

In some embodiments, at zero temperature, phonon amplification occurs for modes with wavevectors up to $2k_F$, corresponding to electronic transitions across the entire Fermi surface. As expected, this upper bound is found to be less sharp at higher temperatures (FIG. 28 Panel C). However, the region near the peak (which dominates after nonlinear amplification) is relatively insensitive to electronic temperature, since absorption and stimulated emission change by a similar amount.

In some embodiments, a different coupling rate may result from considerations of a gauge potential coupling. However, this can only modify the scale of the coupling rate, and to result in even higher emission rates. In particular, it may not change the qualitative behavior of net stimulated emission when $v_D > v_s$.

Phonon Decy Rate

In some embodiments, the acoustic phonon decay rate $\tau_q^{-1}$ in graphene becomes very slow at low temperatures, especially for the small phonon energies relevant in the example experiment (~THz). Indeed, this is one of the main reasons why graphene has such an exceptional thermal conductivity. Here, there can be three types of decay pathways for the relevant phonon modes, in order to demonstrate that Cerenkov amplification can occur ($\Delta\gamma_q > \tau_q^{-1}$) at the drift velocities reached in the experiment. Since the decay rate is found to be very small compared to $\Delta\gamma$, the fits can depend only very weakly on the exact numerical value of the decay rate.

Without being bound by theory, in some embodiments, point-defect scattering can be given by $\gamma^{PD} = S_0 \omega^3/(v_s^2) \cdot E_i p_i (1-M_i/\overline{M})^2$, where $S_0$ is the atomic cross-sectional area and M is the average atomic mass, $p_i$ and $M_i$ are the percentage and atomic mass of defect type i. Considering the contribution from the 1% natural abundance of C, one finds $\gamma^{PD} \sim 1.5$ MHz at $\omega = 5$ THz, which is clearly much smaller than $\Delta\gamma$. Without being bound by theory, due to the low impurity content in the exfoliated graphene samples, significantly larger contributions from other defect types are not expected.

In some embodiments, anharmonic decay is also considered, where the mode of interest interacts with two other modes, with wavevectors q' and q", and energies $\omega'$ and $\omega"$. These processes can be divided into two types, based on the hierarchy of the three phonon energies: I) $\omega" > \omega, \omega'$, and II) $\omega > \omega', \omega"$. Without being bound by theory, in some embodiments, the rate of the two processes are given by:

$$\gamma_q^I = \frac{2\pi}{\hbar} \sum_{b} \sum_{s',s''} \sum_{q',q''} |C_{\omega,\omega',\omega''}|^2 [n(\omega') - n(\omega'')] \delta(\omega'' - \omega - \omega') \delta_{q'',q'+q'+b} \tag{20}$$

$$\gamma_q^{II} = \tag{21}$$
$$\frac{2\pi}{\hbar} \sum_{b} \sum_{s',s''} \sum_{q',q''} |C_{\omega,\omega',\omega''}|^2 [n(\omega') - n(\omega'') + 1] \delta(\omega'' - \omega - \omega') \delta_{q'',q'+q'+b}$$

where b is a lattice vector. Non-zero b correspond to Umklapp scattering, where total phonon momentum is not conserved. At the low temperatures and small q considered here, normal processes (b=0) can dominate strongly. While these do not reduce thermal conductivity (since they conserve momentum), they can still affect Cerenkov amplification, since they can scatter phonon modes out of the amplified region of phononic phase space. s' and s" represent the branches that the mode interacts with; the small-q LA modes considered here can predominantly interact with TA and LA modes in embodiments of the disclosed hBN-encapsulated devices. $n(\omega)$ is the phonon distribution function. Since only a small part of the total phonon phase space experiences Cerenkov amplification, it is assumed that the amplified modes mainly interact with non-amplified modes that remain close to thermal equilibrium. Without being bound by theory, one can set $n(\omega)$ to be the Bose-Einstein distribution $n(\omega) = (e^{\beta\hbar\omega} - 1)^{-1}$ at bath temperature ($\beta = (k_B T_{bath})^{-1}$). Finally, $|C_{\omega,\omega',\omega''}|^2$ is the coupling matrix element:

$$|C_{\omega,\omega'\omega''}|^2 = \frac{2\gamma_G^2 \omega \omega' \omega'' \hbar}{3\rho v_s^2 A} \quad (22)$$

where $\gamma_G$ is the Gruneisen parameter. $\gamma_G$ is in principle mode-dependent and can be replaced with an average value ($\gamma_G$=2). $\rho$ is the (2D) mass density, and A is the device area, which is canceled out when turning the sum over wavevectors into an integral.

Figure 29:
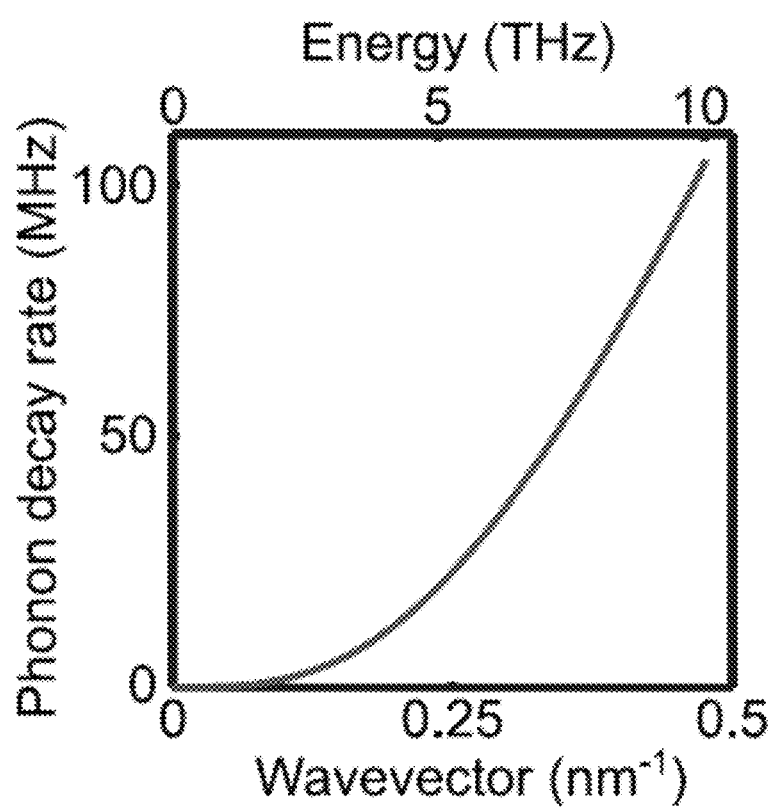
FIG. 29 presents phonon decay rate, according to some embodiments of the present disclosure.

FIG. 29 shows phonon decay rate (calculated from eqns. 20 and 21) versus phonon wavevector q and energy $v_s q$, according to some embodiments of the present disclosure. It can be found that these decay rates are faster than $\gamma^{PD}$, but still much slower than typical values of $\Delta\gamma$.

The third decay can be caused by scattering off the rough device edges. Without being bound by theory, it can be assumed that the phonons decay when they have traversed the sample and reach the sample edge. This is not only due to the absorption at the edge, but also because the reflected (backwards-moving) modes are no longer in the amplified region of phonon phase space, and are thus quickly absorbed by the electronic system. Phonon amplification can be strongest for modes moving at small angles with the source-drain axis, and the emission of these can impact the current most strongly due to the large momentum transfer in the direction of current.

AC Conductivity

Without being bound by theory, in some embodiments, in order to find the AC conductivity, one can consider the current response to a voltage $V(t)=V_0+\delta V e^{i\omega t}$. Considering only the field-induced (not stochastic) fluctuations, one can apply arguments about $\langle j \rangle$ and $\langle n_q \rangle$ (section 7.1) to the fluctuations $\delta j$ and $\delta n_q$ as well. Without being bound by theory, in other words, with the simplifications $\delta j(r, t)=\delta j(t)\hat{x}$ and $\delta n_q(r, t)=\delta n_q (x, t)$, and embodiments of the disclosure can be treated as a 1D problem.

Without being bound by theory, since $n_q$ (and thus the scattering rate $\Gamma_e(\{n_q\})$) can vary with x, the electric field $E=E_0(x)+\delta E(x)e^{i\omega t} \hat{x}$ can too. Analogously to a series of resistors, the applied potential difference can be divided unequally across the resistors if they do not have the same resistance. One can measure the global AC conductivity:

$$\sigma = \frac{\delta j}{\delta V/L} = \frac{\delta j}{\frac{1}{L}\int_0^L \delta E(x)dx} = \frac{1}{\frac{1}{L}\int_0^L \sigma^{-1}(x)dx} \quad (23)$$

where L is the length of the device. In some embodiments, this is the spatially averaged conductivity (in reciprocal), and is completely equivalent to adding resistors in series. In order to make any sensible comparison with experiment, one can therefore integrate equation 13 over x:

$$\partial_t j = \frac{DV(t)}{L} - \frac{\overline{\Gamma_e}}{\frac{1}{L}\int_0^L \Gamma_e(\{n_q(r,t)\})dx \cdot j(t)} \quad (24)$$

Here, and in what follows, barred quantities are spatially averaged, while brackets $\langle\ \rangle$ are used for temporal averages.

Without being bound by theory, the oscillating parts of $n_q$ and j then evolve according to:

$$i\omega \delta j(\omega) = \frac{D\delta V(\omega)}{L} - \overline{\langle \Gamma_e \rangle} \delta j(\omega) - \sum_q \overline{\left(\frac{\partial \Gamma_e}{\partial n_q} \cdot \delta n_q(x,\omega)\right)} \langle j \rangle \quad (25)$$

$$i\omega \delta n_q(x,\omega) = \overline{(\langle \gamma_q^{em} \rangle - \langle \gamma_q^{abs} \rangle - \langle \tau_q^{-1} \rangle)} \cdot \delta n_q(x,\omega) + \quad (26)$$

$$\frac{\partial \Gamma_q^{amp}}{\partial j} \cdot \delta j(\omega)\langle n_q(x)\rangle + \overbrace{\frac{\partial \gamma_q^{em}}{\partial j} \delta j(\omega)}^{\text{Spont.emission}} - v_s \hat{q} \cdot \hat{x} \partial_x \delta n_q(x,w)$$

Since both absorption and stimulated emission of phonons are linear processes, one can assume that $\Gamma e$ is linear in $n_q$, and can therefore write:

$$\overline{\left(\frac{\partial \Gamma_e}{\partial n_q} \cdot \delta n_q(x,\omega)\right)} = \frac{\partial \Gamma_e}{\partial n_q} \cdot \overline{\delta n_q(x,\omega)} \quad (27)$$

Moreover, although one can use $$\Gamma\frac{amp}{q},$$

the treatment can also be applied to the non-amplifying case $$\left(\Gamma\frac{amp}{q} < 0\right).$$

Focusing on phonon modes that move in parallel with the current (q∥$\hat{x}$) (larger-angle modes is discussed later), without being bound by theory, one can immediately solve for $\delta n_q$ (x, $\omega$) in terms of $\delta j(\omega)$:

$$\delta n_q(x,\omega) = \quad (28)$$

$$v_s^{-1}\delta j(\omega) \int_0^x \left(\frac{\partial \Gamma_q^{amp}}{\partial j} \cdot \langle n_q(x') \rangle + \frac{\partial \gamma_q^{em}}{\partial j}\right) e^{(\langle \Gamma_q^{amp} \rangle - i\omega)(x-x')/v_s} dx' =$$

$$\left[\frac{C}{i\omega}e^{\langle \Gamma_q^{amp} \rangle x/v_s} + \frac{i\omega B - \langle \Gamma_q^{amp} \rangle C}{i\omega(\langle \Gamma_q^{amp} \rangle - i\omega)}e^{(\langle \Gamma_q^{amp} \rangle - i\omega)x/v_s} + \frac{C-B}{\langle \Gamma_q^{amp} \rangle - i\omega}\right]\delta j(\omega) \quad (29)$$

where $$B = \frac{\partial \Gamma_q^{amp}}{\partial j} \cdot n_{q,0} + \frac{\partial \gamma_q^{em}}{\partial j} \quad (30)$$

$$C = \frac{\partial \Gamma_q^{amp}}{\partial j} \cdot \left(n_{q,0} + \frac{n_{q,0}}{\langle \Gamma_q^{amp} \rangle \tau_q} + \frac{\langle \gamma_q^{em} \rangle}{\langle \Gamma_q^{amp} \rangle}\right) \quad (31)$$

Before plugging this back into the equation for $\delta j$, one can calculate the spatial average:

$$\overline{\delta n_q(\omega)} = \frac{1}{L}\int_0^L \delta n_q(x,\omega)dx = \quad (32)$$

$$\overbrace{\left[\frac{C}{i\omega T \langle \Gamma_q^{amp} \rangle}\left(e^{\langle \Gamma_q^{amp} \rangle T} - 1\right) + \frac{i\omega B - \langle \Gamma_q^{amp} \rangle C}{i\omega T(\langle \Gamma_q^{amp} \rangle - i\omega)^2}\left(e^{(\langle \Gamma_q^{amp} \rangle - i\omega)T} - 1\right) + \frac{C-B}{\langle \Gamma_q^{amp} \rangle - i\omega}\right]}^{\bar{x}(q,\omega)}\delta \quad (33)$$

where $T=L/v_s$ is the sample transit time. The phonon-current response function $\hat{x}(q, \omega)$ can be defined through $\delta n_q(\omega) = \hat{x}(q, \omega)\delta j(\omega)$. Inserting this expression back into the expression for $\delta j(\omega)$, one can find:

$$\sigma(\omega) = \frac{L\delta j(\omega)}{\delta V(\omega)} = \frac{D}{i\omega + \langle \Gamma_e \rangle + \Sigma_q \frac{\partial \Gamma_e}{\partial n_q} \hat{x}(q, \omega)\langle j \rangle} \quad (34)$$

One can retrieve the original Drude result if the phonons do not respond to the current ($\hat{x}(q, \omega)=0$), or the scattering rate does not depend on the phonon occupation $$\left( \frac{\partial \Gamma_e}{\partial n_q} = 0 \right).$$

So far, no mathematical approximations have been made.

Without being bound by theory, in some embodiments expression 34 can be conceptualized by considering the following: A fluctuation $\delta j(\omega)$ will not only decay due to $\langle \Gamma e \rangle$, but also cause a change in phonon population $\delta n_q$, which changes the scattering rate $\delta \Gamma_e(\omega)$:

$$\delta\Gamma_e(\omega) = \frac{\partial \overline{\langle \Gamma_e \rangle}}{\partial j} \delta j(\omega) = \sum_q \frac{\partial \langle \Gamma_e \rangle}{\partial n_q} \delta j(\omega) = \sum_q \frac{\partial \langle \Gamma_e \rangle}{n_q} \hat{x}(q, \omega)\delta j(\omega) \quad (35)$$

In terms of the low-frequency regime ($\omega \ll \Gamma_e \sim$THz), certain phonon modes can be amplified strongly ($e^{\Gamma^{amp}T} \gg 1$). For these modes, the response function $\hat{x}(q, \omega)$ can simplify to:

$$\hat{x}(q, \omega) = \frac{C}{i\omega T \langle \Gamma_q^{amp} \rangle} e^{\langle \Gamma_q^{amp} \rangle T}\left(1 - e^{-\omega T}\right) \quad (36)$$

Since the strongly amplified modes will have the dominant impact on the AC conductivity, one can apply the above simplifications to all the terms in the sum over q in eqn. 34. Without being bound by theory, it is then found:

$$\sigma^{Cerenkov}(\omega) = \frac{D}{\langle \Gamma_e \rangle + \sum_q \frac{\partial \Gamma_e}{\partial n_q}\langle j \rangle \frac{C}{i\omega T \langle \Gamma_q^{amp} \rangle} e^{\langle \Gamma_q^{amp} \rangle T}(1 - e^{-i\omega T})} \quad (37)$$

$$= \frac{\sigma^{Drude}(0)}{1 + \frac{K}{i\omega T}(1 - e^{-i\omega T})}$$

where $\sigma^{Drude}(0) = D/\langle \Gamma e \rangle$ is the regular DC Drude conductivity. Without being bound by theory, Since the contributions from all the amplified phonon modes show the same $\omega$-dependence, the sum over q can be factored out a single dimensionless parameter K can be defined as:

$$K = \sum_q \frac{\partial \langle \Gamma_e \rangle}{\partial n_q} \frac{\langle j \rangle Ce^{\langle \Gamma_q^{amp} \rangle T}}{\langle \Gamma_q^{amp} \rangle \langle \Gamma_e \rangle} \quad (38)$$

FIG. 29 shows angular spread of phonon emission, according to some embodiments of the present disclosure. Measured AC differential conductivity spectrum is presented at 0.8V bias and $n = 2 \times 10^{12}$ cm$^{-12}$ (identical data shifted to show multiple fits). Fits are shown by averaging the phonon emission angle up to varying $\theta_{max}$. The best agreement can be found at $\theta_{max} = 60°$.

Without being bound by theory, as mentioned above, expression 37 can be derived for phonon modes moving in the x-direction. Other phonon modes moving at an angle $\theta$ with the x-axis have different traversal times $T\theta = L/(v_s \cos\theta)$, and can thus dampen the oscillations in $\sigma(\omega)$. Indeed, it can be found that expression 37 although capturing the qualitative features of the data—overestimates the amplitude of the oscillations (top curve in FIG. 30). To account for the spread in emission angles in 2D, one can include more phonon modes in the second term of the denominator in eqn. 37.

Figure 30:
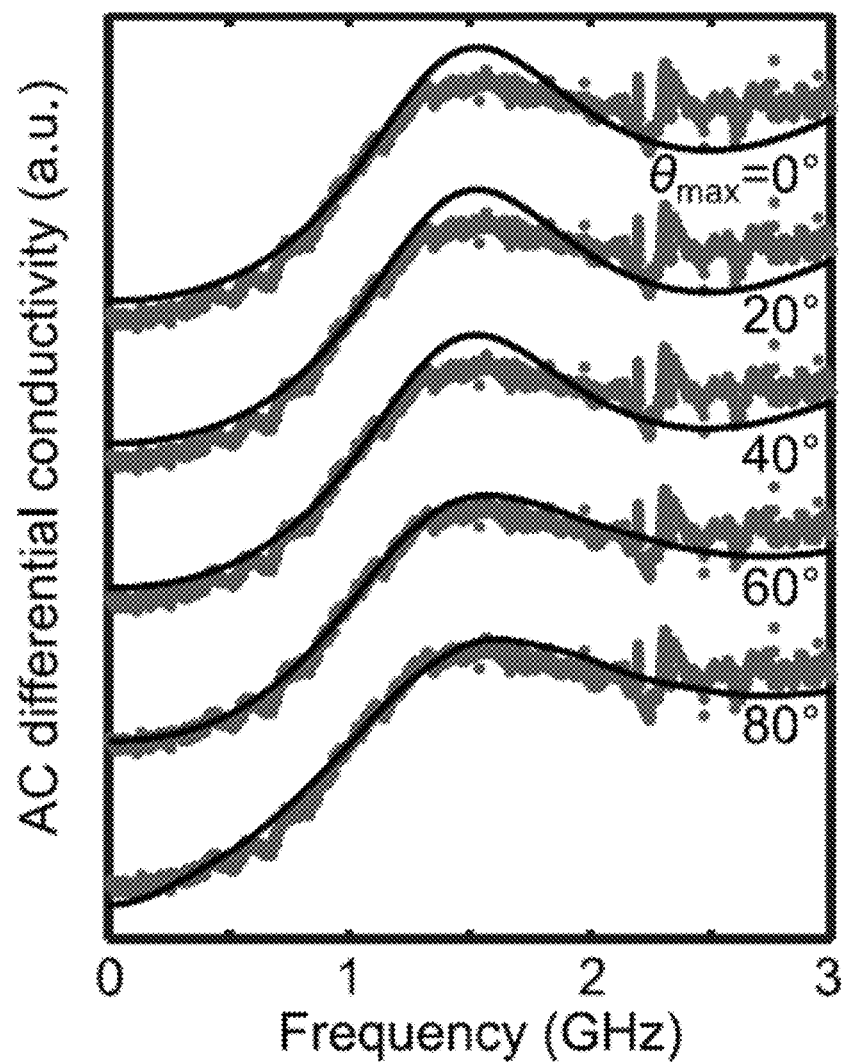
FIG. 30 presents AC differential conductivity spectrum, according to some embodiments of the present disclosure.

In some embodiments, without being bound by theory, the contribution of phonon modes at different angles can depend not only on the $\theta$-dependent K, but also on reflections from the side edges of the finite-sized devices. The latter depends on the specularity of the graphene edges. As a first approximation, one can average over $\theta$ with equal weights up to a maximum angle $\theta_{max}$, and already find improving agreement with the data (FIG. 30). It can be found that $\theta_{max} \sim 60°$ accounts for the spread in T well, and therefore this value can be used for fitting the data. Since this angle is slightly larger than $\tan^{-1}(L/W)$, it suggests that edge-reflection plays a small, but not insignificant role. The reported extracted traversal time can be the shortest $T_\theta$ in the average (min $(T_\theta) = T_{\theta=0}$, so that $T_{extracted} = L/v_s$ still holds.

Without being bound by theory, to derive a more exact angular distribution, one could include the side edge reflection in the model, as well as other $\theta$-dependent effects, including: 1) For a given $|q|$, the amplification rate $\Gamma_e$ is maximized for $\theta = 0$ and decreases monotonically with increasing angle. 2) Modes with larger $\theta$ take longer to traverse the sample, and are thus amplified for a longer time. 3) Phonons with large $\theta$ can impact the current less than those moving in parallel with the current, since the large-angle modes remove less longitudinal momentum from the electronic population.

Connection Between Global Noise and Phonon Fluctuations

Without being bound by theory, in order to relate the global noise to phonon fluctuations, one can return to eqn. 25, but now without an oscillating field, since only a DC field is applied in noise measurements:

$$i\omega\delta j(\omega) = -\langle \Gamma_e \rangle \delta j(\omega) - \sum_q \overline{\left[\frac{\partial \Gamma_e}{\partial n_q} \cdot \delta n_q(x, \omega)\right]}\langle j \rangle \quad (39)$$

Note that one can still operate with the spatially averaged phonon population $\overline{\delta n_q}$, since the global measurements are only sensitive to the uniform component of current fluctuations (other components do not contribute a net current).

Without being bound by theory, solving for the current fluctuations at low frequencies $\omega \ll \Gamma e \sim$THz and assuming that the phonon modes are independent, one can find:

$$\langle \delta^2 j(\omega) \rangle = \langle \overline{\Gamma_e} \rangle^2 \sum_q \left(\frac{\partial \Gamma_e}{\partial n_q}\right)^2 \overline{\langle \delta n_q(\omega)^2 \rangle}\langle j \rangle^2, \quad (40)$$

Once can observe that the current fluctuations mimic the behavior $\overline{\delta n_q}$ frequencies, which can be intuitively thought of as the current response to slow variations in the total device resistance. Without being bound by theory, the phonon fluctuations are here given by:

$$\langle \overline{\delta n_q(\omega)^2} \rangle = \int_0^L \int_0^L \langle \delta n(x_1, \omega)\delta n(x_2, \omega) \rangle dx_1 dx_2 \quad (41)$$

Without being bound by theory, since an emitted phonon can keep stimulating emission of subsequent phonons as it moves through the sample, $\langle \overline{\delta n(t)} \cdot \overline{\delta n(t+\tau)} \rangle$ can be greater than 0 for $\tau$ up to the traversal time T, causing roll-offs in both $\langle \overline{\delta n_q(\omega)^2} \rangle$ $\langle \overline{\delta n_q(\omega)^2} \rangle$ and $\langle \delta^2 j(\omega) \rangle$ at low frequencies ($\lesssim 1/T$). The total phonon fluctuations (integrated over space and modes) can scale with the total emission rate, due to the Poissonian nature of phonon emission.

Dependence of Global Noise on Charge Density

Figure 31:
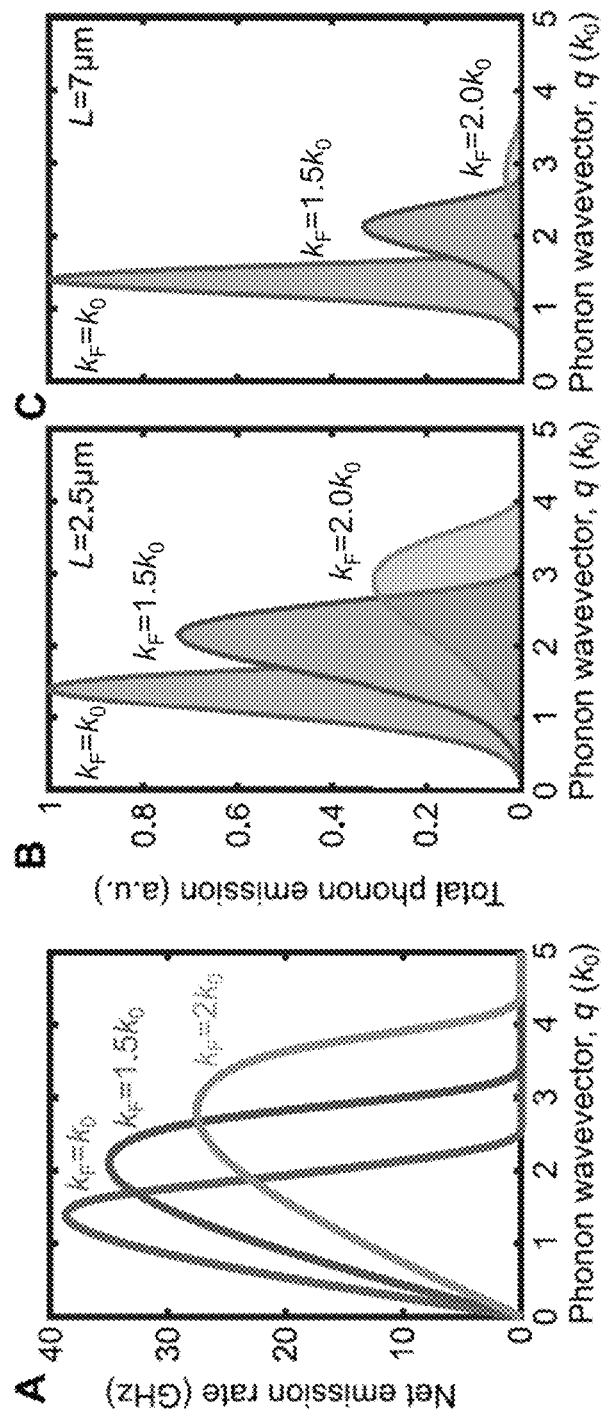
FIG. 31 presents non-monotonic charge density dependence of phonon amplification, according to some embodiments of the present disclosure.

FIG. 31 shows non-monotonic charge density dependence of phonon amplification, according to some embodiments of the present disclosure. Panel A shows the net emission rate $\Delta\gamma_q$ at constant current density j=0.6 mA/µm, for various $k_F$ ($k_0$=165 meV/($v_F\hbar$)). The corresponding charge densities are n=2.1, 4.5 and 8.0×10$^{12}$ cm$^{-2}$, including the effect of the non-zero $v_D$ on n. $\Delta\gamma_q$ becomes zero near $2k_F$. Panel B shows the integrand of expression 42, which can be strongly related to the measured noise. The blue curve has the biggest area and thus corresponds to the highest expected noise, for device length L=2.5 µm. Panel C shows the integrand of expression 42 for L=7 µm. The longer device allows for more filtering, causing the noise to be maximized at a lower $k_F$.

Without being bound by theory, in order to understand the charge density dependence of phonon amplification, one can consider the q-distribution of phonon emission (FIG. 31 Panel A). At low q, the net emission rate $\Delta\gamma_q = \gamma_q^{em} - \gamma_q^{abs}$ increases with q, both because the electron-phonon coupling constant is linear in q, and because larger q permits more accompanying electronic transitions for phonon emission. However, the emission rate starts decreasing again when q approaches the maximum momentum transfer $2k_F(1+v_D/v_F)$ ~$2k_F$, corresponding to electronic transitions across the entire (shifted) Fermi surface.

Without being bound by theory, in some embodiments, when the charge density n is increased through electrostatic gating (FIG. 31 Panel A), this upper bound can be shifted according to $k_F = k_F\sqrt{\pi n} \cdot (1-(v_D/v_F)^2)^{3/4}$. This can cause a blue shift of the amplified phonon population, and increases the number of amplified modes. At the same time, however, the amplitude of $\Delta\gamma_q$ can decrease, because the drift velocity $v_D$=j/(ne) decreases with n at constant current density. In other words, increasing n can cause the emission spectrum to become wider, but smaller in magnitude. It can be seen that the competition between these two effects cause a non-monotonic dependence on charge density.

Without being bound by theory, the measured noise can be due to the stochastic emission of phonons and can scale with the total phonon emission rate due to the Poissonian nature. One can integrate the phonon generation rate over both space and phonon modes:

$$\int\int_0^L \Delta\gamma_q n_q(x) dx \cdot q dq \quad (42)$$

where the spatial profile $n_q$ (x) is given in eqn. 16. One can integrate along the x-axis in q-space and account for the cone shaped emission pattern by weighting by q. This is the quantity plotted in FIG. 5 Panel C in the main text.

The integrand of the q-integral in eqn. 42 is plotted in FIG. 31 Panel B for L=2.5 µm, and one can observe that the area is maximized at an intermediate doping level. At this cross-over point, one achieves an optimal balance between the width and height of the gain profile for this particular device length. For a longer (7 µm) sample in FIG. 31 Panel C, one can observe a more sharply peaked phonon spectrum. Intuitively, the longer device allows for more nonlinear amplification, which acts as an active filter centered at the most amplified phonon mode. This filtering effect skews the competition between the width and height of the gain profile. Since the most amplified modes strongly dominate in the longer device, it is more favorable to have a few modes with high amplification rate than many weakly amplified modes. Thus, the integrated phonon emission is maximized at a lower doping level in longer devices. Another consequence of this filtering effect is that the cross-over behavior is predicted to be sharper in longer devices. As shown in FIG. 5 Panel C, it is found that the model agrees very well with the data, with regards to both the shifts and broadening of the cross-over peaks.

Without being bound by theory, since the cut-off at $q=2k_F$ is less sharp at higher temperatures, the non-monotonic behavior can have some dependence on the electronic temperature. The latter can be elevated above the lattice temperature due to Joule heating. Using no other fit parameters, the best agreement with the data can be found at an electronic temperature of 320 K. In order to evaluate whether this value is reasonable, one can compare with an upper bound corresponding to the case where cooling only occurs through electronic conduction to the contacts. Using the thermal conductivity given by Wiedemann-Franz law and relevant bias voltages of 0.2-0.3 V, one can find temperatures of 340-500 K. Since in reality phonons also contribute to cooling, it is expected that the electronic temperature can be somewhat lower than this. Thus, the value used here can be reasonable. The electronic temperature can show some variation with charge density, which may explain the discrepancy between the model and the data at high charge densities.

Local Noise

The NV center can measure magnetic noise due to local current fluctuations, which can be determined by the local phonon fluctuations. However, if one considers the 1D case, where the current can be constant along the whole device, one quickly finds this not to be the case. This comes from the fact that one can no longer integrate eqn. 13 over the device length to remove local fluctuations in the electric field. A change in the resistance in one part of the device will thus affect the electric field in other parts of the device, due to the division of the bias potential along the device. Here, it is shown that this non-local effect is negligible in two dimensions, and that the local current fluctuations are indeed determined by the local phonon fluctuations.

Without being bound by theory, one can do this by dividing the sample into small squares of size corresponding to the NV sensing area, and then think of the sample as a grid of N×N resistors with resistance R(x, y, t) $\propto \Gamma_e$ ({$n_q$ (x, y, t)}). $\Gamma_e$ is the electronic scattering rate. The NV sampling dimension is approximately given by its depth $d_{NV}$ 50 nm, so the number of resistors $N^2 = A_{sample}/A_{NV}$~$10^5$ is very large. One can switch to discretized subscripts instead of x and y to represent position and consider an NV center located just below position (m, n) in the grid. The current moving right above the NV center is then given by:

$$j_{mn} = \frac{j_{tot} R_m}{R_{mn}} \propto \frac{R_m}{R_{mn} R_{tot}} \quad (43)$$

$$R_{tot} = \sum_i R_i = \sum_i \left( \sum_j R_{ij}^{-1} \right)^{-1} \quad (44)$$

where the first subscript is the position along the current (x), and the second is in the transverse direction (Y). When only one subscript i is used, it refers to the total cross-sectional resistance at x=i($R_i=1/\Sigma_j R_{ij}^{-1}$). It can be seen that all resistors affect the total current $j_{tot}$, but only resistors on the same transverse plane as the NV affect the portion of $j_{tot}$ that goes through the NV sensing area. The local current fluctuations probed by the NV are then given by the sum:

$$\delta j_{mn} = \langle j_{mn} \rangle \left( -\frac{\delta R_{tot}}{\langle R_{tot} \rangle} + \frac{\delta R_m}{\langle R_m \rangle} - \frac{\delta R_{mn}}{\langle R_{mn} \rangle} \right) \quad (45)$$

Without being bound by theory, there are thus three candidates for which resistors one can consider, corresponding to the three terms above: 1) All of them, 2) The ones on the same transverse plane as the NV, or 3) Only the resistor at the NV location, $R_{mn}$. In order to determine which effect is larger, it is assumed that all resistors have the same rms fluctuations $\delta R_{rms}$ and mean resistance R, so: $\langle R_{tot} \rangle = \langle R_{mm} \rangle = N \langle R_m \rangle = R$. Thus, one can have:

1) $\frac{\delta R_{tot}}{\langle R_{tot} \rangle} =$ (46)

$\frac{1}{R} \sum_{ij} \frac{\partial R_i}{\partial R_{ij}} \delta R = \frac{1}{R} \sum_{ij} \frac{R_{ij}^2}{R_{ij}^2} \delta R = \sum_{ij} \frac{\delta R_{ij}}{N^2 R} \rightarrow \left( \frac{\delta R_{tot}}{\langle R_{tot} \rangle} \right)_{rms} = \frac{1}{N} \frac{\delta R_{rms}}{\langle R \rangle}$ 2) $\frac{\delta R_{mn}}{\langle R_{mn} \rangle} = \frac{N}{R} \sum_j \frac{\partial R_m}{\partial R_{mj}} \delta R_{mj} = \frac{1}{R_m} \sum_j \frac{R_m^2}{R_{mj}^2} \delta R_{mj} =$ $\sum_j \frac{\delta R_{mj}}{NR} \rightarrow \left( \frac{\delta R_m}{\langle R_m \rangle} \right)_{rms} = \frac{1}{\sqrt{N}} \frac{\delta R_{rms}}{\langle R \rangle}$ 3) $\frac{\delta R_{mn}}{\langle R_{mn} \rangle} = \frac{\delta R_{mn}}{R} \rightarrow \left( \frac{\delta R_{mn}}{\langle R_{mn} \rangle} \right)_{rms} = \frac{\delta R_{rms}}{\langle R \rangle}$ Without being bound by theory, assuming the phonon fluctuations at each site are independent, it can be found that the rms values of the three terms scale as 1/N, 1/√N and 1, respectively. It is the parallel connections that prevent $\delta R_{tot}$ and $\delta R_m$ from simply scaling with the square root of the number of resistors involved. One thus only has to consider the phonon fluctuations right above the NV center to determine the local current fluctuations. It is noted that this can be only the case for fluctuations; the mean local current depends on the total phonon population (all resistors in the grid).

Without being bound by theory, this can justify the argument that the spatial current noise profile (FIG. 3 Panel D) is representative of the local phonon fluctuations. Moreover, it is now clear that the NV center is only sensitive to correlations within its sampling area. This means that the locally measured fluctuations can have a frequency cut-off given by the inverse transit time of the NV sampling area ($v_s/d_{NV}$~THz), not the total device, consistent with the observations.

While the invention has been particularly shown and described with reference to specific preferred embodiments, it should be understood by those skilled in the art that various changes in form and detail may be made therein without departing from the spirit and scope of the invention as defined by the appended claims.

The invention claimed is:

1. A system comprising:
    a conductive sheet sandwiched between a first insulation layer and a second insulation layer;
    a first electrode conductively coupled to a first end of the conductive sheet;
    a second electrode conductively coupled to a second end of the conductive sheet; and
    a current source conductively coupled to the first electrode and the second electrode and configured to pass a current from the first electrode through the conductive sheet to the second electrode such that the current generates a drift velocity of electrons in the conductive sheet that is greater than the speed of sound to generate phonons.

2. The system of claim 1, wherein the conductive sheet comprises graphene.

3. The system of claim 1, wherein the conductive sheet comprises a transition metal dichalcogenide.

4. The system of claim 1, wherein the generated phonons have a frequency having an order of magnitude between 1 to 10 terahertz.

5. The system of claim 1, wherein one or more of the first insulation layer or the second insulation layer comprise hexagonal boron nitride (hBN).

6. The system of claim 1, wherein the mobility of the electrons in the conductive sheet is not less than 5 m$^2$/Vs.

7. The system of claim 1, further comprising a conductive top gate disposed on the second insulation layer opposite the conductive sheet, wherein a charge on the conductive top gate adjusts the frequency of the generated phonons.

8. The system of claim 1, wherein the distance between the first electrode and the second electrode is not less than 1.5 microns.

9. The system of claim 1, wherein the drift velocity of electrons in the conductive sheet is at least twice the speed of sound.

10. The system of claim 1, wherein the current amplifies the generated phonons.

11. A method comprising:
    disposing a conductive sheet between a first insulation layer and a second insulation layer;
    connecting a first electrode to a first end of the conductive sheet;
    connecting a second electrode to a second end of the conductive sheet;
    connecting the first and second electrodes to a current source; and
    applying, with the current source, a current from the first electrode through the conductive sheet to the second electrode such that the current generates a drift velocity of electrons in the conductive sheet that is greater than the speed of sound to generate phonons.

12. The method of claim 11, wherein the conductive sheet comprises graphene.

13. The method of claim 11, wherein the conductive sheet comprises a transition metal dichalcogenide.

14. The method of claim 11, wherein the generated phonons have a frequency having an order of magnitude between 1 to 10 terahertz.

15. The method of claim 11, wherein one or more of the first insulation layer or the second insulation layer comprise hexagonal boron nitride (hBN).

16. The method of claim 11, wherein the mobility of the electrons in the conductive sheet is not less than 5 m$^2$/Vs.

17. The method of claim 11, further comprising:
    forming a conductive top gate on the second insulation layer opposite the conductive sheet; and
    adjusting a frequency of the generated phonons by altering a charge on the conductive top gate.

18. The method of claim 11, wherein the distance between the first electrode and the second electrode is not less than 1.5 microns.

19. The method of claim 11, wherein the drift velocity of electrons in the conductive sheet is at least twice the speed of sound.

20. The method of claim 11, wherein the current amplifies the generated phonons.

21. A system comprising:
   a conductive sheet;
   a first electrode conductively coupled to a first end of the conductive sheet;
   a second electrode conductively coupled to a second end of the conductive sheet; and
   a current source conductively coupled to the first electrode and the second electrode and configured to pass a current from the first electrode through the conductive sheet to the second electrode such that current generates a drift velocity of electrons in the conductive sheet that is greater than the speed of sound to generate phonons.

22. The system of claim 21, wherein the conductive sheet is suspended above a substrate.

23. The system of claim 21, further comprising an insulator disposed on at least a portion of the conductive sheet.

24. The system of claim 21, wherein the insulation layer comprises hexagonal boron nitride (hBN).

25. The system of claim 21, wherein the conductive sheet comprises graphene.

26. The system of claim 21, wherein the conductive sheet comprises a transition metal dichalcogenide.

* * * * *